(12) United States Patent
Monickam et al.

(10) Patent No.: US 11,034,845 B2
(45) Date of Patent: Jun. 15, 2021

(54) NANOCOMPOSITE FORMULATIONS FOR OPTICAL APPLICATIONS

(71) Applicant: PIXELLIGENT TECHNOLOGIES LLC, Baltimore, MD (US)

(72) Inventors: Selina Monickam, Takoma Park, MD (US); Darryl Peters; Gregory Cooper, Fulton, MD (US); Zhiyun Chen, Olney, MD (US); Robert Swisher, Baltimore, MD (US)

(73) Assignee: PIXELLIGENT TECHNOLOGIES, LLC, Baltimore, MD (US)

( * ) Notice: Subject to any disclaimer, the term of this patent is extended or adjusted under 35 U.S.C. 154(b) by 42 days.

(21) Appl. No.: 16/075,316

(22) PCT Filed: Feb. 3, 2017

(86) PCT No.: PCT/US2017/016486
§ 371 (c)(1),
(2) Date: Aug. 3, 2018

(87) PCT Pub. No.: WO2017/136711
PCT Pub. Date: Aug. 10, 2017

(65) Prior Publication Data
US 2019/0055412 A1 Feb. 21, 2019

Related U.S. Application Data

(63) Continuation-in-part of application No. PCT/US2016/044243, filed on Jul. 27, 2016.
(Continued)

(51) Int. Cl.
*C09D 5/33* (2006.01)
*C09D 11/037* (2014.01)
(Continued)

(52) U.S. Cl.
CPC ............... *C09D 5/004* (2013.01); *C08K 3/22* (2013.01); *C08K 9/06* (2013.01); *C08L 33/06* (2013.01);
(Continued)

(58) Field of Classification Search
CPC .... C09D 5/004; C09D 11/101; C09D 135/02; C09D 11/107; C09D 11/033; C09D 7/62;
(Continued)

(56) References Cited

U.S. PATENT DOCUMENTS

2006/0210726 A1   9/2006  Jones et al.
2007/0292486 A1  12/2007  Sen et al.
(Continued)

FOREIGN PATENT DOCUMENTS

WO      2012/158317         11/2012
WO   WO-2015006276 A1 *   1/2015  ........... G02B 3/0056
WO      2017/023642          2/2017

OTHER PUBLICATIONS

International Search Report for PCT/US2017/016486 dated May 12, 2017, 5 pages.
(Continued)

*Primary Examiner* — Nathan L Van Sell
(74) *Attorney, Agent, or Firm* — Nixon & Vanderhye P.C.

(57) ABSTRACT

The present disclosure provides a high refractive index acrylic formulation embedded with sub-10 nm metal oxide nanocrystals. The formulation is ideal for high refractive index, high transparency coating for a variety of optical applications including OLED lighting.

32 Claims, 18 Drawing Sheets

Related U.S. Application Data

Figure 1A:
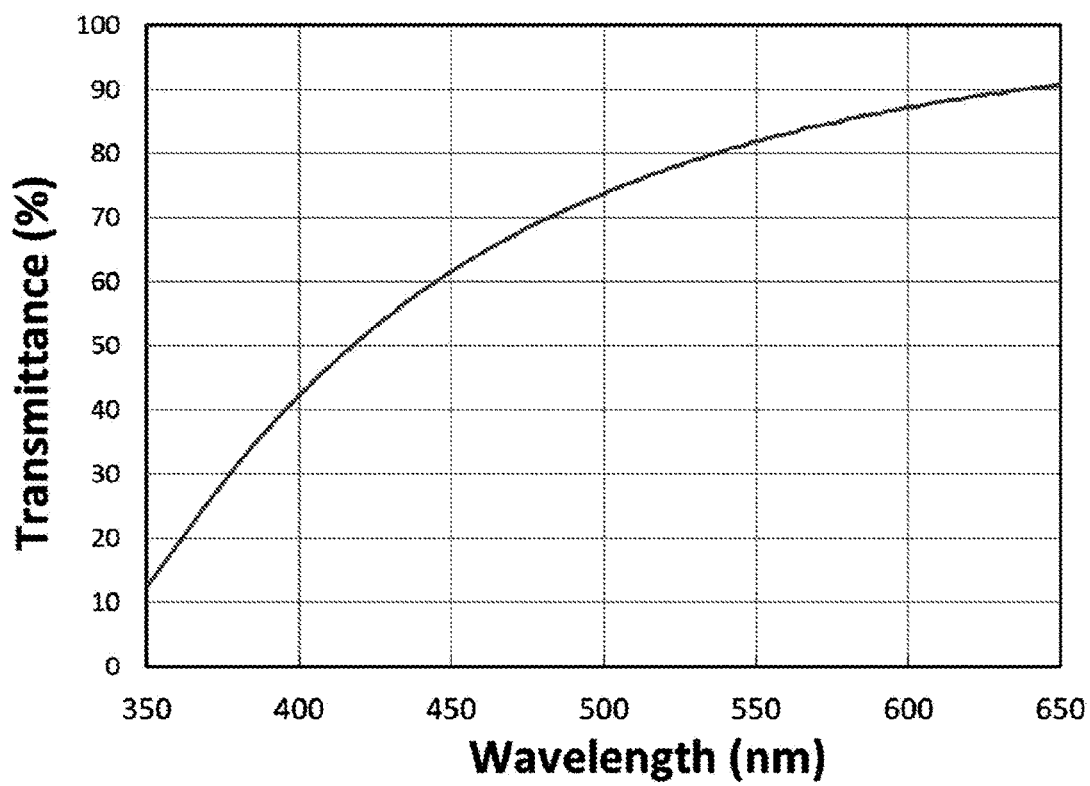

(60) Provisional application No. 62/290,941, filed on Feb. 4, 2016.

(51) Int. Cl.

| | |
|---|---|
| *C08L 33/06* | (2006.01) |
| *C08L 33/10* | (2006.01) |
| *C09D 11/101* | (2014.01) |
| *C08K 9/06* | (2006.01) |
| *C08K 3/22* | (2006.01) |
| *G02B 1/111* | (2015.01) |
| *C09D 7/20* | (2018.01) |
| *C09D 7/40* | (2018.01) |
| *C09D 7/62* | (2018.01) |
| *C09D 11/033* | (2014.01) |
| *C09D 11/107* | (2014.01) |
| *C09D 135/02* | (2006.01) |
| *H01L 51/52* | (2006.01) |
| *C08K 9/04* | (2006.01) |

(52) U.S. Cl.
CPC ............... *C08L 33/10* (2013.01); *C09D 7/20* (2018.01); *C09D 7/62* (2018.01); *C09D 7/67* (2018.01); *C09D 11/033* (2013.01); *C09D 11/037* (2013.01); *C09D 11/101* (2013.01); *C09D 11/107* (2013.01); *C09D 135/02* (2013.01); *G02B 1/111* (2013.01); *H01L 51/5268* (2013.01); *C08K 9/04* (2013.01); *C08K 2003/2244* (2013.01); *C08K 2201/011* (2013.01)

(58) Field of Classification Search
CPC .......... C09D 7/67; C09D 7/20; C09D 11/037; C09D 11/00; G02B 1/111; G02B 1/04; C08K 3/22; C08K 9/06; C08K 2201/011; C08K 2003/2244; C08K 9/04; C08L 33/10; C08L 33/06; C08L 2201/54; H01L 51/5268; C08J 5/18; C08J 3/02
See application file for complete search history.

(56) References Cited

U.S. PATENT DOCUMENTS

| | | | |
|---|---|---|---|
| 2011/0213046 A1* | 9/2011 | Choi .................. | B82Y 5/00 |
| | | | 521/124 |
| 2013/0221279 A1 | 8/2013 | Xu et al. | |
| 2014/0322549 A1* | 10/2014 | Xu .................... | C09D 5/00 |
| | | | 428/441 |
| 2015/0203709 A1 | 7/2015 | Cooper et al. | |
| 2015/0380688 A1* | 12/2015 | Chen .................. | G02B 3/0087 |
| | | | 257/40 |

OTHER PUBLICATIONS

Written Opinion of the ISA for PCT/US2017/016486 dated May 12, 2017, 13 pages.

\* cited by examiner

Ra (Sa): 0.409 nm
RMS (Sq): 0.518 nm

Ra (Sa): 0.399 nm
RMS (Sq): 0.501 nm

NANOCOMPOSITE FORMULATIONS FOR OPTICAL APPLICATIONS

This application is the U.S. national phase of International Application No. PCT/US2017/016486 filed Feb. 3, 2017 which designated the U.S. and is a continuation-in-part of International Application No. PCT/US16/44243 filed Jul. 27, 2016 (which designated the U.S.), and claims benefit of U.S. Provisional Patent Application No. 62/290,941, filed Feb. 4, 2016, the entire contents of each of which are incorporated herein by reference.

STATEMENT REGARDING FEDERALLY SPONSORED RESEARCH OR DEVELOPMENT

This application is partially supported by US Dept. of Energy Small Business Innovation Research (SBIR) Phase I and II Grant No. DE-SC0011295 and US Dept. of Energy Solid State Lighting Grant No. DE-EE0006673.

Polymeric coating materials described herein exhibit high optical transmittance in the visible spectrum. The materials of the present disclosure may be easily coated onto the surface of desired substrates via common coating processes, such as by spin coating, screen printing, dip, roll-to-roll, slot die, draw bar, or spray coating, for many electronic applications. The thickness of coatings described herein may range from tens of nanometers to millimeters, as may be required for specific applications. The materials of the present disclosure are unique in additionally providing a high refractive, high transparency film or coating or layer, as may be desirable in electronics applications where these properties are important to the performance.

For example, in a traditional Organic Light Emitting Diode (OLED), only ~25% of light generated is emitted to the environment, while the remaining light is generally lost in the device. A high percentage of this loss is due to the low refractive index (RI) of the encapsulation materials. A high refractive index high transparency organic coating, with a refractive index around 1.8 or higher, as may be produced with a material of the present disclosure, may dramatically enhance the efficacy of the OLED lighting and display devices including same. High refractive index coatings of the present disclosure will also be advantageously incorporated in other devices, such as light emitting diode (LED) lighting, light emitting diode (LED) displays, touch screens, sensors, and solar cells.

The present disclosure provides a dispersion containing capped nanocrystals in solvents such as alcohols, glycols, methyl acetates, ethyl acetates, esters, ketones, glycol ethers, glycol esters, such as propylene glycol monomethyl ether acetate (PGMEA), propylene glycol monomethyl ether (PGME), ethylene glycol monobutyl ether acetate, diethylene glycol monobutyl ether acetate, diethylene glycol butyl ether, diethylene glycol monoethyl ether acetate, dipropylene glycol methyl ether acetate, butoxy ethanol, butoxy propanol, ethoxy ethyl acetate, butoxy ethyl acetate, 2-(isopentyloxy)ethanol, 2-(hexyloxy)ethanol, diethylene glycol, diethylene glycol monomethyl ether, diethylene glycol monoethyl ether, triethylene glycol, triethylene glycol monomethyl ether, dipropylene glycol, dipropylene glycol monomethyl ether, and dipropylene glycol monoethyl ether, ethyl acetate, THF, acetone, any combination thereof.

The solvent of the presently disclosed coating formulation may be a low-volatility, high-boiling-point solvent. For example, a high-boiling-point solvent having a boiling point of about 150 to about 250 degrees Celsius may be used.

The solvent for the presently disclosed coating formulation may be the solvent of the capped nanocrystal dispersion.

The solvent for the presently disclosed coating formulation may be different than the solvent of the capped nanocrystal dispersion.

The solvent for the presently disclosed coating formulation may be the result of a solvent exchange of the capped nanocrystal dispersion.

The solvent that is used in the present formulation may be one or more selected from the group consisting of, for example, ethylene glycol monobutyl ether acetate, diethylene glycol monobutyl ether acetate, diethylene glycol butyl ether, diethylene glycol monoethyl ether acetate, dipropylene glycol methyl ether acetate, butoxy ethanol, butoxy propanol, ethoxy ethyl acetate, butoxy ethyl acetate, 2-(isopentyloxy)ethanol, 2-(hexyloxy)ethanol, diethylene glycol, diethylene glycol monomethyl ether, diethylene glycol monoethyl ether, triethylene glycol, triethylene glycol monomethyl ether, dipropylene glycol, dipropylene glycol monomethyl ether, and dipropylene glycol monoethyl ether.

The nanocrystals of the present disclosure may comprise nanocrystals of metal oxides, such as zirconium oxide, titanium oxide, hafnium oxide, or zinc oxide, which high bulk refractive indexes, typically larger than 2 in the visible spectrum, as well as exceptional transparency.

The nanocrystals of the present disclosure may be capped with specific functional group, also referred to as capping agents, or capping groups. These specific functional groups are grafted to the surface of the nanocrystals. As used herein capped nanocrystals and at least partially capped nanocrystals are functionally equivalent.

The capping agent of capped nanocrystals in the present disclosure may include 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, benzoic acid, or any combination thereof.

Capping of nanocrystals may require a solvent exchange and as-synthesized nanocrystals may be surface modified in a solvent other than the solvent of nanocrystals synthesis. Solvent exchange may be accomplished by, for example, decanting reaction mixture and rinsing the nanocrystals with the capping solvent, which may then be used as a washing or rinsing solvent that is itself decanted to produce a wet cake of nanocrystals.

The capped nanocrystals of the presently disclosed dispersion may constitute less than 10% by weight of the total dispersion, or 10%-20% by weight of the total dispersion, or 20%-30% by weight of the total dispersion, or polymer, or 30%-40% by weight of the total dispersion, or 40%-50% by weight of the total dispersion, or 50%-60% by weight of the total dispersion, or 60%-70% by weight of the total dispersion, or 70%-80% by weight of the total dispersion, or 80%-90% by weight of the total dispersion, or 90%-93% by weight of the total dispersion.

Optical transmittance is a common technique to evaluate the quality of a dispersion, formulation, and a nanocomposite film or coating. Light propagating through a sample can be absorbed, scattered, or transmitted. The normal transmittance at a given wavelength is defined as Tn=I/I0, where I0 is the intensity of incident light and I is the intensity of the light in the forward direction collected by the detector, which includes both light that is transmitted without scattering and light that is scattered into the forward direction. Theoretically the forward direction is defined as the same direction of the incident light, and however the detector usually collects light within a small solid angle around this direction due to the finite size of the detector. This transmittance is called normal transmittance or just transmittance, throughout this disclosure. When measuring normal transmittance, measurement artifacts, such as Fresnel reflections off of various interfaces and absorption by cuvette walls, need to be accounted for and removed. This can be taken care of by using a reference, either by measuring the sample and reference side by side in the instrument, or by measuring the sample and reference sequentially and then correcting the data mathematically afterward. The liquid nanocrystal dispersion sample can be measured in a cuvette made of glass, quartz, or plastic, and due to the finite thickness of the cuvette wall, there are four interfaces where Fresnel reflections can occur, and two walls where absorption can occur. Using a cuvette with same material, wall thickness, and path length as the reference may produce results with sufficient accuracy.

For a thin film sample, the coated substrate is measured against a blank substrate made of same material with same thickness and surface smoothness, either side by side, or sequentially, to correct absorption and reflection at interfaces. Because the coating may have a different refractive index than the substrate and air, the reflection off the front face of the film and the substrate may be slightly different, often resulting in higher than 100% transmittance based on the algorithm used by the spectrophotometer. The effect can be corrected but the step is complicated and the error is usually small. For convenience, the transmittance data shown in this disclosure are as measured without correction.

Light that is neither transmitted nor scattered nor reflected is absorbed. The absorbance can be calculated by subtracting the transmitted, scattered, and reflected light from the incident light.

The optical transmittance at 650 nm of the presently disclosed dispersion with 50% PGMEA by weight of the total dispersion as solvent, when measured in a cuvette with 1 cm path length using a Perkin Elmer Lambda 850 spectrophotometer, may be 99%-95%, or 95%-90%, or 90%-85%, or 85%-80%, 80%-75%, or 75%-70%, or 70%-65%, or 65%-60%, or 60%-55%, or 55%-50%, or 50%-45%, or 45%-40%, or 40%-35%, or 35%-30%, or 30%-25%, or 25%-20%, or 20%-15%, or 15%-10%.

The capped nanocrystals of the present disclosure have a narrow size distribution, with an average size range of 3-8 nm, measured with Transmission Electron Microscopy (TEM).

The capped nanocrystals of the present disclosure are, for example, mono-dispersible, with an average size range of 5-10 nm, measured with Dynamic Light Scattering (DLS) when dispersed in a solvent, such as PGMEA, at a concentration less than or equal to 5% by weight. The DLS measures the particle size together with the solvent shell surrounding the nanocrystal. The capped nanocrystals of present disclosure maintain dispersibility or remain agglomeration-free in an organic or polymer or monomer matrix. Such physical characteristics of the presently disclosed materials not only reduce light scattering but also make for an exceptional processability.

The presently disclosed dispersion may be stable for more than 1 week, or more than 2 weeks, or more than 3 weeks, or more than 6 weeks, or more than 8 weeks, 3 months, or more than 6 months, or more than 12 months, or more than 36 months, with no visible precipitation and less than 10% increase in transmittance, or less than 20% increase in transmittance, or 30% increase in transmittance, 40% increase in transmittance, or less than 50% increase in transmittance at 450 nm.

The presently disclosed dispersion may be analyzed using a TA instrument Q500 thermal gravimetric analyzer (TGA) to determine the inorganic solid content. The procedure for the analysis of the presently disclosed formulation include: 1.) Turn on data storage, 2.) Isothermal at room temperature for 5 minutes, 3.) Set temperature to 80° C., 4.) equilibrate at 80° C., 5.) Ramp 10° C./min to 198° C., 6.) Isothermal for 5 min at 198° C., 7.) Ramp 10° C./min to 800° C., 8.) Ramp 40° C./min to 950° C., 9.) Isothermal for 5 min at 950° C., 10.) Turn off data storage. The percent mass at 200° C. relative to the initial mass is regarded as capped nanocrystals and the percent mass at 700° C. relative to the initial mass is regarded as inorganic portion of the capped nanocrystal, i.e. inorganic solid content. The organic content is defined as the difference between the percent mass at 200° C. and at 700° C. divided by percent mass at 200° C., i.e. (M200C−M700C)/M200C.

The organic content of the presently disclosed dispersion may range from 10%-20% as measured by TGA.

Description of the Formulation

The present disclosure provides a formulation comprising a mixture of capped nanocrystals, optionally a solvent and organic coating materials.

The presently disclosed formulation may comprise nanocrystals of metal oxides, such as zirconium oxide, titanium oxide, hafnium oxide, or zinc oxide, which high bulk refractive indexes, typically larger than 2 in the visible spectrum, as well as exceptional transparency.

By combining the organic coating materials of the present disclosure with metal oxide nanocrystals as described herein, the presently described materials make it possible to produce easily processable unique flexible and thin film coatings with a high refractive index and high optical transparency.

The capping agent of capped nanocrystals in the presently disclosed formulation may include 2-[2-(2-methoxyethoxy)ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy (polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, benzoic acid, or any combination thereof.

The solvent of presently disclosed formulation may include alcohols, glycols, methyl acetates, ethyl acetates, esters, ketones, glycol ethers, glycol esters, such as propylene glycol monomethyl ether acetate (PGMEA), propylene glycol monomethyl ether (PGME), ethylene glycol monobutyl ether acetate, diethylene glycol monobutyl ether acetate, diethylene glycol butyl ether, diethylene glycol monoethyl ether acetate, dipropylene glycol methyl ether acetate, butoxy ethanol, butoxy propanol, ethoxy ethyl acetate, butoxy ethyl acetate, 2-(isopentyloxy)ethanol, 2-(hexyloxy)ethanol, diethylene glycol, diethylene glycol monomethyl ether, diethylene glycol monoethyl ether, triethylene glycol, triethylene glycol monomethyl ether, dipropylene glycol, dipropylene glycol monomethyl ether, and dipropylene glycol monoethyl ether, ethyl acetate, THF, acetone, any combination thereof.

The solvent of the presently disclosed formulation may constitute less than 10% by weight of the total formulation, or 10%-20% by weight of the total formulation, or 20%-30% by weight of the total formulation, or 30%-40% by weight of the total formulation, or 40%-50% by weight of the total formulation, or 50%-60% by weight of the total formulation, or 60%-70% by weight of the total formulation, or 70%-80% by weight of the total formulation, or 80%-90% by weight of the total formulation.

The presently disclosed formulation may be analyzed using a TA instrument Q500 thermal gravimetric analyzer (TGA) to determine the inorganic solid content. The procedure is the same as described previously. The percent mass at 200° C. relative to the initial mass is regarded as total formulation weight minus solvent content, and the percent mass at 700° C. relative to the initial mass is regarded as inorganic portion of the formulation, i.e. solid content.

The inorganic solid content of the presently disclosed formulation may be 0-10% as measured by TGA, or 10-20% as measured by TGA, or 20-30% as measured by TGA, or 30-40% as measured by TGA, or 40-50% as measured by TGA, or 50-60% as measured by TGA, or 60-70% as measured by TGA, or 70-80% as measured by TGA, or 80-90% as measured by TGA, or 90-93% as measured by TGA.

The organic coating materials of the presently disclosed formulation may include monomers, oligomers and/or polymers.

The monomer, oligomer, and/or polymer of presently disclosed formulation may include acrylics. The monomer, oligomer, and/or polymer of presently disclosed formulation may include bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof.

The capped nanocrystals of the presently disclosed formulation may constitute less than 10% by weight of the monomer, oligomer, and/or polymer plus at least partially capped nanocrystals, or 10%-20% by weight of the monomer, oligomer, and/or polymer plus at least partially capped nanocrystals, or 20%-30% by weight of the monomer, oligomer, and/or polymer plus at least partially capped nanocrystals, or 30%-40% by weight of the monomer, oligomer, and/or polymer plus at least partially capped nanocrystals, or 40%-50% by weight of the monomer, oligomer, and/or polymer plus at least partially capped nanocrystals, or 50%-60% by weight of the monomer, oligomer, or polymer, or 60%-70% by weight of the monomer, oligomer, and/or polymer plus at least partially capped nanocrystals, or 70%-80% by weight of the monomer, oligomer, and/or polymer plus at least partially capped nanocrystals, or 80%-90% by weight of the monomer, oligomer, and/or polymer plus at least partially capped nanocrystals, or 90%-93% by weight of the monomer, oligomer, and/or polymer plus at least partially capped nanocrystals.

The organic coating materials include may include any one or a combination of any two or more of a monomer, oligomer, and/or polymer, a curing agent, an adhesion promoter, a wetting agent, a leveling agent, a dispersing agent, a viscosity modifier, and optionally an antioxidant. These and other ingredients may be employed in amounts known to those of ordinary skill so long as they do not seriously interfere with the optical application of the formulation described herein.

Curing agents of the presently disclosed formulation may comprise a photopolymerization initiator. Any photopolymerization initiator can be used as long as it is capable of producing an active species, such as a radical with light (UV) energy. Photopolymerization initiator curing agents may include amines such as Ebecryl® P115, or benzophenone and its derivatives such as Ebecryl® P39, benzophenone, SpeedCure BEM (Lambson USA Ltd, Rutherford, Conn., USA) or organophosphines such as diphenyl(2,4,6-trimethylbenzoyl)-phosphine oxide, or Irgacure® 184 (BASF USA, Florham Park, N.J., USA. The formulation may comprise a single photopolymerization initiator or any combination thereof.

Curing agents of the presently disclosed formulation may comprise a thermal free radical initiator. Suitable thermal free radical initiators include, but are not limited to, peroxide compounds and azo compounds. The peroxide curing agent may be selected from the commonly used organic peroxy curing agents, such as dicumyl peroxide, t-butyl perbenzoate, benzoyl peroxide, t-butyl peracetate, 1,1-di(t-butylperoxy)3,3,5-trimethyl cyclohexane, 2,5-dimethyl-2,5-di(t-butylperoxy)hexyne, and n-butyl-4,4-bis(t-butylperoxy valerate). The azo initiator may be selected from 2,2'-azobisisobutyronitrile (AIBN), V-40, V-59, and VA-061 (Wako Chemicals USA, North Chesterfield, Va., USA).

A combination of more than one curing agent may be advantageous in certain circumstances known to one of ordinary skill.

The amount of curing agent of presently disclosed formulation may be present in an amount of less than 0.5% by weight of the monomer, oligomer, and/or polymer, or 0.5%-1% by weight of the monomer, oligomer, and/or polymer, or 1%-2% by weight of the monomer, oligomer, and/or polymer, or 2%-3% by weight of the monomer, oligomer, and/or polymer, or 3%-4% by weight of the monomer, oligomer, and/or polymer, or 4%-5% by weight of the monomer, oligomer, and/or polymer, or 5%-6% by weight of the monomer, oligomer, and/or polymer, or 6%-7% by weight of the monomer, oligomer, and/or polymer, or 7%-8% by weight of the monomer, oligomer, and/or polymer, or 8%-15% by weight of the monomer, oligomer, and/or polymer.

The adhesion promoter, if present may be selected from organo-metallic compounds, such as organo functional silanes, or from functionalized monomers and oligomers. Some organo functional silane adhesion promoters that are suitable contain amino or methacryloxy groups. Exemplary silane adhesion promoters include, but are not limited to 3-aminopropyltriethoxysilane, 3-[(methacryloyloxy)propyl] trimethoxysilane, ureidopropyltrimethoxysilane, and trimethoxy[3-(methylamino)propyl]silane Functionalized monomer and oligomer adhesion promoters include, but are not limited to, CN820, CN146 (Sartomer Americas, Exton, Pa., USA), SR9051, SR9053 (Sartomer Americas, Exton, Pa., USA), and Ebecryl 171 (Allnex USA Inc., Wallingford, Conn., USA).

Adhesion promoters of the presently disclosed formulation may be present in an amount of less than 0.5% by weight of the monomer, oligomer, and/or polymer, or 0.5-1% by weight of the monomer, oligomer, and/or polymer, or 1-5% by weight of the monomer, oligomer, and/or polymer, or 5-10% by weight of the monomer, oligomer, and/or polymer, or 10-15% by weight of the monomer, oligomer, and/or polymer, or 15-30% by weight of the monomer, oligomer, and/or polymer.

A wetting agent may be present to reduce the surface tension of the formulation and thereby provide improved wetting property of the coating on substrates and sub-layers. Representative examples of suitable wetting agents include, but are not limited to siloxane surfactants such as BYK-307, BYK-330 (BYK Chemie, GMBH) and fluro-surfactants such as Novec 4430, Novec 4432, and Novec 4434 (3M, St. Paul, Minn., USA).

The amount of wetting agent of the presently disclosed formulation may be present in amount of less than 0.05% by weight of the total formulation, or 0.05-0.1% by weight of the total formulation, or 0.1-0.5% by weight of the total formulation, or 0.5-1% by weight of the total formulation, or 1-2% by weight of the total formulation, or 2-5% by weight of the total formulation.

A leveling agent may be used to improve the flowing property of the formulation to produce a more uniform surface of the dried coating. The leveling agent, if present, may be a polyacrylate compound such as BYK-352, BYK-353, BYK-356, and BYK-361N and an aralkyl modified polymethylalkylsiloxane, such as BYK-322, BYK-323, and BYK-350 (BYK Chemie, GMBH).

The amount of leveling agent of the presently disclosed formulation may be present in an amount of less than 0.05% by weight of the total formulation, or 0.05-0.1% by weight of the total formulation, or 0.1-0.5% by weight of the total formulation, or 0.5-1% by weight of the total formulation, or 1-2% by weight of the total formulation, or 2-5% by weight of the total formulation.

The dispersing agent may be a non-ionic dispersing agent, an anionic dispersing agent, or a combination thereof. Examples of the dispersing agent may include, without limitation, polyalkylene glycols and esters thereof, polyoxyalkylenes, polyhydric alcohol ester alkylene oxide addition products, alcohol alkylene oxide addition products, sulfonate esters, sulfonate salts, carboxylate esters, carboxylate salts, alkylamide alkylene oxide addition products, alkyl amines, and the like, and may be used singularly or as a mixture of two or more.

Commercially available examples of the dispersing agent may include without limitation DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001 (BYK Chemie, GMBH), Solsperse 32000, Solsperse 36000, Solsperse 28000, Solsperse 20000, Solsperse 41000, and Solsperse 45000 (Lubrizol, Wickliffe, Ohio, USA)

The amount of dispersing agent of the presently disclosed formulation may vary depending on the material being dispersed. The amount of dispersing agent may be less than 3% by weight of the material being dispersed or 3-5% by weight of the material being dispersed, or 5-10% by weight of the material being dispersed, or 10-20% by weight of the material being dispersed, or 20-40% by weight of the material being dispersed, or 40-60% by weight of the material being dispersed, or 60-80% by weight of the material being dispersed, or 80-100% by weight of the material being dispersed, or 100-150% by weight of the material being dispersed.

Formulations of present disclosure may have a tunable viscosity, and/or a viscosity that can be controlled by one or more of the organic coating materials.

Formulations of the present disclosure may have a viscosity of about 1 cP to about 1,000 cP. Formulations of the present disclosure may have a viscosity of about 1 cP, about 2 cP, about 5 cP, about 10 cP, about 15 cP, about 20 cP, about 25 cP, about 30 cP, about 40 cP, about 50 cP, about 60 cP, about 75 cP, about 100 cP, about 200 cP, 500 cP, or about 1,000 cP.

The viscosity of formulations of the present disclosure may be controlled. Parameters that can control viscosity of the formulation include, but are not limited to, the average length, and molecular weight, of a monomer, oligomer, and/or polymer; as well as the presence of a solvent and a concentration of a solvent; the presence of the a thickener (i.e., a viscosity-modifying component) and a concentration of a thickener; a particle size of a component present in the formulation; and combinations thereof. Anti-oxidant agents of the presently disclosed formulation may include at least one primary antioxidant. This primary antioxidant may be selected from sterically hindered phenols, such as Irganox 1010, Irganox 1076, SongNox® 1076, SongNox® 2450 or phenolic phosphites such as SongNox® 1680 or phosphines such as Irgaphos 168 (BASF USA, Florham Park, N.J., USA) or aromatic secondary amines or hindered amines such as SongLight® 6220 (Songwon Americas, Friendwood, Tex., USA).

Formulations of the present disclosure may contain at least one secondary antioxidant. This secondary antioxidant is preferably chosen from compounds comprising at least one unit formed from a sulfur atom linked to two carbon atoms. Representative examples of the secondary antioxidant are di(t-butyl) hydroxyphenylamino bisoctylthiotriazine and Irganox PS800 (BASF USA, Florham Park, N.J., USA).

The amount of anti-oxidant of presently disclosed formulation may be less than 0.5% by weight of the total formulation, or 0.5%-1% by weight of the total formulation, or 1%-2% by weight of the total formulation, or 2%-3% by weight of the total formulation, or 3%-4% by weight of the total formulation, or 4%-5% by weight of the total formulation, or 5%-6% by weight of the total formulation, or 6%-7% by weight of the total formulation, or 7%-8% by weight of the total formulation.

The presently disclosed formulation may further comprise, plasticizer, toughener, thickener, thinner, dispersant, or flexibilizer, or other functional additives.

The viscosity of the presently disclosed formulation may be less than 5 cPs, or 5 cPs-50 cPs, or 50 cPs-200 cPs, or 200 cPs-400 cPs, or 400 cPs-650 cPs, or 650 cPs-1000 cPs, when measured with a Brookfield RVDV II+ cone and plate viscometer.

The optical transmittance at 650 nm of the presently disclosed formulation with 50% PGMEA by weight of the total formulation as solvent, when measured in a cuvette with 1 cm path length using a Perkin Elmer Lambda 850 spectrophotometer, may be 99%-95%, or 95%-90%, or 90%-85%, or 85%-80%, 80%-75%, or 75%-70%, or 70%-65%, or 65%-60%, or 60%-55%, or 55%-50%, or 50%-45%, or 45%-40%, or 40%-35%, or 35%-30%, or 30%-25%, or 25%-20%, or 20%-15%, or 15%-10%.

Describing a Film or Coating

The present disclosure provides a nanocomposite coating or film comprising a mixture of a polymer matrix, a curing agent, and capped nanocrystals wherein said capped nanocrystals are present in the coating or film in an amount of greater than 50% by weight of the coating and film.

The presently disclosed nanocomposite coating or film may comprise nanocrystals of metal oxides, such as zirconium oxide, titanium oxide, hafnium oxide, or zinc oxide.

The capping agent of capped nanocrystals in the presently disclosed nanocomposite coating or film may include 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, benzoic acid, or any combination thereof.

The inorganic solid content of the presently disclosed nanocomposite coating or film may be analyzed using a TA instrument Q500 thermal gravimetric analyzer (TGA). The procedure is the same as described previously. The percent at 700° C. relative to the initial mass is regarded as inorganic portion of the formulation, i.e. solid content.

The inorganic solid content of the presently disclosed nanocomposite coating may be 0-10% as measured by TGA, or 10-20% as measured by TGA, or 20-30% as measured by TGA, or 30-40% as measured by TGA, or 40-50% as measured by TGA, or 50-60% as measured by TGA, or 60-70% as measured by TGA, or 70-80% as measured by TGA, or 80-90% as measured by TGA, or 90-93% as measured by TGA.

The monomer units of the polymer matrix of the presently disclosed nanocomposite coating or film may include acrylics. The monomer units of the polymer matrix of the presently disclosed nanocomposite coating or film may include bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof.

The monomer units of the polymer matrix of the present disclosure may include a tri- to hexa-functional acrylate-based monomer crosslinking agent to increase the crosslink density of the cured coating. The tri- to hexa-functional monomer crosslinking agent may enhance coating properties; for example, contributing to an increase in cure rate and an increase in film hardness. Examples of the tri- to hexa-functional acrylate-based monomer crosslinking agents may include, but are not limited to, trimethylolpropane triacrylate (TMPTA), trimethylolpropaneethoxy triacrylate (TMPEOTA), glycerin-propoxylated triacrylate (GPTA), pentaerythritol tetraacrylate (PETA), dipentaerythritol hexaacrylate (DPHA), and the like. The tri- to hexa-functional acrylate-based monomers may be used independently or in a combination thereof.

Commercially available examples of tri- to hexa-functional acrylates include CN9025, SR-205, SR-454, SR-499, SR-502, SR-9035 (Sartomer Americas, Exton, Pa., USA).

The amount of tri- to hexa-functional acrylate-based monomer of presently disclosed formulations may be present in an amount less than 1% by weight of the monomer, oligomer, and/or polymer, or 1%-5% by weight of the monomer, oligomer, and/or polymer, or 5%-10% by weight of the monomer, oligomer, and/or polymer, or 10%-20% by weight of the monomer, oligomer, and/or polymer, or 20%-30% by weight of the monomer, oligomer, and/or polymer, or 30%-40% by weight of the monomer, oligomer, and/or polymer, or 50%-60% by weight of the monomer, oligomer, and/or polymer.

The capped nanocrystals of the presently disclosed nanocomposite coating or film may constitute 10%-20%, or 20%-30%, or 30%-40%, or 40%-50%, or 50%-60%, or 60%-70%, or 70%-75%, or 75%-80%, or 80%-85%, or 85%-90%, or 90%-93% by weight of the coating and film.

Curing agents of the presently disclosed nanocomposite coatings or film may comprise a photopolymerization initiator. Photopolymerization initiators capable of producing an active species, such as a radical with light (UV) energy, may be used. Photopolymerization initiator curing agents may include amines such as Ebecryl® P115 or benzophenone and its derivatives such as Ebecryl® P39, benzophenone, SpeedCure BEM (Lambson USA Ltd, Rutherford, Conn., USA) or organophosphines such as diphenyl(2,4,6-trimethylbenzoyl)-phosphine oxide, or Irgacure® 184 (BASF USA, Florham Park, N.J., USA. The formulations may comprise a single photopolymerization initiator or any combination thereof.

Curing agents of the presently disclosed nanocomposite coating or film may comprise a thermal free radical initiator. Thermal free radical initiators include, but are not limited to peroxide compounds and azo compounds. The peroxide curing agent may be selected from the commonly used organic peroxy curing agents, such as dicumyl peroxide, t-butyl perbenzoate, benzoyl peroxide, t-butyl peracetate, 1,1-di(t-butylperoxy)3,3,5-trimethyl cyclohexane, 2,5-dimethyl-2,5-di(t-butylperoxy)hexyne, and n-butyl-4,4-bis(t-butylperoxy valerate). The azo initiator may be selected from 2,2'-azobisisobutyronitrile (AIBN), V-40, V-59, and VA-061 (Wako Chemicals USA, North Chesterfield, Va., USA).

A combination of more than one curing agent may be advantageous in certain circumstances known to one of ordinary skill.

The amount of curing agent of presently disclosed nanocomposite coating or film may be less than 0.5% by weight of the polymer matrix, or 0.5%-1% by weight of the polymer matrix, or 1%-2% by weight of the polymer matrix, or 2%-3% by weight of the polymer matrix, or 3%-4% by weight of the polymer matrix, or 4%-5% by weight of the polymer matrix, or 5%-6% by weight of the polymer matrix, or 6%-7% by weight of the polymer matrix, or 7%-8% by weight of the polymer matrix, or 8%-10% by weight of the or polymer matrix, or 10%-15% by weight of the or polymer matrix.

Adhesion promoters, if present may be selected from organo-metallic compounds, such as organo functional silanes, or from functionalized monomers and oligomers. Some organo functional silane adhesion promoters that are suitable contain amino or methacryloxy groups. Exemplary silane adhesion promoters include, but are not limited to 3-aminopropyltriethoxysilane, 3-[(methacryloyloxy)propyl]trimethoxysilane, ureidopropyltrimethoxysilane, and trimethoxy[3-(methylamino)propyl]silane Functionalized monomer and oligomer adhesion promoters include, but are not limited to CN820, CN146 (Sartomer Americas, Exton, Pa., USA), SR9051, SR9053 (Sartomer Americas, Exton, Pa., USA), and Ebecryl 171 (Allnex USA Inc., Wallingford, Conn., USA).

The adhesion promoter of the presently disclosed formulation may be present in an amount less than 0.5% by weight of the monomer, oligomer, and/or polymer, or 0.5-1% by weight of the monomer, oligomer, and/or polymer, or 1-5% by weight of the monomer, oligomer, and/or polymer, or 5-10% by weight of the monomer, oligomer, and/or polymer, or 10-15% by weight of the monomer, oligomer, and/or polymer, or 15-30% by weight of the monomer, oligomer, and/or polymer.

A wetting agent may be present to reduce the surface tension of the formulation and thereby provide improved wetting property of the nanocomposite coating or film on substrates and sub-layers. Representative examples of suitable wetting agents include, but are not limited to siloxane surfactants such as BYK-307, BYK-330 (BYK Chemie, GMBH) and fluro-surfactants such as Novec 4430, Novec 4432, and Novec 4434 (3M, St. Paul, Minn., USA).

The amount of wetting agent of the presently disclosed formulation may be present in an amount less than 0.05% by weight of the total formulation, or 0.05-0.1% by weight of the total formulation, or 0.1-0.5% by weight of the total formulation, or 0.5-1% by weight of the total formulation, or 1-2% by weight of the total formulation, or 2-5% by weight of the total formulation.

A leveling agent may be used to improve the flowing property of the formulation to produce a more uniform surface of the dried nanocomposite coating or film. The leveling agent, if present, may be a polyacrylate compound such as BYK-352, BYK-353, BYK-356, and BYK-361N and an aralkyl modified polymethylalkylsiloxane, such as BYK-322, BYK-323, and BYK-350 (BYK Chemie, GMBH).

The amount of leveling agent of the presently disclosed formulation may be less than 0.05% by weight of the total formulation, or 0.05-0.1% by weight of the total formulation, or 0.1-0.5% by weight of the total formulation, or 0.5-1% by weight of the total formulation, or 1-2% by weight of the total formulation, or 2-5% by weight of the total formulation.

The dispersing agent may be a non-ionic dispersing agent, an anionic dispersing agent, or a combination thereof. Examples of the dispersing agent may include without limitation polyalkylene glycols and esters thereof, polyoxyalkylenes, polyhydric alcohol ester alkylene oxide addition products, alcohol alkylene oxide addition products, sulfonate esters, sulfonate salts, carboxylate esters, carboxylate salts, alkylamide alkylene oxide addition products, alkyl amines, and the like, and may be used singularly or as a mixture of two or more.

Commercially available examples of the dispersing agent may include without limitation DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001 (BYK Chemie, GMBH), Solsperse 32000, Solsperse 36000, Solsperse 28000, Solsperse 20000, Solsperse 41000, and Solsperse 45000 (Lubrizol, Wickliffe, Ohio, USA).

The amount of dispersing agent of the presently disclosed formulation may vary widely depending on the material being dispersed. Typically the amount of dispersing agent may be present in an amount less than 3% by weight of the material being dispersed or 3-5% by weight of the material being dispersed, or 5-10% by weight of the material being dispersed, or 10-20% by weight of the material being dispersed, or 20-40% by weight of the material being dispersed, or 40-60% by weight of the material being dispersed, or 60-80% by weight of the material being dispersed, or 80-100% by weight of the material being dispersed, or 100-150% by weight of the material being dispersed.

In some embodiments, the formulation of present disclosure has a tunable viscosity, and/or a viscosity that can be controlled by one or more of the organic coating materials.

In some embodiments, the formulation of the present disclosure has a viscosity of about 1 cP to about 1,000 cP. In some embodiments, the formulation of the present disclosure has a viscosity of about 1 cP-2 cP, about 2 cP-5 cP, about 5 cP-10 cP, about 10 cP-15 cP, about 15 cP-20 cP, about 20 cP-25 cP, about 25 cP-30 cP, about 30 cP-40 cP, about 40 cP-50 cP, about 50 cP-60 cP, about 60 cP-75 cP, about 75 cP-100 cP, about 100 cP-200 cP, about 200 cP-500 cP, 500 cP-1,000 cP.

Typically, the viscosity of the formulation is controlled. Parameters that can control viscosity of the formulation include, but are not limited to, the average length, and molecular weight, of a monomer, oligomer, and/or polymer; as well as the presence of a solvent and a concentration of a solvent; the presence of a thickener (i.e., a viscosity-modifying component) and a concentration of a thickener; a particle size of a component present in the paste; and combinations thereof.

The anti-oxidant agent of the presently disclosed nanocomposite coating or film may include at least one primary antioxidant. This primary antioxidant may be selected from sterically hindered phenols, such as Irganox 1010, Irganox 1076, SongNox® 1076, SongNox® 2450 or phenolic phosphites such as SongNox® 1680 or phosphines such as Irgaphos 168 (BASF USA, Florham Park, N.J., USA) or aromatic secondary amines or hindered amines such as SongLight® 6220 (Songwon Americas, Friendwood, Tex., USA).

The nanocomposite coating or film of the present disclosure may contain at least one secondary antioxidant. This secondary antioxidant is preferably chosen from compounds comprising at least one unit formed from a sulfur atom linked to two carbon atoms. Representative examples of the secondary antioxidant are di(t-butyl) hydroxyphenylamino bisoctylthiotriazine and Irganox PS800 (BASF USA, Florham Park, N.J., USA).

The amount of anti-oxidant of presently disclosed nanocomposite coating or film may be present in an amount less than 0.5% by weight of the total formulation, or 0.5%-1% by weight of the total formulation, or 1%-2% by weight of the total formulation, or 2%-3% by weight of the total formulation, or 3%-4% by weight of the total formulation, or 4%-5% by weight of the total formulation, or 5%-6% by weight of the total formulation, or 6%-7% by weight of the total formulation, or 7%-8% by weight of the total formulation, or 8%-10% by weight of the total formulation.

The presently disclosed nanocomposite coating or film may further comprise, plasticizer, toughener, thickener, thinner, dispersant, or flexibilizer, or other functional additives.

The presently disclosed nanocomposite coating or film may possess a refractive index of 1.6-1.62, or 1.62-1.64, 1.64-1.66, or 1.66-1.68, or 1.68-1.70, or 1.70-1.72, or 1.72-1.74, or 1.76-1.78, or 1.78-1.80, or 1.80-1.82, or 1.82-1.84, or 1.84-1.86, or 1.86-1.88, or 1.88-1.90 at 400 nm.

The presently disclosed nanocomposite coating or film may possess an Abbe number in the range of 30 to 41.

The presently disclosed nanocomposite coating or film may additionally demonstrate thermal stability at temperatures above 120° C., or above 175° C., or above 200° C., or above 250° C., or above 260° C., or above 300° C. The thermal stability may be measured by subjecting the nanocomposite coating or film at designated temperature in air, nitrogen, or under vacuum for 5 minutes or longer, or 10 minute or longer, or 30 minutes or longer, or 60 minutes or longer, or 120 minutes or longer, without out visually observable coloration, cracking, or delamination.

The thermal stability may be measured by subjecting the coating or film of at 150° C. in air for 60 minutes, the averaged change of optical transmittance from 400 nm to 800 nm is 5%-10%, or 2%-5% or 1%-2%, or 0.1%-1% or 0.001%-0.1%, when normalized to a 1 μm film. The normalization may be carried out by converting the transmittance to absorbance, dividing the absorbance by the film thickness in micrometer, and then converting the result back to transmittance for a 1 μm film.

The thermal stability may also be measured by subjecting the coating or film at 200° C. in air, vacuum, or nitrogen for 60 minutes, the averaged change of optical transmittance from 400 nm to 800 nm is 5%-10%, or 2%-5% or 1%-2%, or 0.1%-1% or 0.001%-0.1%, when normalized to a 1 μm film.

The thermal stability may also be measured by subjecting the coating or film at 250° C. in air, vacuum or nitrogen for 60 minutes, the averaged change of optical transmittance from 400 nm to 800 nm is 5%-10%, or 2%-5% or 1%-2%, or 0.1%-1% or 0.001%-0.1%, when normalized to a 1 μm film.

The presently disclosed nanocomposite coating or film may additionally demonstrate pencil hardness 3H or higher, or 4H or higher, or 5H or higher, or 6H or higher.

The presently disclosed nanocomposite coating or film may possess high optical (440-800 nm) transmittance of 99.9%-99%, or 99%-98%, or 98%-97%, or 97%-96%, or 96%-95%, or 95%-90%, or 90%-85%, or 85%-80%, 80%-75%, or 75%-70%, or 70%-65%, or 65%-60%, or 60%-55%, or 55%-50%, or 50%-45%, or 45%-40%, or 40%-35%, or 35%-30%, or 30%-25%, or 25%-20%, or 20%-15%, or 15%-10% for films that are less than 5 microns thick. The transmittance of a film according to the present disclosure may be normal transmittance measured with a Perkin-Elmer UV-Vis Lambda 850 spectrophotometer, wherein the film is coated on an optically transparent substrate, such as fused silica or glass substrates, and a blank substrate of the same type and thickness is used as a reference.

The presently disclosed nanocomposite coating or film may be resistant to processing chemicals, for examples, hydrochloric acid, KOH, de-ionized water (DI water), acetone, isopropanol, N-methyl-2-pyrrolidone, etc. The chemical resistance may be measured in one of the two procedures.

In the first procedure (Procedure 1), a substrate coated with the presently disclosed nanocomposite coating or film is submerged in the chemical being tested, in a sonication bath, for 1 minutes, 5 minutes, 30 minutes, or 60 minutes, and then rinsed with DI water and dried in air.

The second procedure (Procedure 2), a few drops of the chemical being tested is placed on top of a substrate coated with the presently disclosed nanocomposite coating or film, and wait for 1 minutes, 5 minutes, 30 minutes, or 60 minutes, and then the substrate is rinsed with DI water and dried in air. The excellent chemical resistance is defined as after either the first procedure or the second procedure, there is no visible discoloration, swelling, cracking, delamination, peeling off, or loss of integrity, of the coating or film.

The chemical resistance can also be characterized by measuring the weight change of the film. This can be achieved by any suitable method such as quartz crystal microbalance.

Acid resistance was determined herein in solutions of 1:1 HCl and 1:3 HCl; and base resistance was determined herein in a solution of 5 wt % KOH solution. Chemical resistance was also determined in acetone, isopropanol, and N-methyl-2-pyrrolidone.

Films and coatings of the present disclosure demonstrate no visible discoloration, swelling, cracking, delamination, peeling off, or loss of integrity, after chemical resistance treatment as described herein.

Alternatively, the films and coating described herein demonstrate less than 5% weight change after chemical resistance testing, such as is described in Procedure 1 above. Alternatively, the films and coating described herein demonstrate weight change in range of 4-5% or 3-4% or 2-3% or 1-2% or 0-1% after chemical resistance testing, such as is described in Procedure 1 above.

A Method of Making a Film

The present disclosure provides a method of making the presently disclosed nanocomposite coating or film using the presently disclosed formulation.

The presently disclosed method of making a nanocomposite coating or film may comprise spin coating, slot-die coating, slit-coating, screen-printing, ink-jet printing, dip coating, draw-bar coating, roll-to-roll printing, spray coating, and any combination thereof.

The film thickness of presently disclosed method of making a nanocomposite coating or film may range from 50 nanometers to 100 micrometers.

The film of presently disclosed method of making a nanocomposite coating or film may possess a root mean square (RMS) surface roughness of 3 nm-10 nm, or 2 nm-3 nm, or 1 nm-2 nm, or 0.6 nm-1 nm, or 0.1 nm-0.6 nm. The RMS surface roughness may be measured using an Atomic Force Microscopy (AFM) over a 5 micron by 5 micron square.

An OLED Device

The present disclosure provides an OLED lighting device comprising an internal light extraction layer, said internal light extraction layer comprising a high refractive index nanocomposite coating or film of the present disclosure.

The present disclosure further provides an active component comprising or containing an LED, organic LED, touch screen, display, sensor, or a solar cell, said active component, comprising or containing a coating or a film or a layer of the present disclosure.

DETAILED DESCRIPTION OF FIGURES

FIG. 1A: An exemplary optical transmittance of 50 wt % capped nanocrystals dispersed in PGMEA, as described in EXAMPLE 1.

Figure 1B:
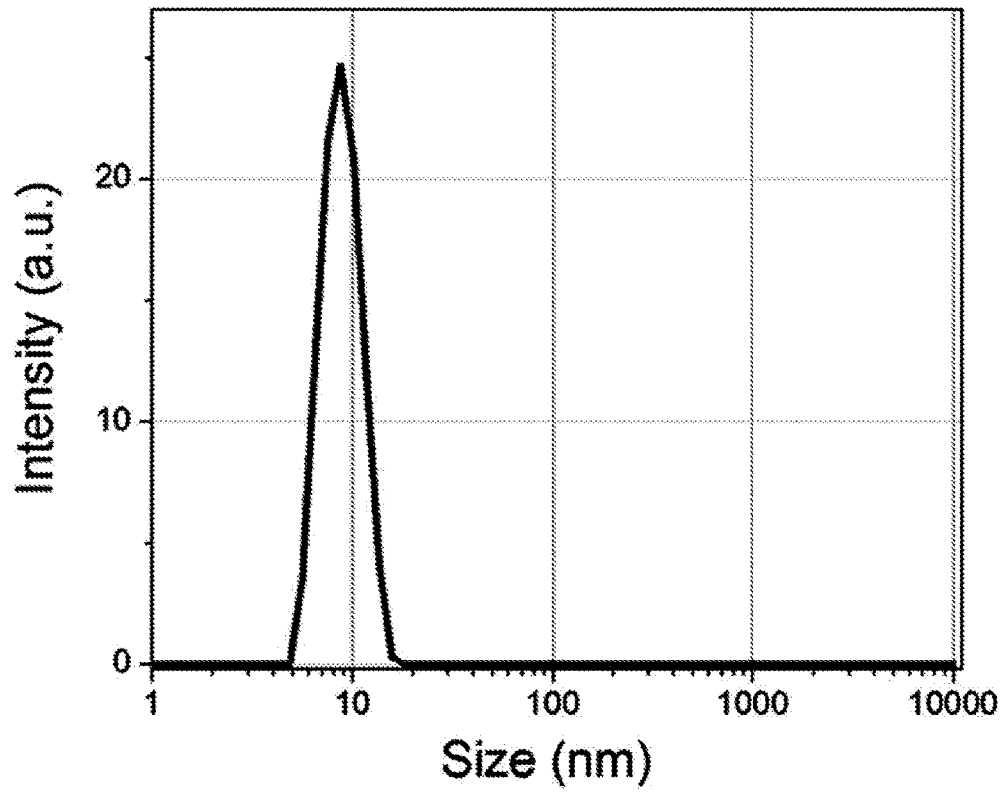

FIG. 1B: Shows an exemplary dynamic light scattering (DLS) result of 5 wt % capped nanocrystals dispersed in PGMEA, as described in EXAMPLE 1, showing an average particle size of 9 nm.

Figure 2:
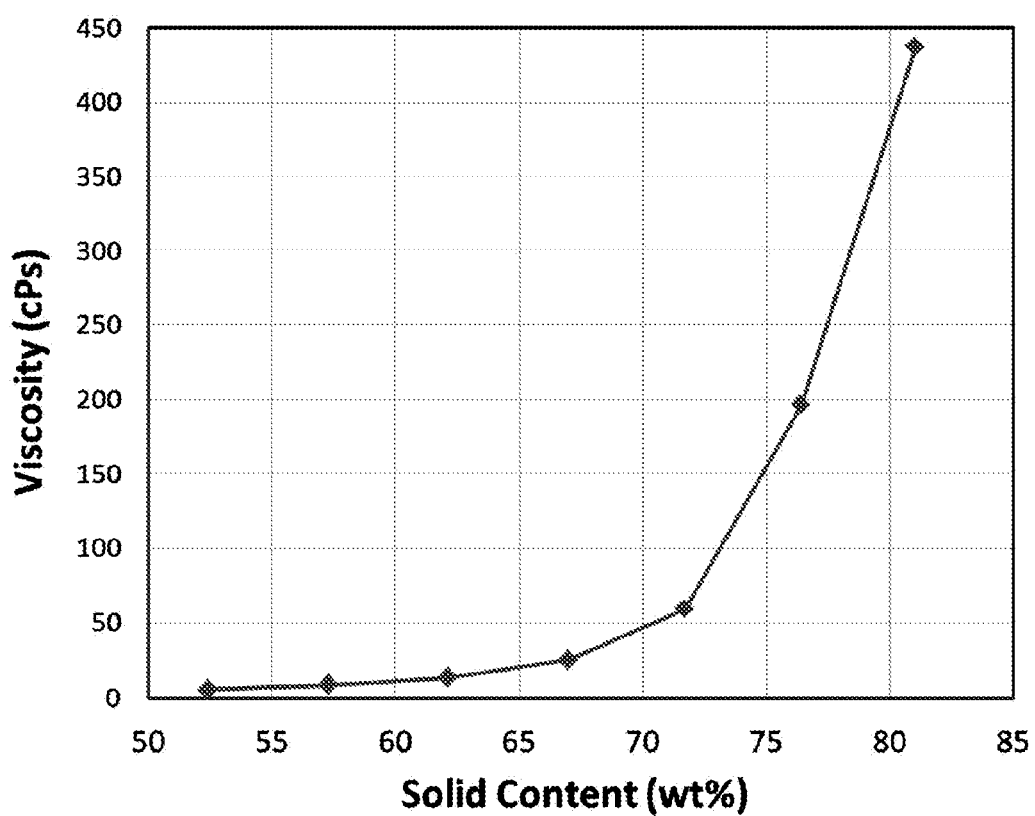

FIG. 2: The viscosity of the formulation as a function of the solid content (non-solvent portion) weight percentage to the total weight of the formulation, as described in EXAMPLE 3.

Figure 3:
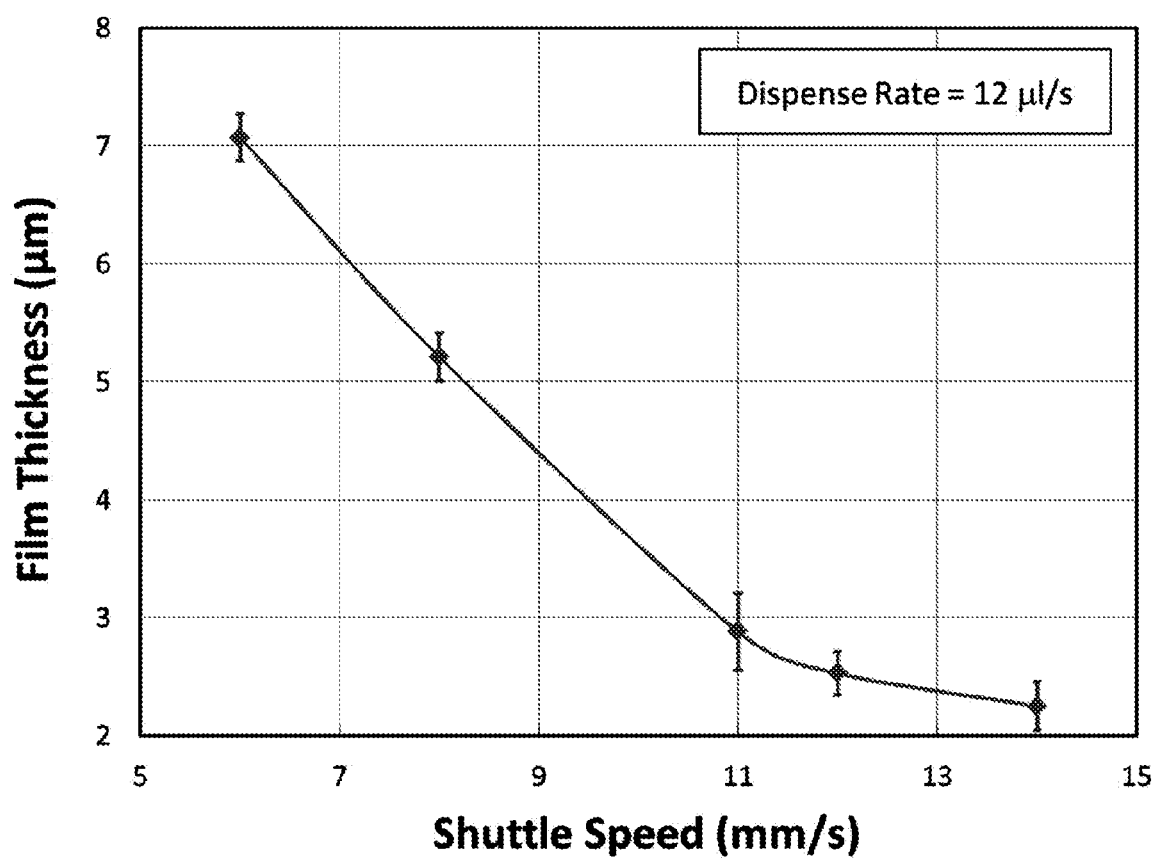

FIG. 3: An exemplary experimental depict the relationship of film thickness and standard deviation to shuttle speed on an nTact nRad slot-die coater with 12 μL/s dispense rate using the formulation described in EXAMPLE 3.

Figure 4A:
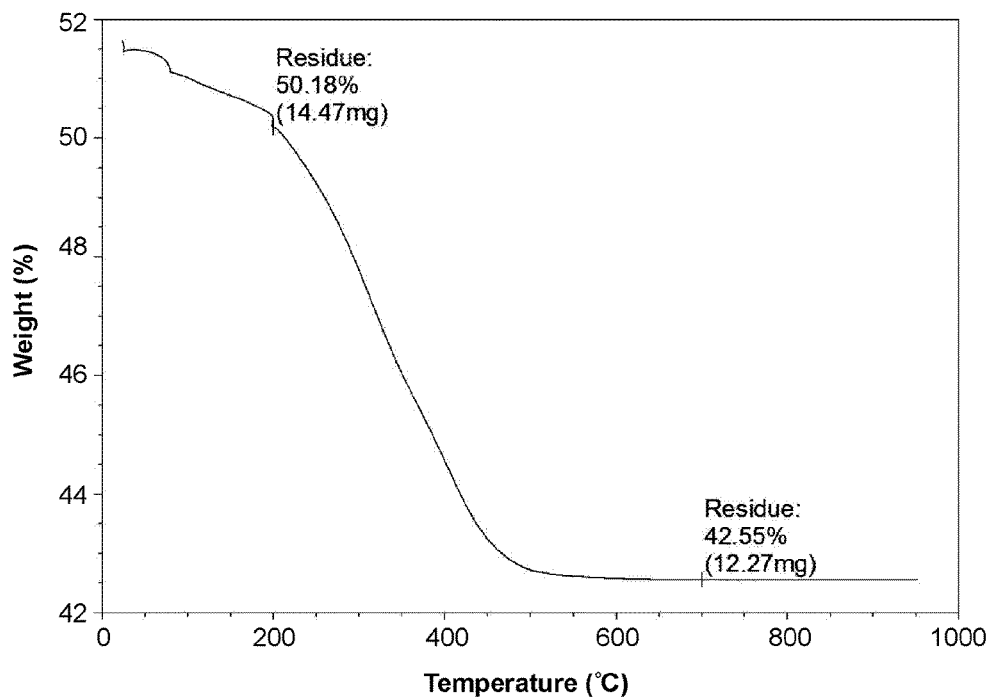

FIG. 4A: TGA result of the capped nanocrystals of EXAMPLE 3 dispersed in PGEMA by themselves with 50% by weight.

Figure 4B:
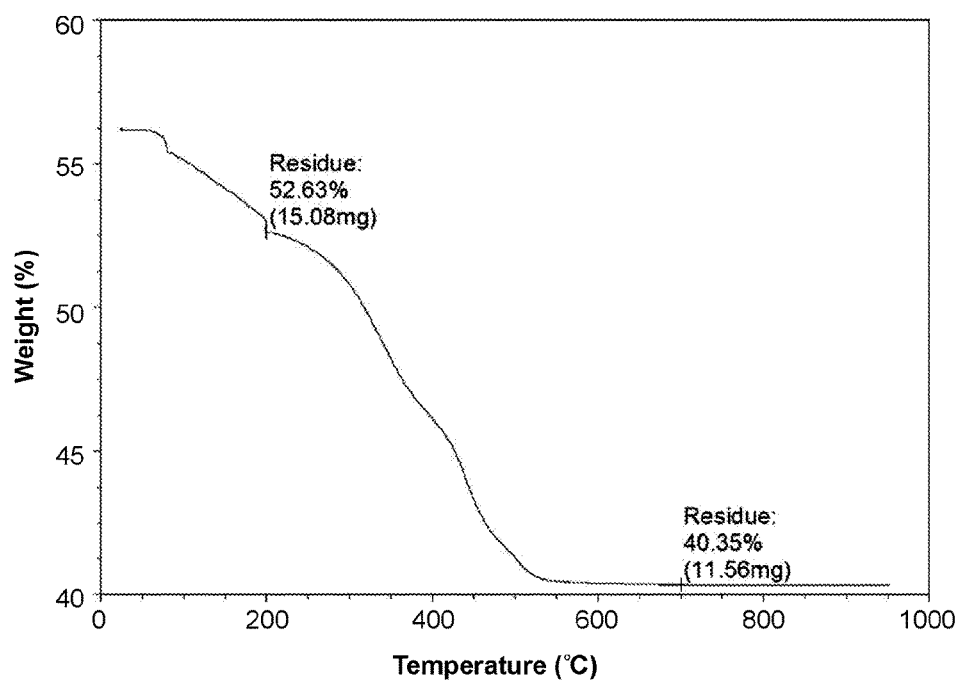

FIG. 4B: TGA result of the formulation in EXAMPLE 3 with 50% of capped nanocrystals by weight.

Figure 5:
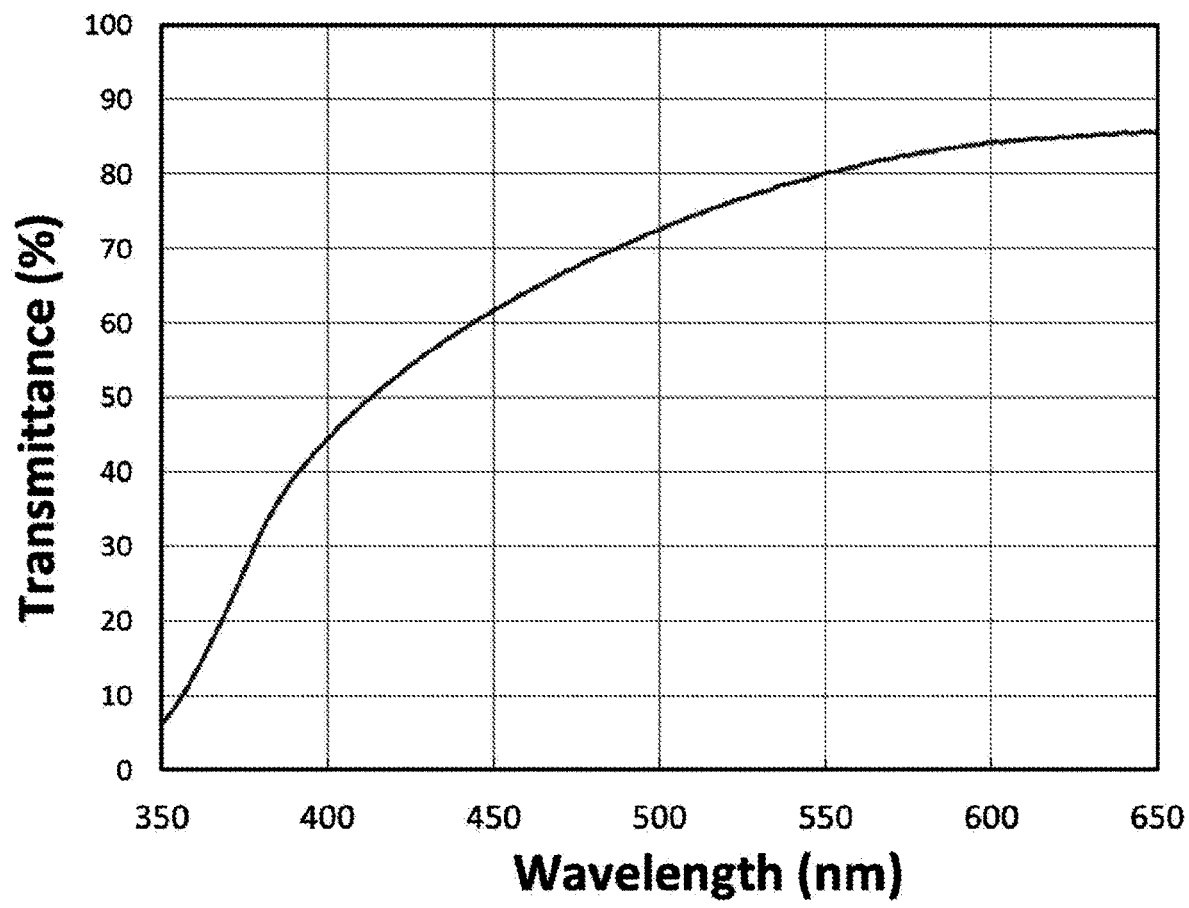

FIG. 5: Optical transmittance of the formulation of the current example with 50% of capped nanocrystals by weight.

Figure 6A:
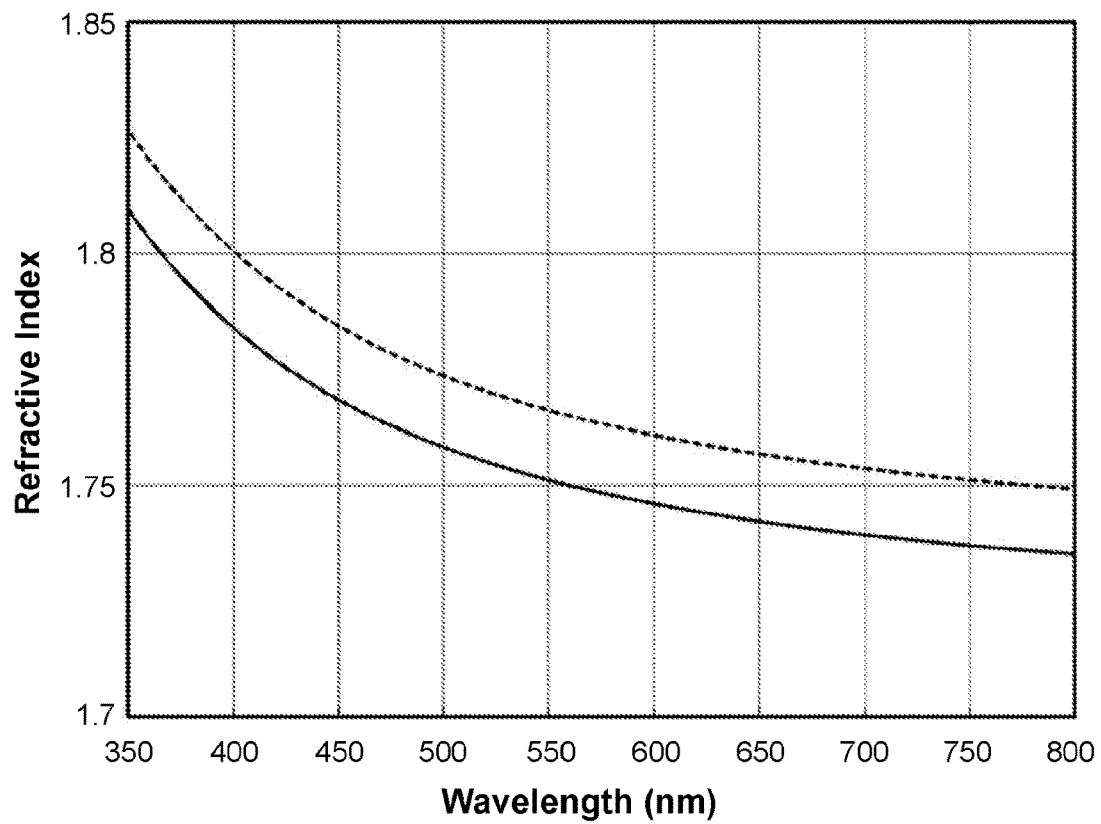

FIG. 6A: Refractive index as a function of wavelength of spin coated films produced with the formulation described in EXAMPLE 3, as made film (solid line) and after 200 C 60 minutes thermal treatment (dotted line).

Figure 6B:
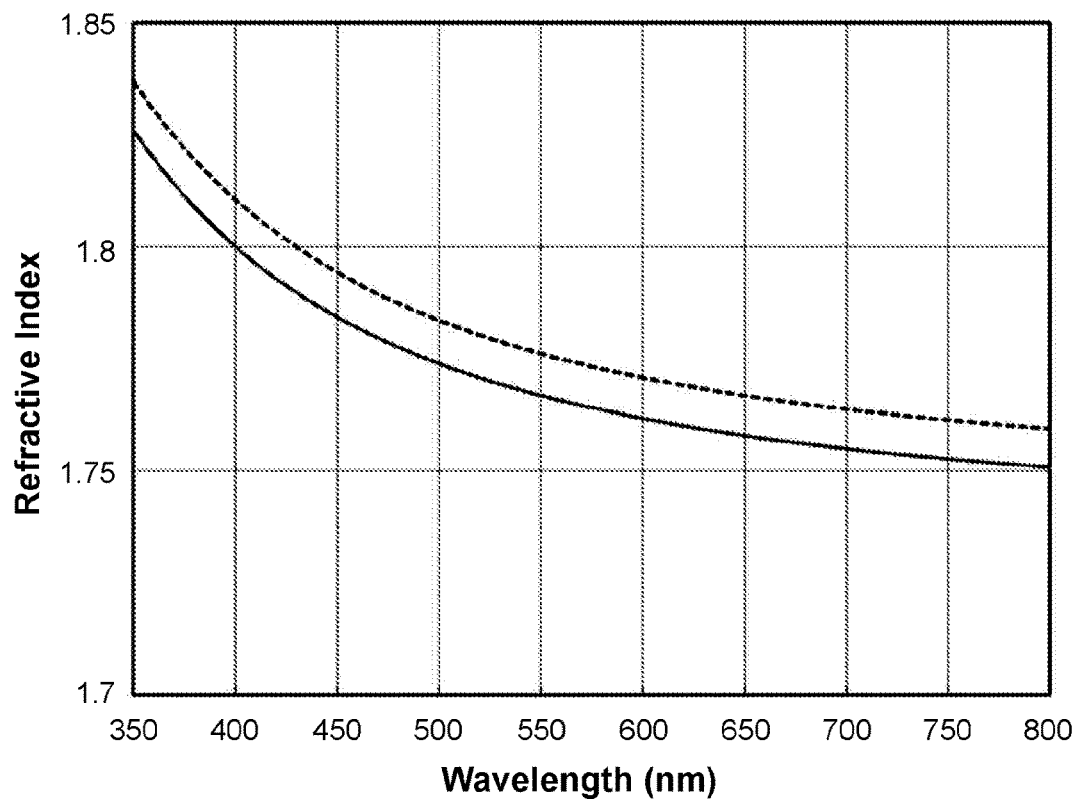

FIG. 6B: Refractive index as a function of wavelength of spin coated films produced with a variation of the formulation described in EXAMPLE 3, as made film (solid line) and after 200 C 60 minutes thermal treatment (dotted line).

Figure 7:
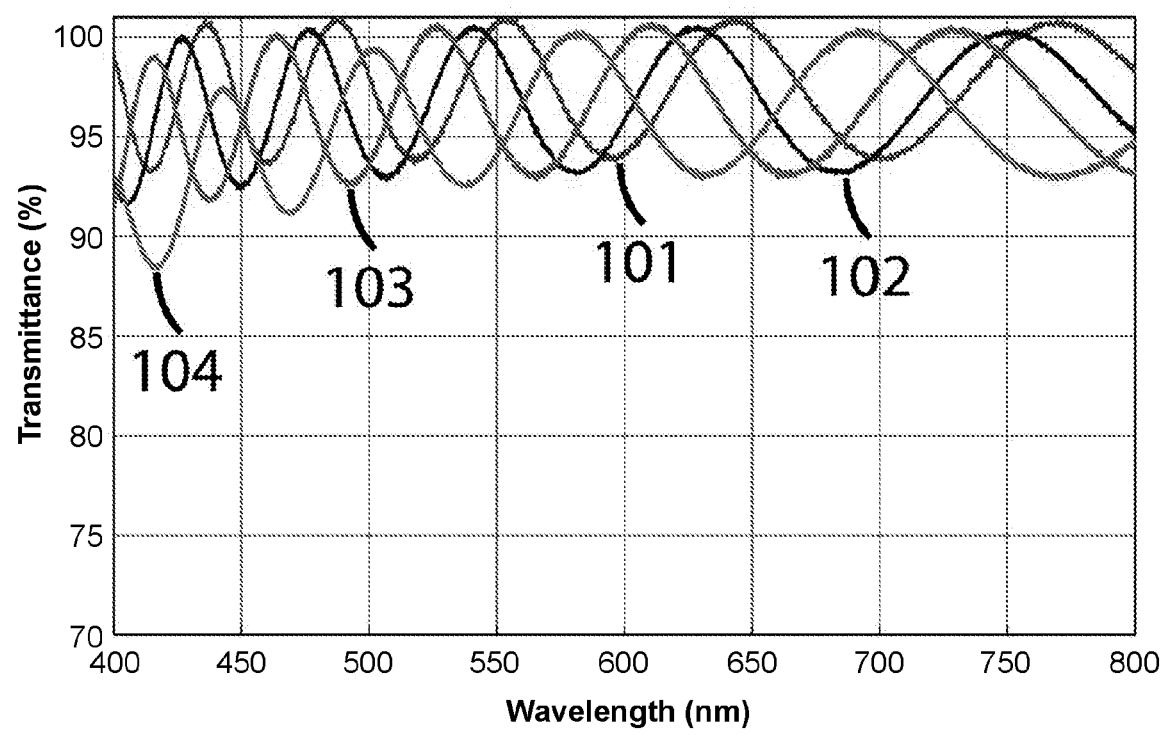

FIG. 7: Optical transmittance of the as-made film produced with formulation described in EXAMPLE 3 (101), after 60 minutes at 150° C. on a hot plate in air (102), after 60 minutes at 200° C. on a hot plate in air (102), after 60 minutes at 250° C. on a hot plate in air (102).

Figure 8:
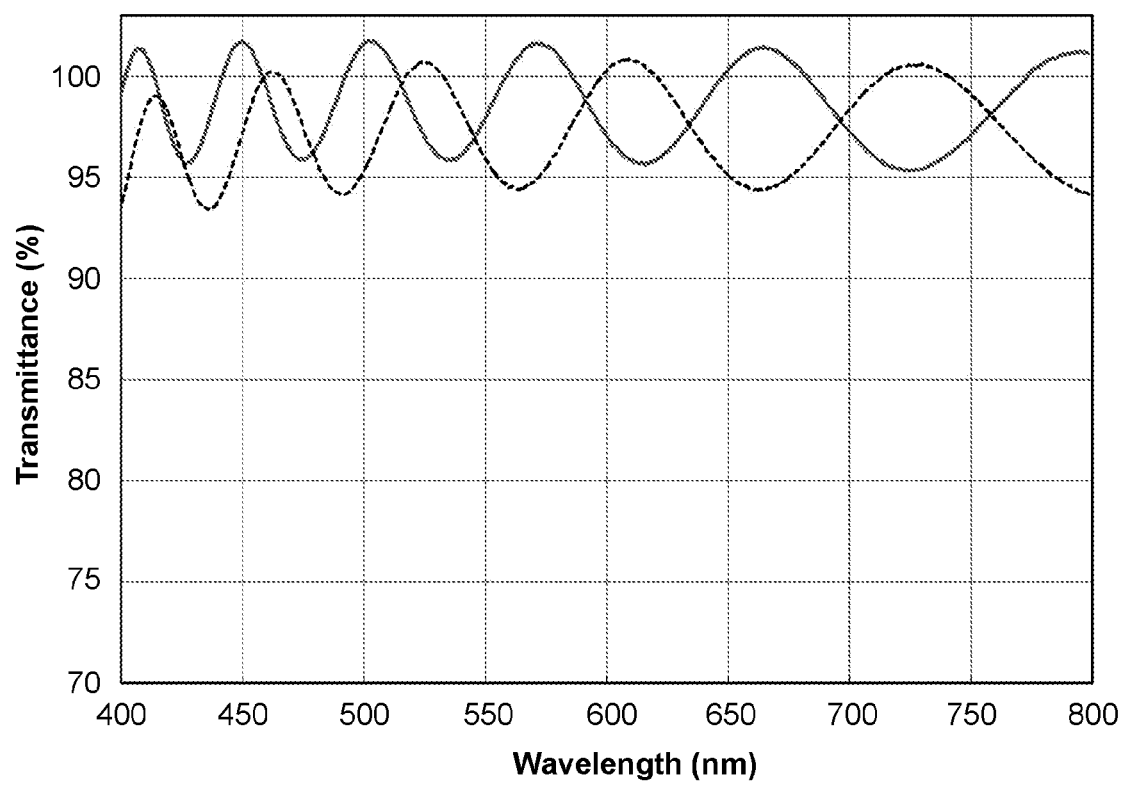

FIG. 8: Optical transmittance of an as-made film produced with the formulation described in EXAMPLE 3 (solid line) and optical transmittance after the film is subjected to 30 minutes, 120° C. additional post bake followed by 70 minutes, 200° C. thermal treatment (dotted line).

Figure 9A:
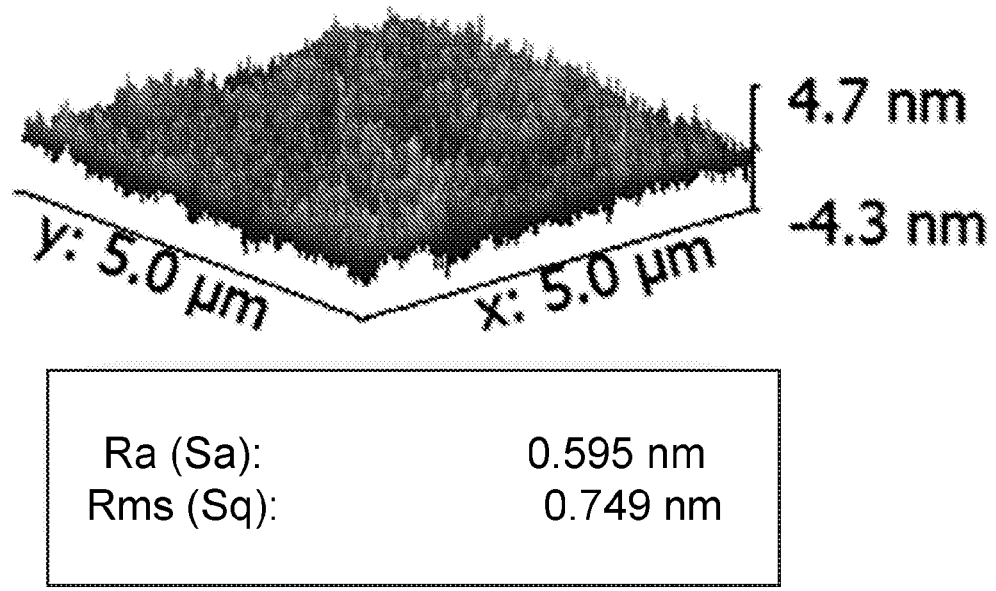

FIG. 9A: AFM image of as-made spin coated film produced with the formulation described in EXAMPLE 3, with about 1 micrometer thickness.

Figure 9B:
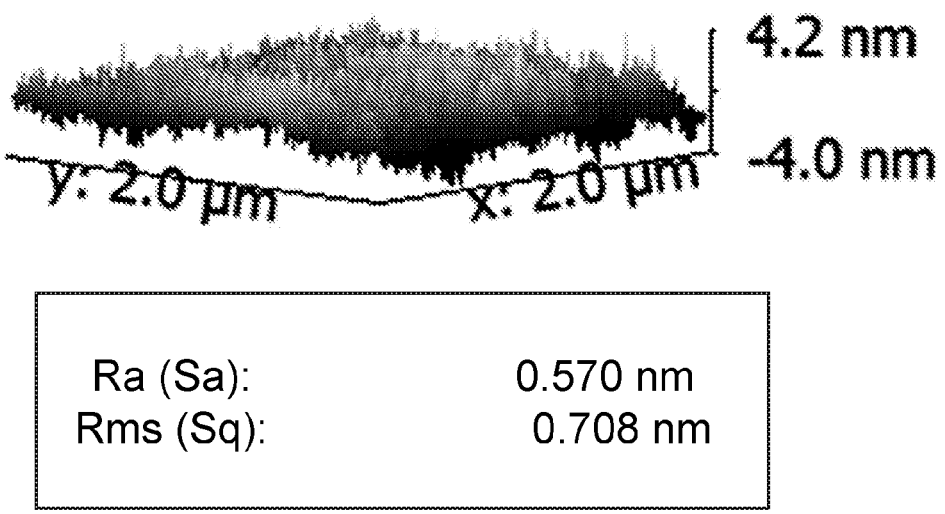

FIG. 9B: AFM image of spin coated film produced with the formulation described in EXAMPLE 3 after a thermal treatment of 250° C. for 30 minutes.

Figure 10:
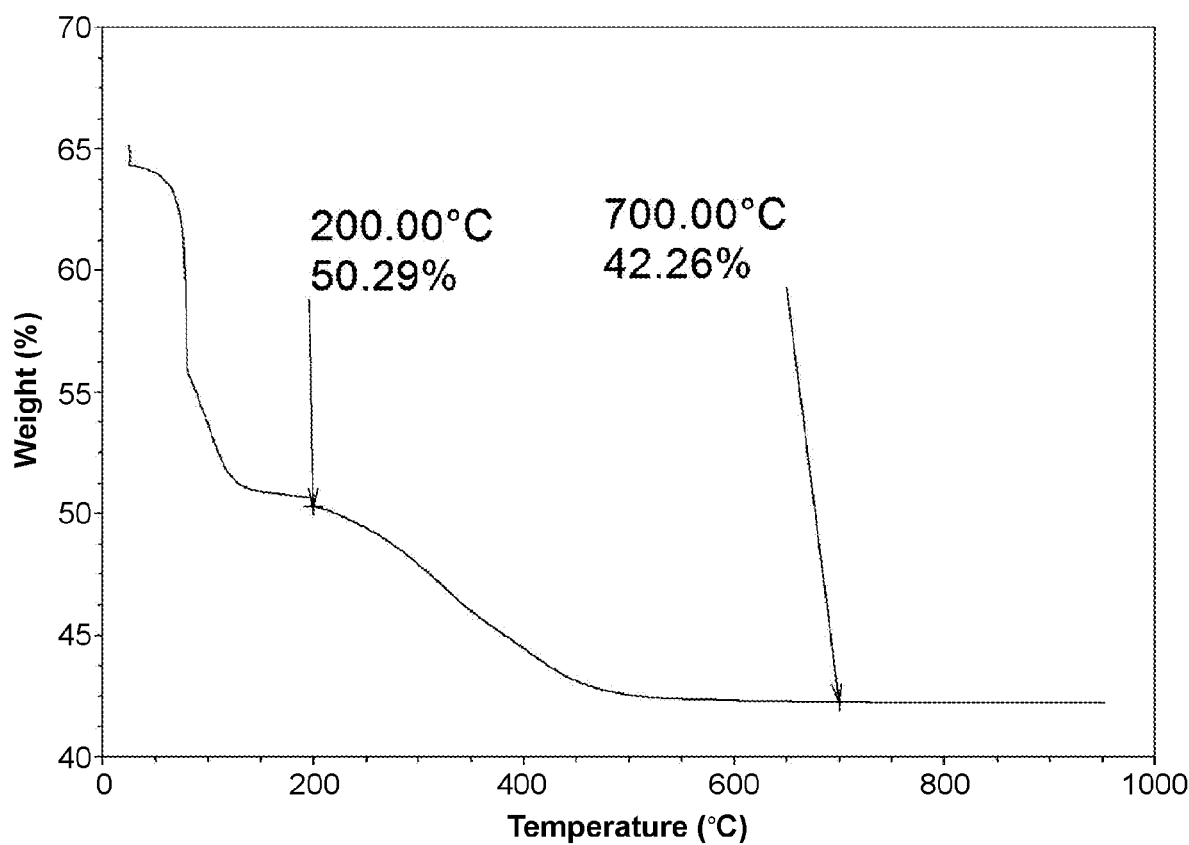

FIG. 10: TGA result of the capped nanocrystals of EXAMPLE 4 dispersed in PGEMA by themselves with 50% by weight.

Figure 11A:
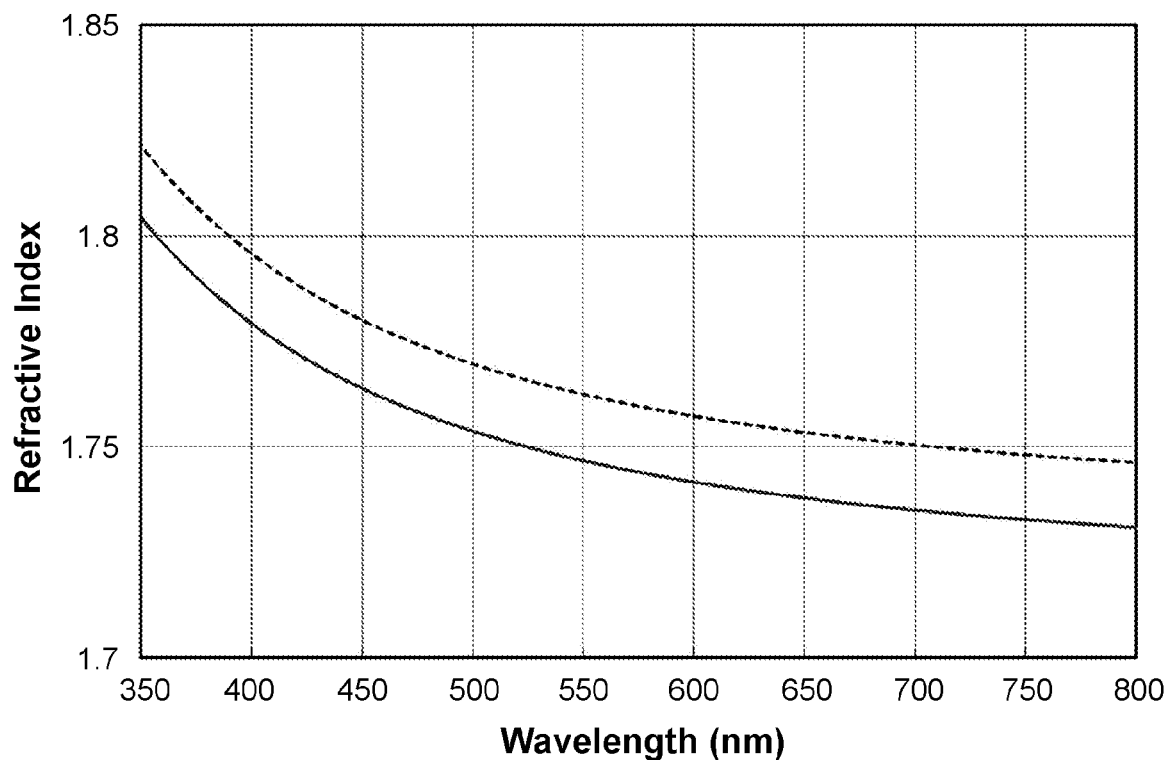

FIG. 11A: Refractive index as a function of wavelength of spin coated films produced with the formulation described in EXAMPLE 4, as made film (solid line) and after 200 C 60 minutes thermal treatment (dotted line).

Figure 11B:
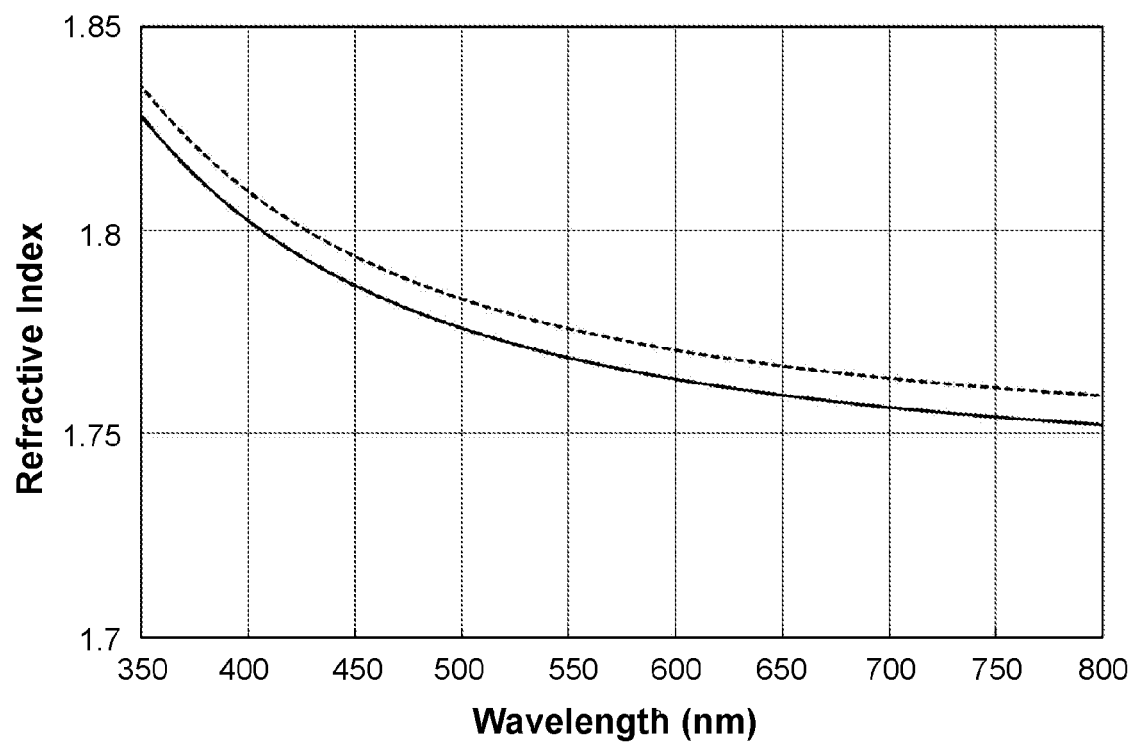

FIG. 11B: Refractive index as a function of wavelength of spin coated films produced with a variation of the formulation described in EXAMPLE 4, as made film (solid line) and after 200 C 60 minutes thermal treatment (dotted line).

Figure 12A:
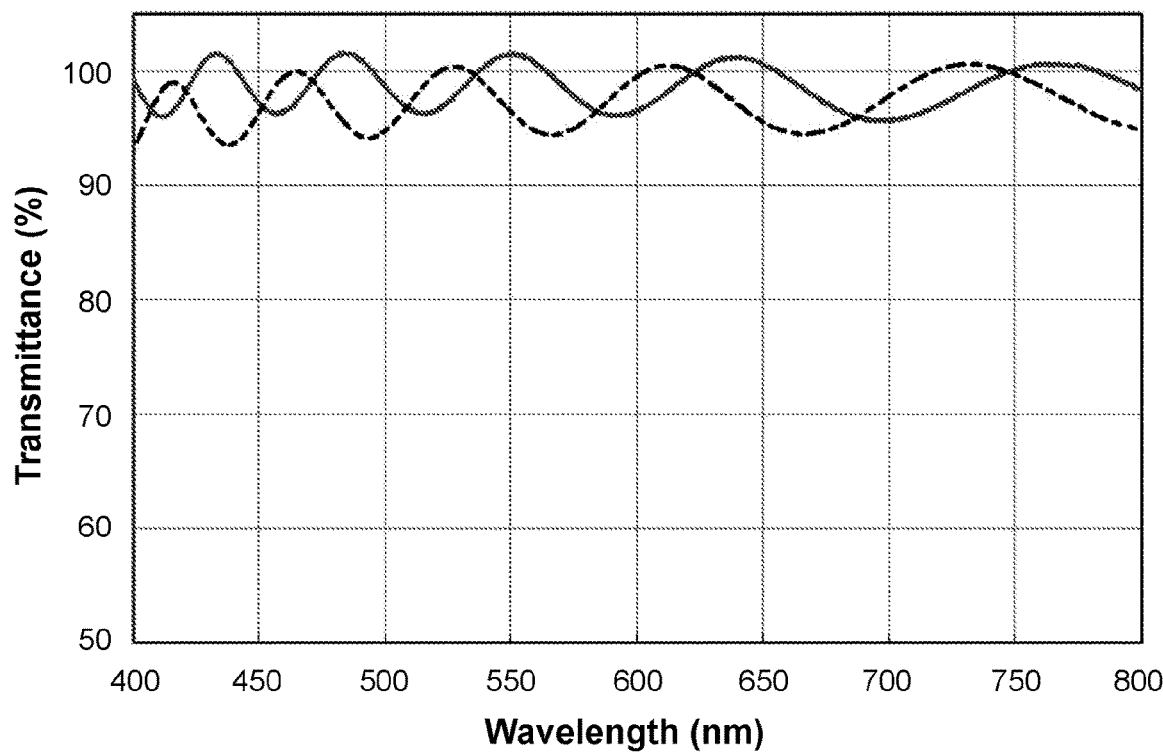

FIG. 12A: Optical transmittance of spin coated films produced with the formulation described in EXAMPLE 4, as made film (solid line) and after 200 C 60 minutes thermal treatment (dotted line).

Figure 12B:
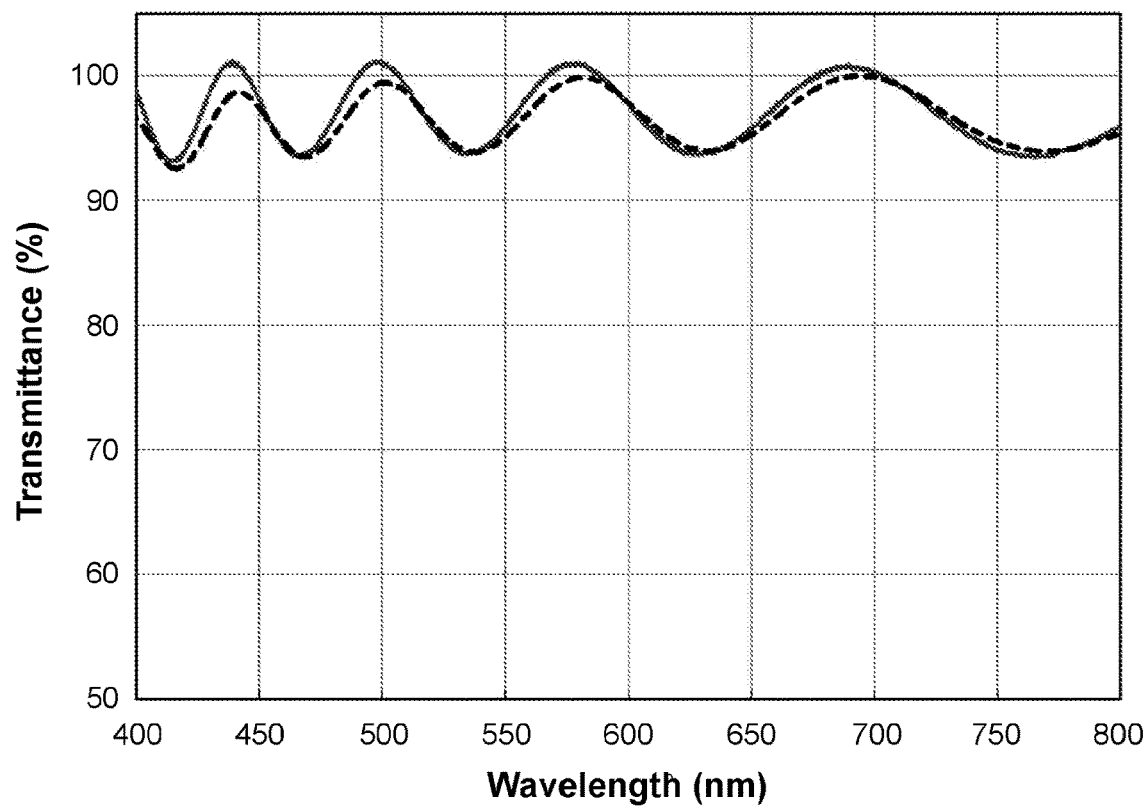

FIG. 12B: Optical transmittance of spin coated films produced with a variation of the formulation described in EXAMPLE 4, as made film (solid line) and after 200 C 60 minutes thermal treatment (dotted line).

Figure 13A:
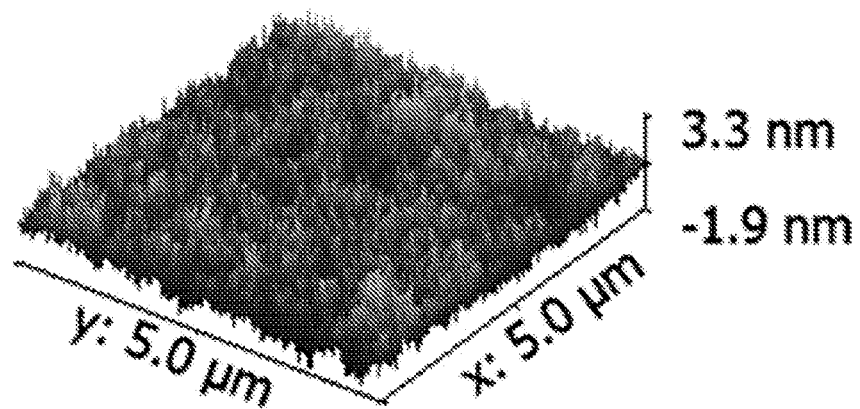

FIG. 13A: AFM image of as-made spin coated film produced with the formulation described in EXAMPLE 4, with about 1 micrometer thickness.

Figure 13B:
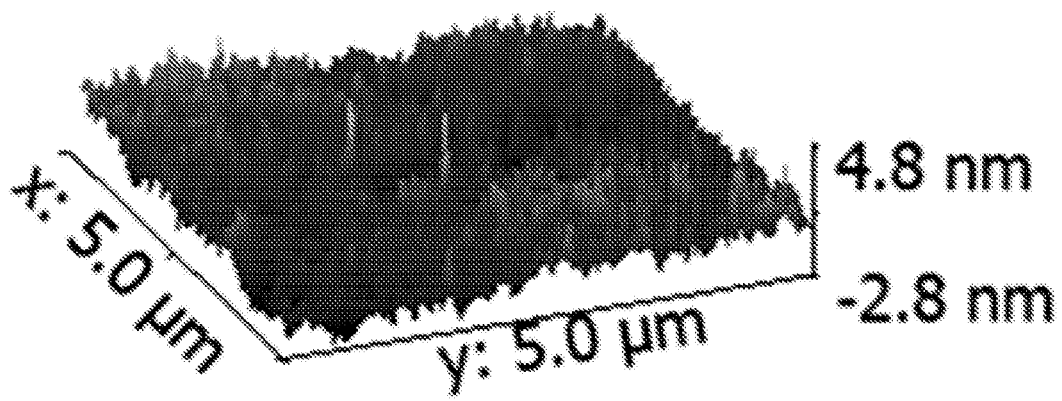

FIG. 13B: AFM image of spin coated film produced with the formulation described in EXAMPLE 4 after a thermal treatment of 250° C. for 5 minutes.

Figure 14A:
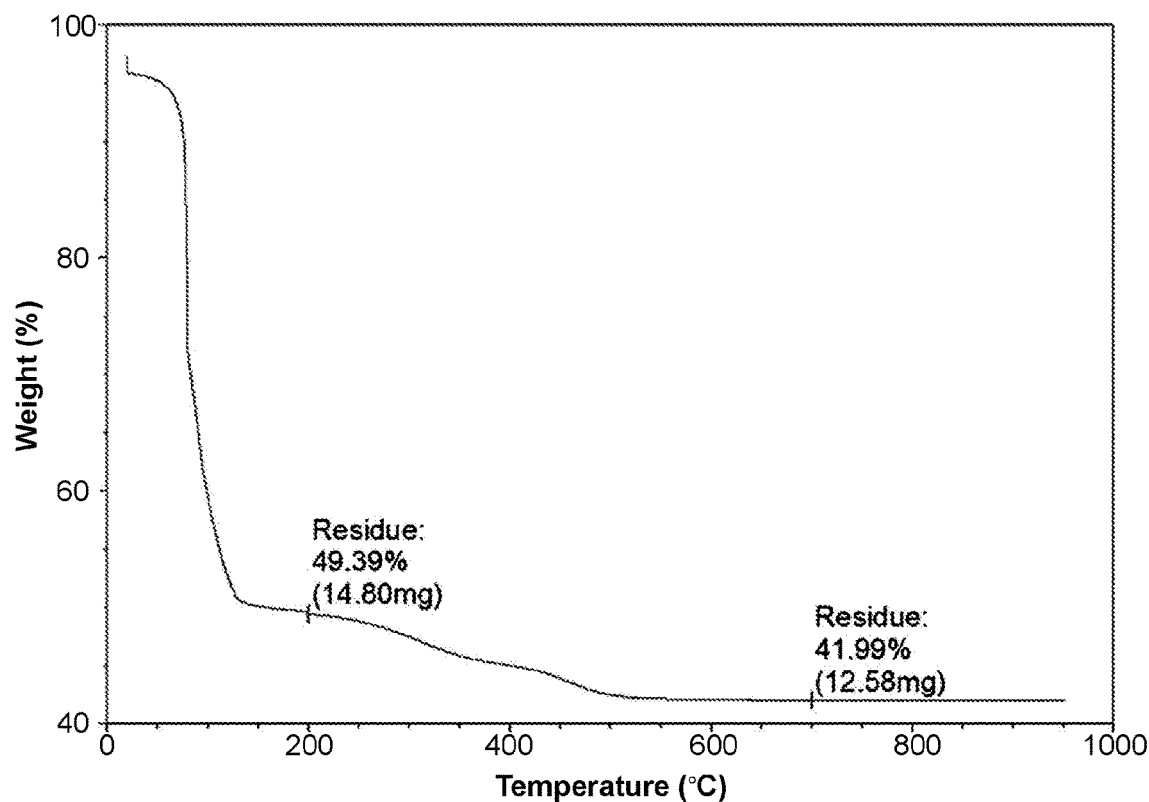

FIG. 14A: TGA result of the capped nanocrystals of EXAMPLE 5 dispersed in PGEMA by themselves with 50% by weight.

Figure 14B:
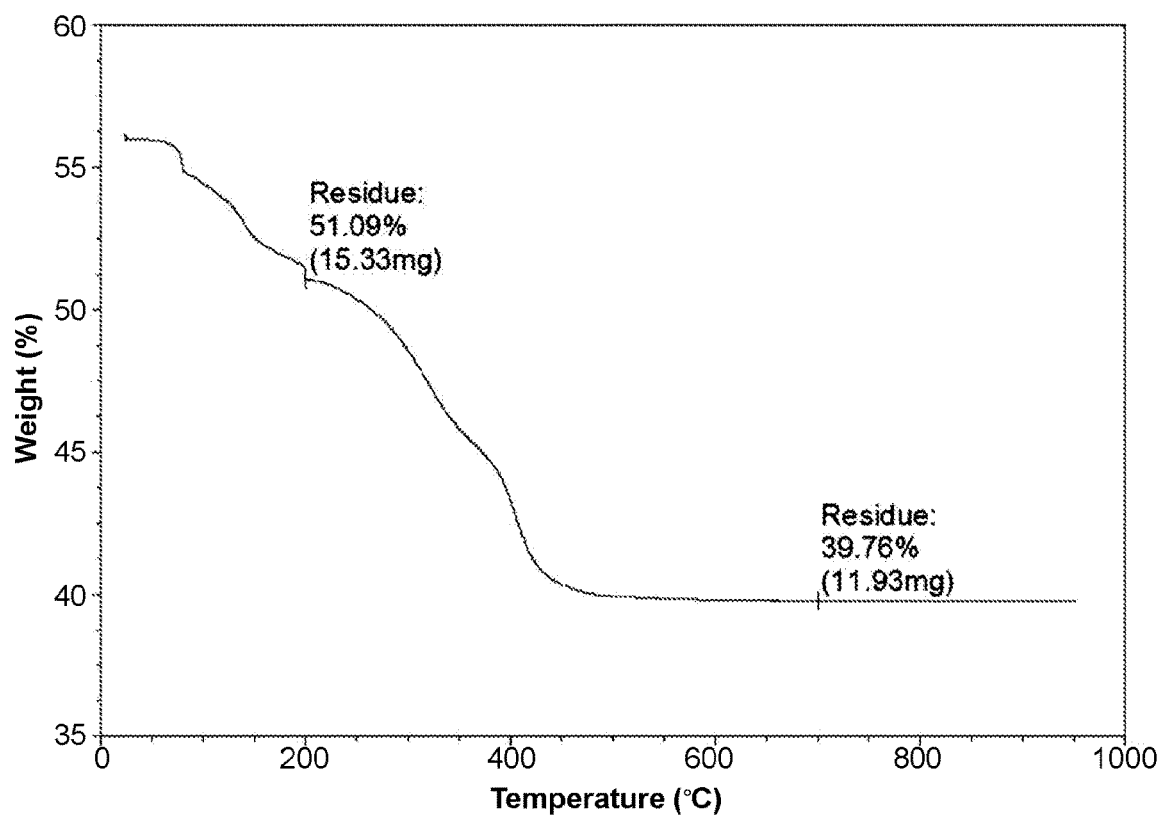

FIG. 14B: TGA result of the formulation of EXAMPLE 5 with 50% of capped nanocrystals by weight.

Figure 15:
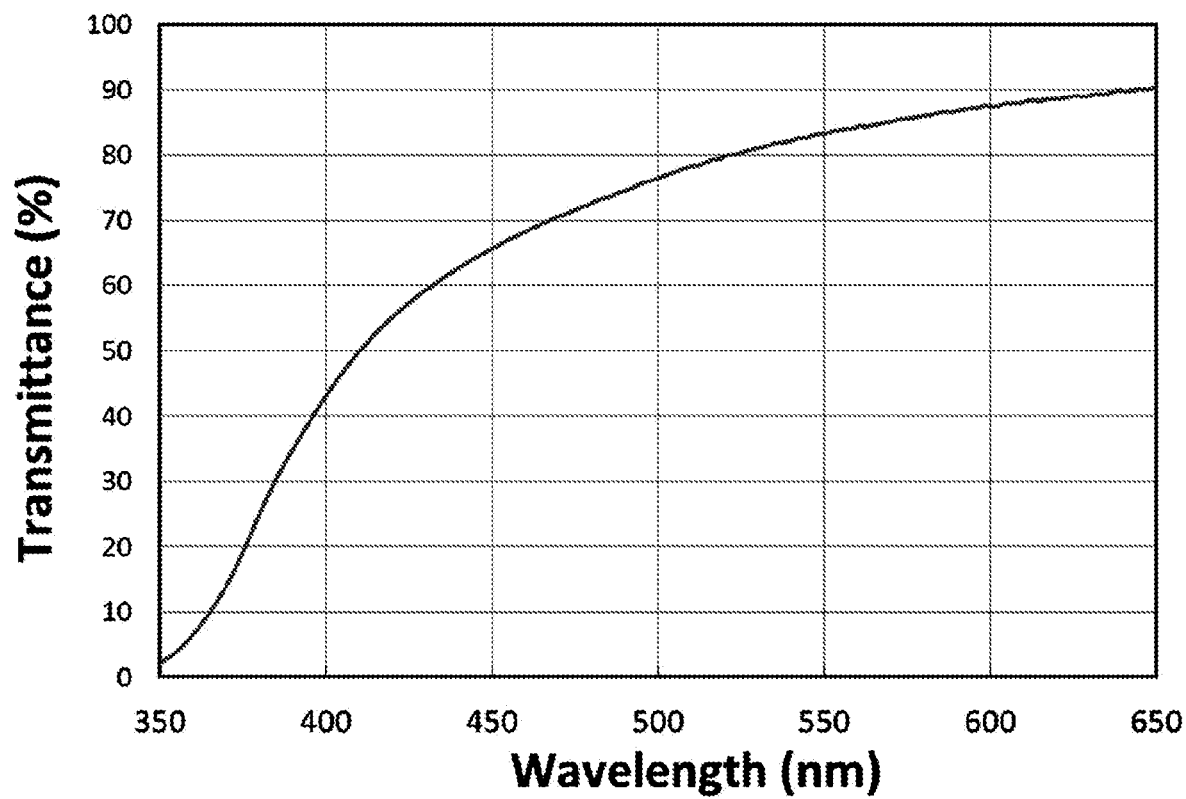

FIG. 15: Optical transmittance of the formulation of EXAMPLE 5 with 50% of capped nanocrystals by weight.

Figure 16:
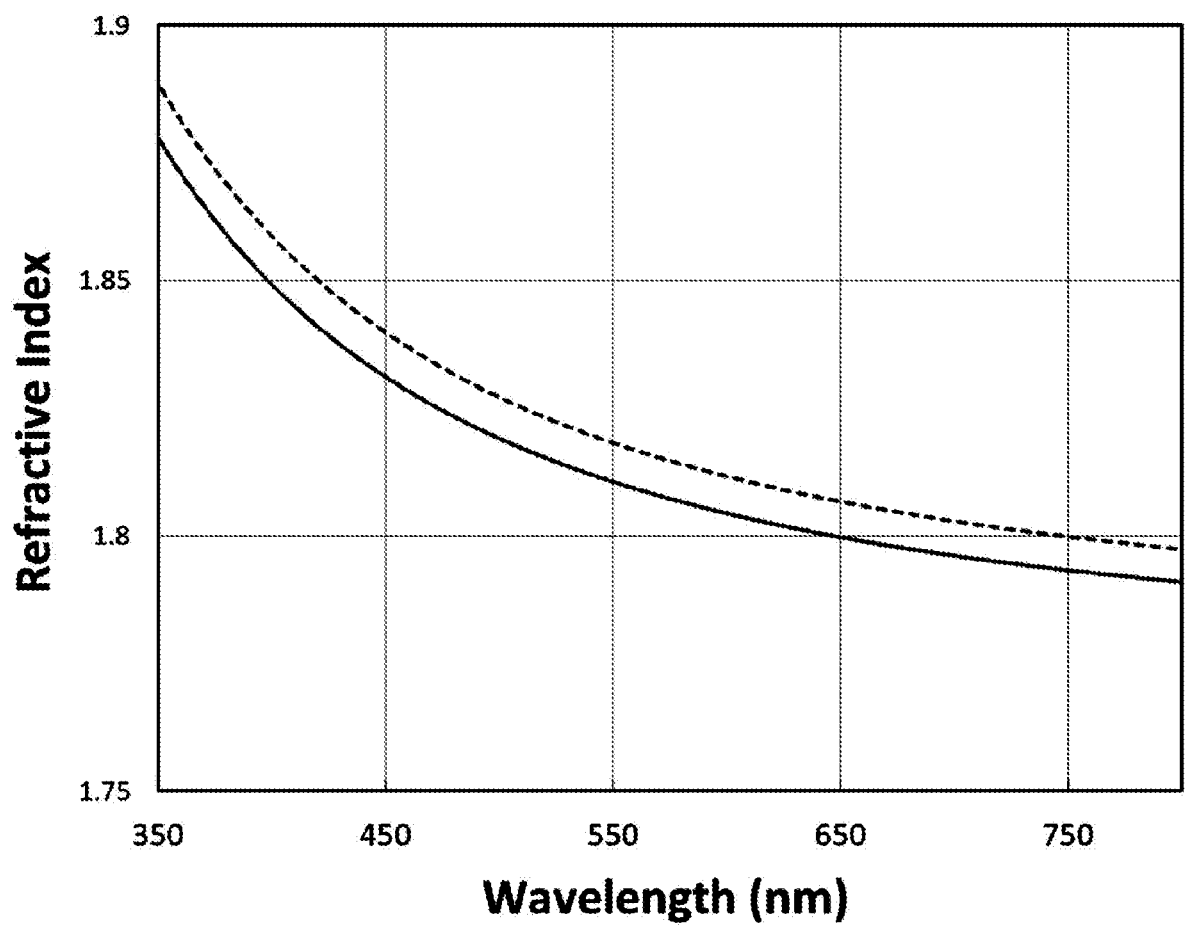

FIG. 16: Refractive index as a function of wavelength of spin coated films produced with the formulation described in EXAMPLE 5, as made film (solid line) and after 200 C 60 minutes thermal treatment (dotted line).

Figure 17:
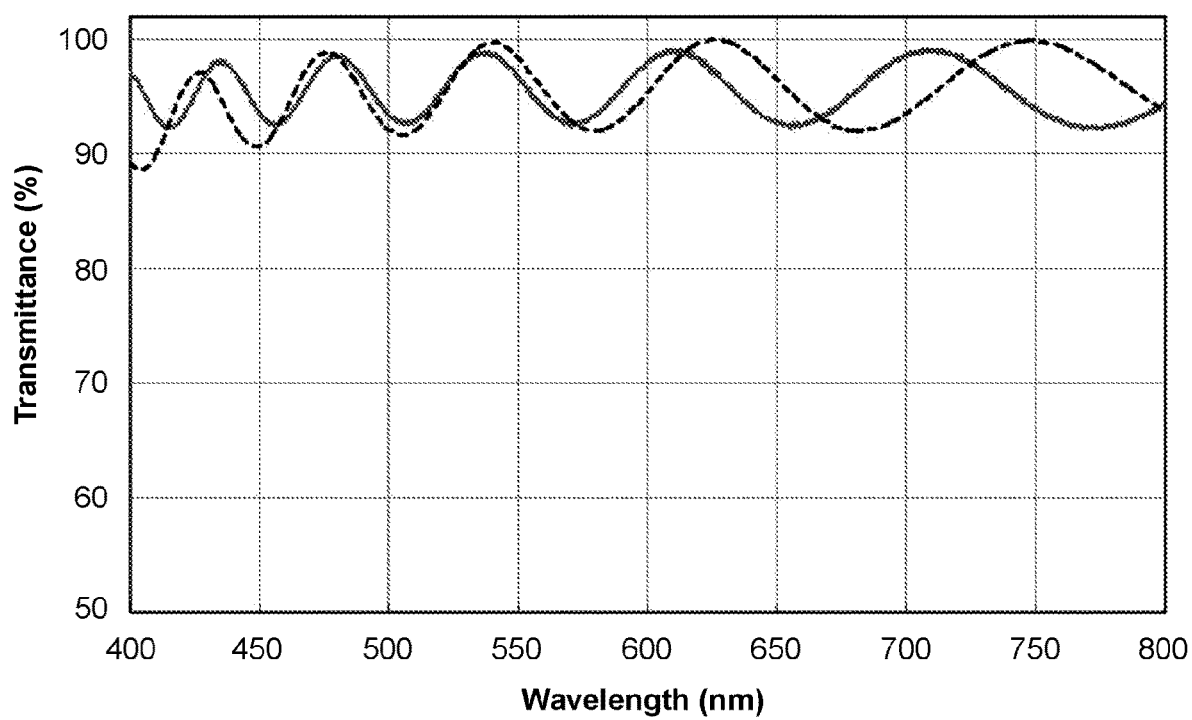

FIG. 17: Optical transmittance of spin coated films produced with the formulation described in EXAMPLE 5, as made film (solid line) and after 200 C 60 minutes thermal treatment (dotted line).

Figure 18:
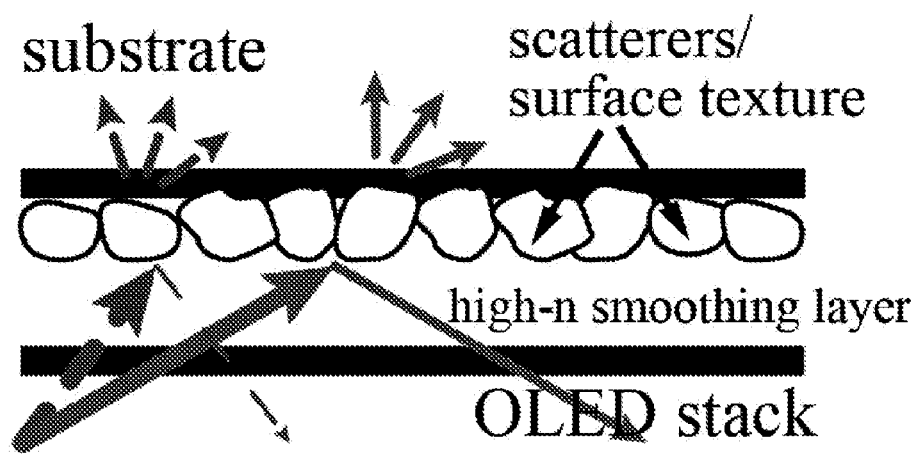

FIG. 18: An internal light extraction structure in an OLED device comprises a high refractive index smoothing layer.

Table 1: Exemplary experimental "spin curve" of film thickness and standard deviation produced with the formulation described in EXAMPLE 3 by the different spin speed and different solid content.

DESCRIPTION

The present disclosure provides the following additional embodiments.

The present disclosure provides a composition containing a dispersion of at least partially capped metal oxide nanocrystals and a solvent, wherein the at least partially capped metal oxide nanocrystals are produced in the presence of water.

The present disclosure provides a composition containing a dispersion of at least partially capped metal oxide nanocrystals and a solvent, wherein the at least partially capped metal oxide nanocrystals are produced in the presence of water, and the metal oxide nanocrystals are zirconium oxide, titanium oxide, hafnium oxide, zinc oxide or a mixture of at least two of said oxides.

The present disclosure provides a composition containing a dispersion of at least partially capped metal oxide nanocrystals and a solvent, wherein the at least partially capped metal oxide nanocrystals are produced in the presence of water and the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyltrimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid.

The present disclosure provides a composition containing a dispersion of at least partially capped metal oxide nanocrystals and a solvent, wherein the at least partially capped metal oxide nanocrystals are produced in the presence of water, and the metal oxide nanocrystals are zirconium oxide, titanium oxide, hafnium oxide, zinc oxide or a mixture of at least two of said oxides, and the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy) propyltrimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid.

The present disclosure provides a composition containing a dispersion of at least partially capped metal oxide nanocrystals and a solvent, wherein the at least partially capped metal oxide nanocrystals are produced in the presence of water, and the at least partially capped metal oxide nanocrystals are present in the composition in an amount of less than 10% by weight of the composition, or 10%-20% by weight of the composition, or 20%-30% by weight of the composition, or 30%-40% by weight of the composition, or 40%-50% by weight of the composition, or 50%-60% by weight of the composition, or 60%-70% by weight of the composition, or 70%-80% by weight of the composition, or 80%-90% by weight of the composition, or 90%-95% by weight of the composition.

The present disclosure provides a composition containing a dispersion of at least partially capped metal oxide nanocrystals and a solvent, wherein the at least partially capped metal oxide nanocrystals are produced in the presence of water, and the metal oxide nanocrystals are zirconium oxide, titanium oxide, hafnium oxide, zinc oxide or a mixture of at least two of said oxides, and the at least partially capped metal oxide nanocrystals are present in the composition in an amount of less than 10% by weight of the composition, or 10%-20% by weight of the composition, or 20%-30% by weight of the composition, or 30%-40% by weight of the composition, or 40%-50% by weight of the composition, or 50%-60% by weight of the composition, or 60%-70% by weight of the composition, or 70%-80% by weight of the composition, or 80%-90% by weight of the composition, or 90%-95% by weight of the composition.

The present disclosure provides a composition containing a dispersion of at least partially capped metal oxide nanocrystals and a solvent, wherein the at least partially capped metal oxide nanocrystals are produced in the presence of water and the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyltrimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the at least partially capped metal oxide nanocrystals are present in the composition in an amount of less than 10% by weight of the composition, or 10%-20% by weight of the composition, or 20%-30% by weight of the composition, or 30%-40% by weight of the composition, or 40%-50% by weight of the composition, or 50%-60% by weight of the composition, or 60%-70% by weight of the composition, or 70%-80% by weight of the composition, or 80%-90% by weight of the composition, or 90%-95% by weight of the composition.

The present disclosure provides a composition containing a dispersion of at least partially capped metal oxide nanocrystals and a solvent, wherein the at least partially capped metal oxide nanocrystals are produced in the presence of water and the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyltrimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, and wherein the at least partially capped metal oxide nanocrystals are present in the composition in an amount of less than 10% by weight of the composition, or 10%-20% by weight of the composition, or 20%-30% by weight of the composition, or 30%-40% by weight of the composition, or 40%-50% by weight of the composition, or 50%-60% by weight of the composition, or 60%-70% by weight of the composition, or 70%-80% by weight of the composition, or 80%-90% by weight of the composition, or 90%-95% by weight of the composition.

The present disclosure provides a composition containing a dispersion of at least partially capped metal oxide nanocrystals and a solvent, wherein the at least partially capped metal oxide nanocrystals are produced in the presence of water, and wherein the solvent may include alcohols, glycols, methyl acetates, ethyl acetates, esters, ketones, glycol ethers, glycol esters, such as propylene glycol monomethyl ether acetate (PGMEA), propylene glycol monomethyl ether (PGME), ethylene glycol monobutyl ether acetate, diethylene glycol monobutyl ether acetate, diethylene glycol butyl ether, diethylene glycol monoethyl ether acetate, dipropylene glycol methyl ether acetate, butoxy ethanol, butoxy propanol, ethoxy ethyl acetate, butoxy ethyl acetate, 2-(isopentyloxy)ethanol, 2-(hexyloxy)ethanol, diethylene glycol, diethylene glycol monomethyl ether, diethylene glycol monoethyl ether, triethylene glycol, triethylene glycol monomethyl ether, dipropylene glycol, dipropylene glycol monomethyl ether, and dipropylene glycol monoethyl ether, ethyl acetate, THF, acetone, any combination thereof.

The present disclosure provides a composition containing a dispersion of at least partially capped metal oxide nanocrystals and a solvent, wherein the at least partially capped metal oxide nanocrystals are produced in the presence of water, and the metal oxide nanocrystals are zirconium oxide, titanium oxide, hafnium oxide, zinc oxide or a mixture of at least two of said oxides, and wherein the solvent may include alcohols, glycols, methyl acetates, ethyl acetates, esters, ketones, glycol ethers, glycol esters, such as propylene glycol monomethyl ether acetate (PGMEA), propylene glycol monomethyl ether (PGME), ethylene glycol monobutyl ether acetate, diethylene glycol monobutyl ether acetate, diethylene glycol butyl ether, diethylene glycol monoethyl ether acetate, dipropylene glycol methyl ether acetate, butoxy ethanol, butoxy propanol, ethoxy ethyl acetate, butoxy ethyl acetate, 2-(isopentyloxy)ethanol, 2-(hexyloxy)ethanol, diethylene glycol, diethylene glycol monomethyl ether, diethylene glycol monoethyl ether, triethylene glycol, triethylene glycol monomethyl ether, dipropylene glycol, dipropylene glycol monomethyl ether, and dipropylene glycol monoethyl ether, ethyl acetate, THF, acetone, any combination thereof.

The present disclosure provides a composition containing a dispersion of at least partially capped metal oxide nanocrystals and a solvent, wherein the at least partially capped metal oxide nanocrystals are produced in the presence of water and the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyltrimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, and wherein the solvent may include alcohols, glycols, methyl acetates, ethyl acetates, esters, ketones, glycol ethers, glycol esters, such as propylene glycol monomethyl ether acetate (PGMEA), propylene glycol monomethyl ether (PGME), ethylene glycol monobutyl ether acetate, diethylene glycol monobutyl ether acetate, diethylene glycol butyl ether, diethylene glycol monoethyl ether acetate, dipropylene glycol methyl ether acetate, butoxy ethanol, butoxy propanol, ethoxy ethyl acetate, butoxy ethyl acetate, 2-(isopentyloxy)ethanol, 2-(hexyloxy)ethanol, diethylene glycol, diethylene glycol monomethyl ether, diethylene glycol monoethyl ether, triethylene glycol, triethylene glycol monomethyl ether, dipropylene glycol, dipropylene glycol monomethyl ether, and dipropylene glycol monoethyl ether, ethyl acetate, THF, acetone, any combination thereof.

The present disclosure provides a composition containing a dispersion of at least partially capped metal oxide nanocrystals and a solvent, wherein the at least partially capped metal oxide nanocrystals are produced in the presence of water, and the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyltrimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, and wherein the solvent may include alcohols, glycols, methyl acetates, ethyl acetates, esters, ketones, glycol ethers, glycol esters, such as propylene glycol monomethyl ether acetate (PGMEA), propylene glycol monomethyl ether (PGME), ethylene glycol monobutyl ether acetate, diethylene glycol monobutyl ether acetate, diethylene glycol butyl ether, diethylene glycol monoethyl ether acetate, dipropylene glycol methyl ether acetate, butoxy ethanol, butoxy propanol, ethoxy ethyl acetate, butoxy ethyl acetate, 2-(isopentyloxy)ethanol, 2-(hexyloxy)ethanol, diethylene glycol, diethylene glycol monomethyl ether, diethylene glycol monoethyl ether, triethylene glycol, triethylene glycol monomethyl ether, dipropylene glycol, dipropylene glycol monomethyl ether, and dipropylene glycol monoethyl ether, ethyl acetate, THF, acetone, any combination thereof.

The present disclosure provides a composition containing a dispersion of at least partially capped metal oxide nanocrystals and a solvent, wherein the at least partially capped metal oxide nanocrystals are produced in the presence of water, and the at least partially capped metal oxide nanocrystals are present in the composition in an amount of less than 10% by weight of the composition, or 10%-20% by weight of the composition, or 20%-30% by weight of the composition, or 30%-40% by weight of the composition, or 40%-50% by weight of the composition, or 50%-60% by weight of the composition, or 60%-70% by weight of the composition, or 70%-80% by weight of the composition, or 80%-90% by weight of the composition, or 90%-95% by weight of the composition, and wherein the solvent may include alcohols, glycols, methyl acetates, ethyl acetates, esters, ketones, glycol ethers, glycol esters, such as propylene glycol monomethyl ether acetate (PGMEA), propylene glycol monomethyl ether (PGME), ethylene glycol monobutyl ether acetate, diethylene glycol monobutyl ether acetate, diethylene glycol butyl ether, diethylene glycol monoethyl ether acetate, dipropylene glycol methyl ether acetate, butoxy ethanol, butoxy propanol, ethoxy ethyl acetate, butoxy ethyl acetate, 2-(isopentyloxy)ethanol, 2-(hexyloxy)ethanol, diethylene glycol, diethylene glycol monomethyl ether, diethylene glycol monoethyl ether, triethylene glycol, triethylene glycol monomethyl ether, dipropylene glycol, dipropylene glycol monomethyl ether, and dipropylene glycol monoethyl ether, ethyl acetate, THF, acetone, any combination thereof.

The present disclosure provides a composition containing a dispersion of at least partially capped metal oxide nanocrystals and a solvent, wherein the at least partially capped metal oxide nanocrystals are produced in the presence of water, and the metal oxide nanocrystals are zirconium oxide, titanium oxide, hafnium oxide, zinc oxide or a mixture of at least two of said oxides, and the at least partially capped metal oxide nanocrystals are present in the composition in an amount of less than 10% by weight of the composition, or 10%-20% by weight of the composition, or 20%-30% by weight of the composition, or 30%-40% by weight of the composition, or 40%-50% by weight of the composition, or 50%-60% by weight of the composition, or 60%-70% by weight of the composition, or 70%-80% by weight of the composition, or 80%-90% by weight of the composition, or 90%-95% by weight of the composition, and wherein the solvent may include alcohols, glycols, methyl acetates, ethyl acetates, esters, ketones, glycol ethers, glycol esters, such as propylene glycol monomethyl ether acetate (PGMEA), propylene glycol monomethyl ether (PGME), ethylene glycol monobutyl ether acetate, diethylene glycol monobutyl ether acetate, diethylene glycol butyl ether, diethylene glycol monoethyl ether acetate, dipropylene glycol methyl ether acetate, butoxy ethanol, butoxy propanol, ethoxy ethyl acetate, butoxy ethyl acetate, 2-(isopentyloxy)ethanol, 2-(hexyloxy)ethanol, diethylene glycol, diethylene glycol monomethyl ether, diethylene glycol monoethyl ether, triethylene glycol, triethylene glycol monomethyl ether, dipropylene glycol, dipropylene glycol monomethyl ether, and dipropylene glycol monoethyl ether, ethyl acetate, THF, acetone, any combination thereof.

The present disclosure provides a composition containing a dispersion of at least partially capped metal oxide nanocrystals and a solvent, wherein the at least partially capped metal oxide nanocrystals are produced in the presence of water and the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyltrimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the at least partially capped metal oxide nanocrystals are present in the composition in an amount of less than 10% by weight of the composition, or 10%-20% by weight of the composition, or 20%-30% by weight of the composition, or 30%-40% by weight of the composition, or 40%-50% by weight of the composition, or 50%-60% by weight of the composition, or 60%-70% by weight of the composition, or 70%-80% by weight of the composition, or 80%-90% by weight of the composition, or 90%-95% by weight of the composition, and wherein the solvent may include alcohols, glycols, methyl acetates, ethyl acetates, esters, ketones, glycol ethers, glycol esters, such as propylene glycol monomethyl ether acetate (PGMEA), propylene glycol monomethyl ether (PGME), ethylene glycol monobutyl ether acetate, diethylene glycol monobutyl ether acetate, diethylene glycol butyl ether, diethylene glycol monoethyl ether acetate, dipropylene glycol methyl ether acetate, butoxy ethanol, butoxy propanol, ethoxy ethyl acetate, butoxy ethyl acetate, 2-(isopentyloxy)ethanol, 2-(hexyloxy)ethanol, diethylene glycol, diethylene glycol monomethyl ether, diethylene glycol monoethyl ether, triethylene glycol, triethylene glycol monomethyl ether, dipropylene glycol, dipropylene glycol monomethyl ether, and dipropylene glycol monoethyl ether, ethyl acetate, THF, acetone, any combination thereof.

The present disclosure provides a composition containing a dispersion of at least partially capped metal oxide nanocrystals and a solvent, wherein the at least partially capped metal oxide nanocrystals are produced in the presence of water, and the metal oxide nanocrystals are zirconium oxide, titanium oxide, hafnium oxide, zinc oxide or a mixture of at least two of said oxides, and the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyltrimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, and wherein the at least partially capped metal oxide nanocrystals are present in the composition in an amount of less than 10% by weight of the composition, or 10%-20% by weight of the composition, or 20%-30% by weight of the composition, or 30%-40% by weight of the composition, or 40%-50% by weight of the composition, or 50%-60% by weight of the composition, or 60%-70% by weight of the composition, or 70%-80% by weight of the composition, or 80%-90% by weight of the composition, or 90%-95% by weight of the composition, and wherein the solvent may include alcohols, glycols, methyl acetates, ethyl acetates, esters, ketones, glycol ethers, glycol esters, such as propylene glycol monomethyl ether acetate (PGMEA), propylene glycol monomethyl ether (PGME), ethylene glycol monobutyl ether acetate, diethylene glycol monobutyl ether acetate, diethylene glycol butyl ether, diethylene glycol monoethyl ether acetate, dipropylene glycol methyl ether acetate, butoxy ethanol, butoxy propanol, ethoxy ethyl acetate, butoxy ethyl acetate, 2-(isopentyloxy)ethanol, 2-(hexyloxy)ethanol, diethylene glycol, diethylene glycol monomethyl ether, diethylene glycol monoethyl ether, triethylene glycol, triethylene glycol monomethyl ether, dipropylene glycol, dipropylene glycol monomethyl ether, and dipropylene glycol monoethyl ether, ethyl acetate, THF, acetone, any combination thereof.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy) propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy) propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the dispersion does not contain benzyl methacrylate (BMA) or trimethylolpropane triacrylate (TMPTA).

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the dispersion does not contain benzyl methacrylate (BMA) or trimethylolpropane triacrylate (TMPTA).

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides, wherein the dispersion does not contain benzyl methacrylate (BMA) or trimethylolpropane triacrylate (TMPTA).

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides, wherein the dispersion does not contain benzyl methacrylate (BMA) or trimethylolpropane triacrylate (TMPTA).

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the dispersion does not contain benzyl methacrylate (BMA) or trimethylolpropane triacrylate (TMPTA).

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the dispersion does not contain benzyl methacrylate (BMA) or trimethylolpropane triacrylate (TMPTA).

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy) propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the dispersion does not contain benzyl methacrylate (BMA) or trimethylolpropane triacrylate (TMPTA).

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy) propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the dispersion does not contain benzyl methacrylate (BMA) or trimethylolpropane triacrylate (TMPTA).

The at least partially capped metal oxide nanocrystals are present in formulations of the present disclosure in an amount of less than 10% by weight of the acrylic and at least partially capped nanocrystals, or in an amount of 10%-20% by weight of the acrylic and at least partially capped nanocrystals, or 20%-30% by weight of the acrylic and at least partially capped nanocrystals, or 30%-40% by weight of the acrylic and at least partially capped nanocrystals, or 40%-50% by weight of the acrylic and at least partially capped nanocrystals, or 50%-60% by weight of the acrylic and at least partially capped nanocrystals, or 60%-70% by weight of the acrylic and at least partially capped nanocrystals, or 70%-80% by weight of the acrylic and at least partially capped nanocrystals, or 80%-90% by weight of the acrylic and at least partially capped nanocrystals, or 90%-93% by weight of the acrylic and at least partially capped nanocrystals.

Formulations of the present disclosure alternatively have an optical transmittance at 650 nm of the formulation in 50% PGMEA by weight of the total formulation as solvent, when measured in a cuvette with 1 cm path length is 99%-95%, or 95%-90%, or 90%-85%, or 85%-80%, 80%-75%, or 75%-70%, or 70%-65%, or 65%-60%, or 60%-55%, or 55%-50%, or 50%-45%, or 45%-40%, or 40%-35%, or 35%-30%, or 30%-25%, or 25%-20%, or 20%-15%, or 15%-10%.

Formulations of the present disclosure alternatively have an optical transmittance at 450 nm of the formulation in 50% PGMEA by weight of the total formulation as solvent, when measured in a cuvette with 1 cm path length is 99%-95%, or 95%-90%, or 90%-85%, or 85%-80%, 80%-75%, or 75%-70%, or 70%-65%, or 65%-60%, or 60%-55%, or 55%-50%, or 50%-45%, or 45%-40%, or 40%-35%, or 35%-30%, or 30%-25%, or 25%-20%, or 20%-15%, or 15%-10%.

Formulations of the present disclosure may have a viscosity of less than 5 cPs, or 5 cPs-50 cPs, or 50 cPs-200 cPs, or 200 cPs-400 cPs, or 400 cPs-650 cPs, or 650 cPs-1000 cPs, when measured at 25° C. with a Brookfield RVDV II+ cone and plate viscometer.

Formulations of the present disclosure include the at least partially capped metal oxide nanocrystals in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy) propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy) propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the dispersion does not contain benzyl methacrylate (BMA) or trimethylolpropane triacrylate (TMPTA), wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the dispersion does not contain benzyl methacrylate (BMA) or trimethylolpropane triacrylate (TMPTA), wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides, wherein the dispersion does not contain benzyl methacrylate (BMA) or trimethylolpropane triacrylate (TMPTA), wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides, wherein the dispersion does not contain benzyl methacrylate (BMA) or trimethylolpropane triacrylate (TMPTA), wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the dispersion does not contain benzyl methacrylate (BMA) or trimethylolpropane triacrylate (TMPTA), wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the dispersion does not contain benzyl methacrylate (BMA) or trimethylolpropane triacrylate (TMPTA), wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy) propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the dispersion does not contain benzyl methacrylate (BMA) or trimethylolpropane triacrylate (TMPTA), wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy) propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the dispersion does not contain benzyl methacrylate (BMA) or trimethylolpropane triacrylate (TMPTA), wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation as described herein.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy) propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the dispersion does not contain benzyl methacrylate (BMA) or trimethylolpropane triacrylate (TMPTA).

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the dispersion does not contain benzyl methacrylate (BMA) or trimethylolpropane triacrylate (TMPTA).

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides, wherein the dispersion does not contain benzyl methacrylate (BMA) or trimethylolpropane triacrylate (TMPTA).

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides, wherein the dispersion does not contain benzyl methacrylate (BMA) or trimethylolpropane triacrylate (TMPTA).

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the dispersion does not contain benzyl methacrylate (BMA) or trimethylolpropane triacrylate (TMPTA).

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy) propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the dispersion does not contain benzyl methacrylate (BMA) or trimethylolpropane triacrylate (TMPTA).

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the dispersion does not contain benzyl methacrylate (BMA) or trimethylolpropane triacrylate (TMPTA).

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the dispersion does not contain benzyl methacrylate (BMA) or trimethylolpropane triacrylate (TMPTA).

The present disclosure provides a scattering formulation containing a binder formulation and further containing scattering particles wherein the binder formulation contains a formulation as described herein wherein the at least partially capped metal oxide nanocrystals are present in formulations of the present disclosure in an amount of less than 10% by weight of the acrylic and at least partially capped nanocrystals, or in an amount of 10%-20% by weight of the acrylic and at least partially capped nanocrystals, or 20%-30% by weight of the acrylic and at least partially capped nanocrystals, or 30%-40% by weight of the acrylic and at least partially capped nanocrystals, or 40%-50% by weight of the acrylic and at least partially capped nanocrystals, or 50%-60% by weight of the acrylic and at least partially capped nanocrystals, or 60%-70% by weight of the acrylic and at least partially capped nanocrystals, or 70%-80% by weight of the acrylic and at least partially capped nanocrystals, or 80%-90% by weight of the acrylic and at least partially capped nanocrystals, or 90%-93% by weight of the acrylic and at least partially capped nanocrystals.

The present disclosure provides a scattering formulation containing a binder formulation and further containing scattering particles wherein the binder formulation contains a formulation as described herein wherein the formulation alternatively has an optical transmittance at 650 nm of the formulation in 50% PGMEA by weight of the total formulation as solvent, when measured in a cuvette with 1 cm path length is 99%-95%, or 95%-90%, or 90%-85%, or 85%-80%, 80%-75%, or 75%-70%, or 70%-65%, or 65%-60%, or 60%-55%, or 55%-50%, or 50%-45%, or 45%-40%, or 40%-35%, or 35%-30%, or 30%-25%, or 25%-20%, or 20%-15%, or 15%-10%.

The present disclosure provides a scattering formulation containing a binder formulation and further containing scattering particles wherein the binder formulation contains a formulation as described herein wherein the formulation alternatively has an optical transmittance at 450 nm of the formulation in 50% PGMEA by weight of the total formulation as solvent, when measured in a cuvette with 1 cm path length is 99%-95%, or 95%-90%, or 90%-85%, or 85%-80%, 80%-75%, or 75%-70%, or 70%-65%, or 65%-60%, or 60%-55%, or 55%-50%, or 50%-45%, or 45%-40%, or 40%-35%, or 35%-30%, or 30%-25%, or 25%-20%, or 20%-15%, or 15%-10%.

The present disclosure provides a scattering formulation containing a binder formulation and further containing scattering particles wherein the binder formulation contains a formulation as described herein wherein the formulation has a viscosity of less than 5 cPs, or 5 cPs-50 cPs, or 50 cPs-200 cPs, or 200 cPs-400 cPs, or 400 cPs-650 cPs, or 650 cPs-1000 cPs, when measured at 25° C. with a Brookfield RVDV II+ cone and plate viscometer.

The present disclosure provides a scattering formulation containing a binder formulation and further containing scattering particles wherein the binder formulation contains a formulation includes the at least partially capped metal oxide nanocrystals in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy) propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy (polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy (polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the dispersion does not contain benzyl methacrylate (BMA) or trimethylolpropane triacrylate (TMPTA), wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides, wherein the dispersion does not contain benzyl methacrylate (BMA) or trimethylolpropane triacrylate (TMPTA), wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides, wherein the dispersion does not contain benzyl methacrylate (BMA) or trimethylolpropane triacrylate (TMPTA), wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the dispersion does not contain benzyl methacrylate (BMA) or trimethylolpropane triacrylate (TMPTA), wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy) propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the dispersion does not contain benzyl methacrylate (BMA) or trimethylolpropane triacrylate (TMPTA), wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy (polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the dispersion does not contain benzyl methacrylate (BMA) or trimethylolpropane triacrylate (TMPTA), wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing bisphenol A glycerolate dimethacrylate, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy (polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the dispersion does not contain benzyl methacrylate (BMA) or trimethylolpropane triacrylate (TMPTA), wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6- hexanediol ethoxylate diacrylate, ethylene glycol phenyl ether acrylate, or any combination thereof, optionally further containing a solvent, a curing agent, an antioxidant, cross-linking agent, a thickener, an adhesion promoter, a wetting agent, a leveling agent, a dispersing agent, a plasticizer, or a flexibilizer.

The present disclosure provides a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, cross-linking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water.

The present disclosure provides a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, cross-linking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides.

The present disclosure provides a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, cross-linking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides.

The present disclosure provides a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, cross-linking agent, a thickener, an adhesion promoter, a wetting agent, a leveling agent, a dispersing agent, a plasticizer, or a flexibilizer, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid.

The present disclosure provides a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, cross-linking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid.

The present disclosure provides a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, cross-linking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy] acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid.

The present disclosure provides a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, cross-linking agent, a thickener, an adhesion promoter, a wetting agent, a leveling agent, a dispersing agent, a plasticizer, or a flexibilizer, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, cross-linking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, cross-linking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, cross-linking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, cross-linking agent, a thickener, an adhesion promoter, a wetting agent, a leveling agent, a dispersing agent, a plasticizer, or a flexibilizer, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, cross-linking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, cross-linking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy] acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid.

The present disclosure provides a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, cross-linking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy] acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, cross-linking agent, a thickener, an adhesion promoter, a wetting agent, a leveling agent, a dispersing agent, a plasticizer, or a flexibilizer, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, cross-linking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, cross-linking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, cross-linking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, cross-linking agent, a thickener, an adhesion promoter, a wetting agent, a leveling agent, a dispersing agent, a plasticizer, or a flexibilizer, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, cross-linking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy] acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy (polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy] acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy (polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation as described herein.

The present disclosure provides a scattering formulation containing a binder formulation and further containing scattering particles wherein the binder formulation contains a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer.

The present disclosure provides a scattering formulation containing a binder formulation and further containing scattering particles wherein the binder formulation contains a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water.

The present disclosure provides a scattering formulation containing a binder formulation and further containing scattering particles wherein the binder formulation contains a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides.

The present disclosure provides a scattering formulation containing a binder formulation and further containing scattering particles wherein the binder formulation contains a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides.

The present disclosure provides a scattering formulation containing a binder formulation and further containing scattering particles wherein the binder formulation contains a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid.

The present disclosure provides a scattering formulation containing a binder formulation and further containing scattering particles wherein the binder formulation contains a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid.

The present disclosure provides a scattering formulation containing a binder formulation and further containing scattering particles wherein the binder formulation contains a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid.

The present disclosure provides a scattering formulation containing a binder formulation and further containing scattering particles wherein the binder formulation contains a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy) propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy) propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation containing a binder formulation and further containing scattering particles wherein the binder formulation contains a formulation containing a dispersion of at least partially capped metal oxide nanocrystals and an acrylic polymer containing a monomer, oligomer, and/or polymer of bisphenol A glycerolate dimethacrylate, biphenyl-2-ol, ethoxylated, esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, benzyl methacrylate (BMA), trimethylolpropane triacrylate (TMPTA), trimethylolpropane ethoxylate (1 EO/OH) methyl ether diacrylate, 1,6-hexanediol diacrylate, tri(ethyleneglycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, or any combination thereof, optionally further containing a solvent, a curing agent, an antioxidant, crosslinking agent, a thickener, an adhesion promoter, a wetting agent, a leveling agent, a dispersing agent, a plasticizer, or a flexibilizer, wherein the at least partially capped metal oxide nanocrystals are at least partially capped in the presence of water, wherein the metal oxide nanocrystals are zirconium oxide, titanium oxide, hafnium oxide, zinc oxide or a mixture of at least two of the oxides, wherein the at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy) propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid, wherein the at least partially capped metal oxide nanocrystals are present in an amount of less than 10% by weight of the acrylic and at least partially capped nanocrystals, or in an amount of 10%-20% by weight of the acrylic and at least partially capped nanocrystals, or in an amount of 20%-30% by weight of the acrylic and at least partially capped nanocrystals, or in an amount of 30%-40% by weight of the acrylic and at least partially capped nanocrystals, or in an amount of 40%-50% by weight of the acrylic and at least partially capped nanocrystals, or in an amount of 50%-60% by weight of the acrylic and at least partially capped nanocrystals, or in an amount of 60%-70% by weight of the acrylic and at least partially capped nanocrystals, or in an amount of 70%-80% by weight of the acrylic and at least partially capped nanocrystals, or in an amount of 80%-90% by weight of the acrylic and at least partially capped nanocrystals, or in an amount of 90%-93% by weight of the acrylic and at least partially capped nanocrystals.

The present disclosure provides a scattering formulation as described herein wherein the average size of the scattering particles is in the range of 50 nm-2 µm, or 50-100 nm, or 100-200 nm, or 200-300 nm, or 300-400 nm, or 400-500 nm, or 500-600 nm, or 600-700 nm, or 700-800 nm, or 800-900 nm or 900 nm to 1 µm, or 1-1.5 µm, or 1.5-2 µm.

The present disclosure provides a scattering formulation as described herein wherein the scattering particles are present in an amount of 0.1-40% by weight of the total weight of the formulation.

The present disclosure provides a scattering formulation as described herein wherein scattering particles have a higher refractive index than the refractive index of the binder formulation.

The present disclosure provides a scattering formulation as described herein wherein scattering particles have a lower refractive index than the refractive index of the binder formulation.

The present disclosure provides a scattering formulation as described herein wherein the scattering particles are selected from a polymer, titanium oxide, silicon dioxide, niobium pentoxide, zirconium oxide, zinc oxide, aluminum oxide, cerium oxide or mixtures of any two of a polymer, titanium oxide, silicon dioxide, niobium pentoxide, zirconium oxide, zinc oxide, aluminum oxide and cerium oxide.

The present disclosure provides a scattering formulation as described herein wherein the scattering formulation is storage stable for at least 1 week, or 2 weeks, or 3 weeks, or 4 weeks, or 3 months, or at least 5 months, or at least 6 months, or at least 7 months, or at least 8 months, or at least 9 months, or at least 10 months, or at least 11 months, or at least 1 year, or at least 2 years or at least 3 years, when the scattering formulation is stored at a temperature in the range of 18-25° C. without deliberate shaking or mixing of the scattering formulation.

The present disclosure provides a scattering formulation as described herein wherein the scattering formulation is storage stable and the weight percentage of scattering particles in a sample from the upper third of a stored sample of the scattering formulation changes by less than 1%, or 1-2%, or 2-3%, or 3-4%, or 4-5%, or 5-7%, or 7-10%, or 10-15%, or 15-20%, or 20-25%, or 25-30%, or 30-35% over the storage time.

A nanocomposite film is described herein containing a cured or partially cured formulation of the present disclosure. A nanocomposite film of the present disclosure may have a refractive index of between 1.6-1.62, or 1.62-1.64, 1.64-1.66, or 1.66-1.68, or 1.68-1.70, or 1.70-1.72, or 1.72-1.74, or 1.76-1.78, or 1.78-1.80, or 1.80-1.82, or 1.82-1.84, or 1.84-1.86, or 1.86-1.88, or 1.88-1.90 when measured at 400 nm. A nanocomposite film of the present disclosure may have a normal transmittance of 99.99%-99%, or 99%-98%, or 98%-97%, or 97%-96%, or 96%-95%, or 95%-90%, or 90%-85%, or 85%-80%, 80%-75%, or 75%-70%, or 70%-65%, or 65%-60%, or 60%-55%, or 55%-50%, or 50%-45%, or 45%-40%, or 40%-35%, or 35%-30%, or 30%-25%, or 25%-20%, or 20%-15%, or 15%-10% for films that are 4.9-5 microns thick, when measured at a wavelength of 450 nm or 650 nm.

The present disclosure provides a nanocomposite film wherein the at least partially capped nanocrystals are capped with methoxy(triethyleneoxy) propyltrimethoxysilane, and 3-(methacryloyloxy)propyl trimethoxysilane, and wherein the film is resistant to chemical treatment, wherein the chemical treatment may involve treatment with an acid, a base, an organic compound or water; wherein the chemical treatment resistance may be determined by visual inspection after submerging the film in the chemical for at least 5 minutes or for at least 10 minutes, or for at least 15 minutes, or for at least 20 minutes, or for at least 30 minutes, or for at least 45 minutes, or for at least 60 minutes, or for at least 90 minutes, or for at least 120 minutes, or for at least 150 minutes, or for at least 180 minutes water rinse and air drying.

The present disclosure provides a nanocomposite film wherein the at least partially capped nanocrystals are capped with methoxy(triethyleneoxy) propyltrimethoxysilane, and 3-(methacryloyloxy)propyl trimethoxysilane, and wherein the film is resistant to chemical treatment, wherein the chemical treatment may involve treatment with an acid, a base, an organic compound or water; wherein the chemical treatment resistance may be determined by weight change after submerging the film in the chemical for at least 5 minutes or for at least 10 minutes, or for at least 15 minutes, or for at least 20 minutes, or for at least 30 minutes, or for at least 45 minutes, or for at least 60 minutes, or for at least 90 minutes, or for at least 120 minutes, or for at least 150 minutes, or for at least 180 minutes water rinse and air drying. The weight change may be less than 0.1%, 0.1-1%, or 1-2%, or 2-3%, or 3-4%, 4-5%, or 5-6%, or 6-7%, or 7-8%, or 8-9%, 9-10%, or 10-11%, 11-12%, or 12-15%, or 15-20%, or 25-30%.

The present disclosure provides a nanocomposite film as described herein wherein the film has an averaged change of optical transmittance from 400 nm to 800 nm is 5%-10%, or 2%-5% or 1%-2%, or 0.1%-1% or 0.001%-0.1% after the film has been maintained at a temperature of 150 C or 200 C or 250 C for 60 minutes in air or vacuum or nitrogen.

The present disclosure provides a nanocomposite film as described herein wherein a film of at least 1 µm has a surface roughness of 5-4 nm, or 4-3 nm, or 3-2 nm, or 2-1 nm, or 1-0.5 nm, or 0.5-0.1 nm.

The present disclosure provides a nanocomposite film as described herein wherein the Abbe number is in the range of 20 to 60 or 30 to 41.

The present disclosure provides a nanocomposite film as described herein wherein the at least partially capped nanocrystals have an average size of less than 20 nm.

The present disclosure provides a nanocomposite film as described herein wherein the amount of the at least partially capped nanocrystals in the film is 10%-20%, or 20%-30%, or 30%-40%, or 40%-50%, or 50%-60%, or 60%-70%, or 70%-75%, or 75%-80%, or 80%-85%, or 85%-90%, or 90%-93% by weight of the nanocomposite film.

The present disclosure provides a nanocomposite film as described herein wherein the film is produced by spin coating, slot-die coating, slit-coating, screen-printing, ink-jet printing, dip coating, draw-bar coating, roll-to-roll printing, spray coating, or any combination thereof.

The present disclosure provides a scattering film containing a cured or partially cured scattering formulation of as described herein wherein the cured or partially cured binder formulation forms a nanocomposite binder.

The present disclosure provides a scattering film as described herein wherein the nanocomposite binder has a refractive index of between 1.6-1.62, or 1.62-1.64, 1.64-1.66, or 1.66-1.68, or 1.68-1.70, or 1.70-1.72, or 1.72-1.74, or 1.76-1.78, or 1.78-1.80, or 1.80-1.82, or 1.82-1.84, or 1.84-1.86, or 1.86-1.88, or 1.88-1.90 when measured at 400 nm.

The present disclosure provides a scattering film as described herein wherein the at least partially capped nanocrystals are capped with methoxy(triethyleneoxy) propyltrimethoxysilane and 3-(methacryloyloxy)propyl trimethoxysilane, and wherein the film is resistant to chemical treatment; wherein the chemical treatment may involve treatment with an acid, a base, an organic compound or water; wherein chemical treatment resistance may be determined by visual inspection after submerging the film in the chemical for at least 5 minutes or for at least 10 minutes, or for at least 15 minutes, or for at least 20 minutes, or for at least 30 minutes, or for at least 45 minutes, or for at least 60 minutes, or for at least 90 minutes, or for at least 120 minutes, or for at least 150 minutes, or for at least 180 minutes, water rinse and air drying.

The present disclosure provides a scattering film as described herein wherein the at least partially capped nanocrystals are capped with methoxy(triethyleneoxy) propyltrimethoxysilane and 3-(methacryloyloxy)propyl trimethoxysilane, and wherein the film is resistant to chemical treatment; wherein the chemical treatment may involve treatment with an acid, a base, an organic compound or water; wherein chemical treatment resistance may be determined by weight change after submerging the film in the chemical for at least 5 minutes or for at least 10 minutes, or for at least 15 minutes, or for at least 20 minutes, or for at least 30 minutes, or for at least 45 minutes, or for at least 60 minutes, or for at least 90 minutes, or for at least 120 minutes, or for at least 150 minutes, or for at least 180 minutes, water rinse and air drying. The weight change may be less than 0.1%, 0.1-1%, or 1-2%, or 2-3%, or 3-4%, 4-5%, or 5-6%, or 6-7%, or 7-8%, or 8-9%, 9-10%, or 10-11%, 11-12%, or 12-15%, or 15-20%, or 25-30%.

The present disclosure provides a scattering film as described herein wherein a film of at least 1 μm has a surface roughness of 5-4 nm, or 4-3 nm, or 3-2 nm, or 2-1 nm, or 1-0.5 nm, or 0.5-0.1 nm.

The present disclosure provides a scattering film as described herein wherein the at least partially capped nanocrystals of the nanocomposite binder have an average size of less than 20 nm.

The present disclosure provides a scattering film as described herein wherein the amount of the at least partially capped nanocrystals in the scattering film is 10%-20%, or 20%-30%, or 30%-40%, or 40%-50%, or 50%-60%, or 60%-70%, or 70%-75%, or 75%-80%, or 80%-85%, or 85%-90%, or 90%-93% by weight of the nanocomposite binder.

The present disclosure provides a scattering film as described herein wherein the film is produced by spin coating, slot-die coating, slit-coating, screen-printing, ink-jet printing, dip coating, draw-bar coating, roll-to-roll printing, spray coating, or any combination thereof.

The present disclosure provides a method of making at least partially capped nanocrystals involving mixing nanocrystals in a capping solvent with at least one capping agent in the presence of water; wherein the at least partially capped nanocrystals may be separated from the capping solvent; wherein the nanocrystals may be zirconia nanocrystals; wherein the capping agent may be at least one of methoxy (triethyleneoxy) propyltrimethoxysilane and 3-(methacryloyloxy)propyl trimethoxysilane, wherein the capping solvent may include propylene glycol monomethyl ether acetate (PGMEA), propylene glycol monomethyl ether (PGME), toluene, ethyl acetate, xylene, THF, heptane, hexane, acetone, or any combination thereof.

The present disclosure provides a formulation as described herein wherein the at least partially capped nanocrystals are made by a process involving mixing nanocrystals in a capping solvent with at least one capping agent in the presence of water; wherein the at least partially capped nanocrystals may be separated from the capping solvent; wherein the nanocrystals may be zirconia nanocrystals; wherein the capping agent may be at least one of methoxy (triethyleneoxy) propyltrimethoxysilane and 3-(methacryloyloxy)propyl trimethoxysilane, wherein the capping solvent may include propylene glycol monomethyl ether acetate (PGMEA), propylene glycol monomethyl ether (PGME), toluene, ethyl acetate, xylene, THF, heptane, hexane, acetone, or any combination thereof.

The present disclosure provides scattering formulation as described herein wherein the at least partially capped nanocrystals of the binder formulation are made by a process involving mixing nanocrystals in a capping solvent with at least one capping agent in the presence of water; wherein the at least partially capped nanocrystals may be separated from the capping solvent; wherein the nanocrystals may be zirconia nanocrystals; wherein the capping agent may be at least one of methoxy(triethyleneoxy) propyltrimethoxysilane and 3-(methacryloyloxy)propyl trimethoxysilane, wherein the capping solvent may include propylene glycol monomethyl ether acetate (PGMEA), propylene glycol monomethyl ether (PGME), toluene, ethyl acetate, xylene, THF, heptane, hexane, acetone, or any combination thereof.

The present disclosure provides a nanocomposite film as described herein wherein the at least partially capped nanocrystals are made by a process involving mixing nanocrystals in a capping solvent with at least one capping agent in the presence of water; wherein the at least partially capped nanocrystals may be separated from the capping solvent; wherein the nanocrystals may be zirconia nanocrystals; wherein the capping agent may be at least one of methoxy (triethyleneoxy) propyltrimethoxysilane and 3-(methacryloyloxy)propyl trimethoxysilane, wherein the capping solvent may include propylene glycol monomethyl ether acetate (PGMEA), propylene glycol monomethyl ether (PGME), toluene, ethyl acetate, xylene, THF, heptane, hexane, acetone, or any combination thereof.

The present disclosure provides a scattering film as described herein wherein the at least partially capped nanocrystals of the binder formulation are made by a process involving mixing nanocrystals in a capping solvent with at least one capping agent in the presence of water; wherein the at least partially capped nanocrystals may be separated from the capping solvent; wherein the nanocrystals may be zirconia nanocrystals; wherein the capping agent may be at least one of methoxy(triethyleneoxy) propyltrimethoxysilane and 3-(methacryloyloxy)propyl trimethoxysilane, wherein the capping solvent may include propylene glycol monomethyl ether acetate (PGMEA), propylene glycol monomethyl ether (PGME), toluene, ethyl acetate, xylene, THF, heptane, hexane, acetone, or any combination thereof.

The present disclosure provides an OLED device containing a nanocomposite film as described herein.

The present disclosure provides an OLED device containing a scattering film as described herein.

The present disclosure provides the following further non-limiting numbered embodiments as further examples of the disclosed technology:

1. A scattering formulation comprising scattering particles and a binder formulation, said binder formulation comprising a dispersion of at least partially capped metal oxide nanocrystals and a monomer, oligomer and/or polymer.

2. The scattering formulation of embodiment 1 wherein the D50, as measured by a number distribution, of said scattering particles is in the range of 50 nm-2 µm, or 50-100 nm, or 100-200 nm, or 200-300 nm, or 300-400 nm, or 400-500 nm, or 500-600 nm, or 600-700 nm, or 700-800 nm, or 800-900 nm or 900 nm to 1 µm, or 1-1.5 µm, or 1.5-2 µm.

3. The scattering formulation of embodiment 1 wherein the D50, as measured by a volume distribution, of said scattering particles is in the range of 50 nm-2 µm, or 50-100 nm, or 100-200 nm, or 200-300 nm, or 300-400 nm, or 400-500 nm, or 500-600 nm, or 600-700 nm, or 700-800 nm, or 800-900 nm or 900 nm to 1 µm, or 1-1.5 µm, or 1.5-2 µm.

4. The scattering formulation of embodiment 1 wherein D99, as measured by a number distribution, of said particles have a size less than 3 µm, 2.8 µm, 2.6 µm, 2.5 µm, 2.4 µm, 2.3 µm, 2.1 µm, 2.0 µm, 1.9 µm, 1.8 µm, 1.7 µm, 1.6 µm, 1.5 µm, 1.4 µm, 1.3 µm, 1.2 µm, 1.1 µm, 1.0 µm, 0.9 µm, 0.8 µm, 0.7 µm, 0.6 µm, or 0.5 µm.

5. The scattering formulation of embodiment 1 wherein D99, as measured by a volume distribution, of said particles have a size less than 3 µm, 2.8 µm, 2.6 µm, 2.5 µm, 2.4 µm, 2.3 µm, 2.1 µm, 2.0 µm, 1.9 µm, 1.8 µm, 1.7 µm, 1.6 µm, 1.5 µm, 1.4 µm, 1.3 µm, 1.2 µm, 1.1 µm, 1.0 µm, 0.9 µm, 0.8 µm, 0.7 µm, 0.6 µm, or 0.5 µm.

6. The scattering formulation of embodiment 1 wherein D99.99, as measured by a number distribution, of said particles have a size less than 3 µm, 2.8 µm, 2.6 µm, 2.5 µm, 2.4 µm, 2.3 µm, 2.1 µm, 2.0 µm, 1.9 µm, 1.8 µm, 1.7 µm, 1.6 µm, 1.5 µm, 1.4 µm, 1.3 µm, 1.2 µm, 1.1 µm, 1.0 µm, 0.9 µm, 0.8 µm, 0.7 µm, 0.6 µm, or 0.5 µm.

7. The scattering formulation of embodiment 1 wherein D99.99, as measured by a volume distribution, of said particles have a size less than 3 µm, 2.8 µm, 2.6 µm, 2.5 µm, 2.4 µm, 2.3 µm, 2.1 µm, 2.0 µm, 1.9 µm, 1.8 µm, 1.7 µm, 1.6 µm, 1.5 µm, 1.4 µm, 1.3 µm, 1.2 µm, 1.1 µm, 1.0 µm, 0.9 µm, 0.8 µm, 0.7 µm, 0.6 µm, or 0.5 µm.

8. A film of at least 1 µm made with the scattering formulation of embodiment 1 wherein the surface roughness Ra is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 1 µm by 1 µm.

9. A film of at least 1 µm made with the scattering formulation of embodiment 1 wherein the surface roughness Ra is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 5 µm by 5 µm.

10. A film of at least 1 µm made with the scattering formulation of embodiment 1 wherein the surface roughness Ra is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 10 µm by 10 µm.

11. A film of at least 1 µm made with the scattering formulation of embodiment 1 wherein the surface roughness Ra is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 25 µm by 25 µm.

12. A film of at least 1 µm made with the scattering formulation of embodiment 1 wherein the surface roughness Ra is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 50 µm by 50 µm.

13. A film of at least 1 µm made with the scattering formulation of embodiment 1 wherein the surface roughness Ra is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 100 µm by 100 µm.

14. A film of at least 1 µm made with the scattering formulation of embodiment 1 wherein the surface roughness Ra is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 500 µm by 500 µm.

15. A film of at least 1 µm made with the scattering formulation of embodiment 1 wherein the surface roughness Ra is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 1000 µm by 1000 µm.

16. A film of at least 1 µm made with the scattering formulation of embodiment 1 wherein the surface roughness Ra is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 5000 µm by 5000 µm.

17. A film of at least 1 µm made with the scattering formulation of embodiment 1 wherein the surface roughness Ra is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 10000 µm by 10000 µm.

18. A film of at least 1 µm made with the scattering formulation of embodiment 1 wherein the surface roughness Rpv is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 1 µm by 1 µm.

19. A film of at least 1 µm made with the scattering formulation of embodiment 1 wherein the surface roughness Rpv is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 5 µm by 5 µm.

20. A film of at least 1 µm made with the scattering formulation of embodiment 1 wherein the surface roughness Rpv is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 10 µm by 10 µm.

21. A film of at least 1 µm made with the scattering formulation of embodiment 1 wherein the surface roughness Rpv is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 25 μm by 25 μm.

22. A film of at least 1 μm made with the scattering formulation of embodiment 1 wherein the surface roughness Rpv is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 50 μm by 50 μm.

23. A film of at least 1 μm made with the scattering formulation of embodiment 1 wherein the surface roughness Rpv is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 100 μm by 100 μm.

24. A film of at least 1 μm made with the scattering formulation of embodiment 1 wherein the surface roughness Rpv is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 500 μm by 500 μm.

25. A film of at least 1 μm made with the scattering formulation of embodiment 1 wherein the surface roughness Rpv is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 1000 μm by 1000 μm.

26. A film of at least 1 μm made with the scattering formulation of embodiment 1 wherein the surface roughness Rpv is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 5000 μm by 5000 μm.

27. A film of at least 1 μm made with the scattering formulation of embodiment 1 wherein the surface roughness Rpv is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 10000 μm by 10000 μm.

28. A film of at least 1 μm made with the scattering formulation of embodiment 1 wherein the surface roughness RMS is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 1 μm by 1 μm.

29. A film of at least 1 μm made with the scattering formulation of embodiment 1 wherein the surface roughness RMS is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 5 μm by 5 μm.

30. A film of at least 1 μm made with the scattering formulation of embodiment 1 wherein the surface roughness RMS is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 10 μm by 10 μm.

31. A film of at least 1 μm made with the scattering formulation of embodiment 1 wherein the surface roughness RMS is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 25 μm by 25 μm.

32. A film of at least 1 μm made with the scattering formulation of embodiment 1 wherein the surface roughness RMS is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 50 μm by 50 μm.

33. A film of at least 1 μm made with the scattering formulation of embodiment 1 wherein the surface roughness RMS is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 100 μm by 100 μm.

34. A film of at least 1 μm made with the scattering formulation of embodiment 1 wherein the surface roughness RMS is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 500 μm by 500 μm.

35. A film of at least 1 μm made with the scattering formulation of embodiment 1 wherein the surface roughness RMS is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 1000 μm by 1000 μm.

36. A film of at least 1 μm made with the scattering formulation of embodiment 1 wherein the surface roughness RMS is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 5000 μm by 5000 μm.

37. A film of at least 1 μm made with the scattering formulation of embodiment 1 wherein the surface roughness RMS is less than 1 nm, 3 nm, 5 nm, 7 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 250 nm, and 500 nm over an area of 10000 μm by 10000 μm.

38. The scattering formulation of embodiment 1 wherein the monomer, oligomer and/or polymer comprises at least one of an acrylate, (meth)acrylate, epoxy, epoxy-acrylate, or epoxy-silane monomer, oligomer and/or polymer.

39. The scattering formulation of embodiment 38, said binder formulation further comprising a curing agent.

40. The scattering formulation of embodiment 39 wherein the curing agent is a photo-initiator.

41. The scattering formulation of embodiment 40 wherein the photoinitiator is selected from the group consisting of Ebecryl® P39, Ebecryl® P115, SpeedCure® BEM, benzophenone, diphenyl(2,4,6-trimethylbenzoyl)-phosphine oxide, 1-hydroxy-cyclohexyl phenyl ketone (Irgacure® 184), phenylbis(2,4,6-trimethylbenzyoyl)-phoshine oxide (Irgacure® 819), camphoquinone (CQ), 2-dimethylaminoethyl methacrylate (DMAEMA), ethyl 4-(dimethylamino) benzoate (EDAB), diphenyliodonium hexafluorophosphate (DPIHFP), 4-octyloxydiphenyliodoniumhexfluoroantimonate (OPPI).

42. The scattering formulation of embodiment 39 wherein the curing agent is a thermal curing agent such as azobisisobutyronitrile (AIBN).

43. The scattering formulation of embodiment 39 wherein the dispersant include acidic polyester.

44. The scattering formulation of embodiment 1 wherein the scattering particles is selected from the group consisting of a polymer, titanium oxide, silicon dioxide, niobium pentoxide, zirconium oxide, zinc oxide, aluminum oxide, cerium oxide, diamond, silicon nitride, or voids.

45. A formulation comprising a dispersion of at least partially capped metal oxide nanocrystals and an acrylic polymer comprising bisphenol A glycerolate dimethacrylate, optionally further comprising a solvent, a curing agent or an antioxidant.

46. The formulation of embodiment 45 wherein the at least partially capped metal oxide nanocrystals are produced in the presence of water.

47. The formulation of embodiment 45 or embodiment 2 wherein said metal oxide nanocrystals are zirconium oxide, titanium oxide, hafnium oxide, zinc oxide or a mixture of at least two of said oxides.

48. The formulation of one of embodiments 45-47 wherein said at least partially capped metal oxide nanocrystals are at least partially capped with at least one capping agent selected from the group consisting of 2-[2-(2-methoxyethoxy) ethoxy]acetic acid, methoxy(triethyleneoxy) propyltrimethoxysilane, 3-(methacryloyloxy)propyl trimethoxysilane, n-octyl trimethoxysilane, dodecyltrimethoxysilane, m,p-ethylphenethyl trimethoxysilane, n-propyltrimethoxysilane, n-propyltriethoxysilane, n-octyltrimethoxysilane, n-octyltriethoxysilane, phenyltrimethoxysilane, 2-[methoxy(polyethyleneoxy)propyl]-trimethoxysilane, 3-aminopropyltrimethoxysilane, 3-mercaptopropyltrimethoxysilane, 3-isocyanatopropyltriethoxysilane, 3-isocyanatopropyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid.

49. The formulation of one of embodiments 45-48 wherein said dispersion does not contain benzyl methacrylate (BMA) or trimethylolpropane triacrylate (TMPTA).

50. The formulation of any one of embodiments 45-49, further comprising at least one of a solvent, a curing agent or an antioxidant.

51. The formulation of any one of embodiments 45-50, further comprising at least one of a crosslinking agent, a thickener, an adhesion promoter, a wetting agent, a leveling agent, a dispersing agent, a plasticizer, or a flexibilizer.

52. The formulation of any one of embodiments 45-51 wherein the at least partially capped metal oxide nanocrystals are present in the formulation in an amount of less than 10% by weight of the acrylic and at least partially capped nanocrystals, or 10%-20% by weight of the of the acrylic and at least partially capped nanocrystals, or 20%-30% by weight of the of the acrylic and at least partially capped nanocrystals, or 30%-40% by weight of the of the acrylic and at least partially capped nanocrystals, or 40%-50% by weight of the of the acrylic and at least partially capped nanocrystals, or 50%-60% by weight of the of the acrylic and at least partially capped nanocrystals, or 60%-70% by weight of the of the acrylic and at least partially capped nanocrystals, or 70%-80% by weight of the of the acrylic and at least partially capped nanocrystals, or 80%-90% by weight of the of the acrylic and at least partially capped nanocrystals, or 90%-95% by weight of the of the acrylic and at least partially capped nanocrystals.

53. The formulation of any one of embodiments 45-52 the optical transmittance at 650 nm of the formulation in 50% PGMEA by weight of the total formulation as solvent, when measured in a cuvette with 1 cm path length is 99%-95%, or 95%-90%, or 90%-85%, or 85%-80%, 80%-75%, or 75%-70%, or 70%-65%, or 65%-60%, or 60%-55%, or 55%-50%, or 50%-45%, or 45%-40%, or 40%-35%, or 35%-30%, or 30%-25%, or 25%-20%, or 20%-15%, or 15%-10%.

54. The formulation of any one of embodiments 45-52 the optical transmittance at 450 nm of the formulation in 50% PGMEA by weight of the total formulation as solvent, when measured in a cuvette with 1 cm path length is 99%-95%, or 95%-90%, or 90%-85%, or 85%-80%, 80%-75%, or 75%-70%, or 70%-65%, or 65%-60%, or 60%-55%, or 55%-50%, or 50%-45%, or 45%-40%, or 40%-35%, or 35%-30%, or 30%-25%, or 25%-20%, or 20%-15%, or 15%-10%.

55. The formulation of any one of embodiments 45-53 wherein the viscosity of the dispersion is less than 5 cPs, or 5 cPs-50 cPs, or 50 cPs-200 cPs, or 200 cPs-400 cPs, or 400 cPs-650 cPs, or 650 cPs-1000 cPs, when measured at 25° C. with a Brookfield RVDV II+ cone and plate viscometer.

56. The formulation of embodiment 55 wherein the at least partially capped metal oxide nanocrystals are present in the formulation in an amount of less than 10% by weight of the acrylic and at least partially capped nanocrystals, 57. The formulation of embodiment 55 wherein the at least partially capped metal oxide nanocrystals are present in the formulation in an amount of 10%-20% by weight of the of the acrylic and at least partially capped nanocrystals, 58. The formulation of embodiment 55 wherein the at least partially capped metal oxide nanocrystals are present in the formulation in an amount of 20%-30% by weight of the of the acrylic and at least partially capped nanocrystals, 59. The formulation of embodiment 55 wherein the at least partially capped metal oxide nanocrystals are present in the formulation in an amount of 30%-40% by weight of the of the acrylic and at least partially capped nanocrystals, 60. The formulation of embodiment 55 wherein the at least partially capped metal oxide nanocrystals are present in the formulation in an amount of 40%-50% by weight of the of the acrylic and at least partially capped nanocrystals, 61. The formulation of embodiment 55 wherein the at least partially capped metal oxide nanocrystals are present in the formulation in an amount of 50%-60% by weight of the of the acrylic and at least partially capped nanocrystals, or 60%-70% by weight of the of the acrylic and at least partially capped nanocrystals, 62. The formulation of embodiment 55 wherein the at least partially capped metal oxide nanocrystals are present in the formulation in an amount of 70%-80% by weight of the of the acrylic and at least partially capped nanocrystals, 63. The formulation of embodiment 55 wherein the at least partially capped metal oxide nanocrystals are present in the formulation in an amount of 80%-90% by weight of the of the acrylic and at least partially capped nanocrystals, 64. The formulation of embodiment 55 wherein the at least partially capped metal oxide nanocrystals are present in the formulation in an amount of 90%-95% by weight of the of the acrylic and at least partially capped nanocrystals.

65, The formulation of any one of embodiments 45-64 wherein the average diameter of the at least partially capped nanocrystals is less than 20 nm, or in the range of 1-20 nm.

66. A scattering formulation comprising a binder formulation and further comprising scattering particles wherein said binder formulation comprises the formulation of any one of embodiments 45-65.

67. The scattering formulation of embodiment 66 wherein the average size of said scattering particles is in the range of 50 nm-2 µm, or 50-100 nm, or 100-200 nm, or 200-300 nm, or 300-400 nm, or 400-500 nm, or 500-600 nm, or 600-700 nm, or 700-800 nm, or 800-900 nm or 900 nm to 1 µm, or 1-1.5 µm, or 1.5-2 µm.

68. The scattering formulation of embodiment 66 or embodiment 23 wherein said scattering particles are present in an amount of 0.1-40% by weight of the total weight of the formulation.

69. The scattering formulation of any one of embodiments 66-68 wherein scattering particles have a higher refractive index than the refractive index of the binder formulation.

70. The scattering formulation of any one of embodiments 66-68 wherein scattering particles have a lower refractive index than the refractive index of the binder formulation.

71. The scattering formulation of any of embodiments 66-69 wherein the scattering particles are selected from a polymer, titanium oxide, silicon dioxide, niobium pentoxide, zirconium oxide, zinc oxide, aluminum oxide, cerium oxide or mixtures of any two of a polymer, titanium oxide, silicon dioxide, niobium pentoxide, zirconium oxide, zinc oxide, aluminum oxide and cerium oxide.

72. The scattering formulation of any one of embodiments 66-70 wherein the scattering formulation is storage stable for at least 1 week, or 2 weeks, or 3 weeks, or 4 weeks, or 3 months, or at least 5 months, or at least 6 months, or at least 7 months, or at least 8 months, or at least 9 months, or at least 10 months, or at least 11 months, or at least 1 year, or at least 2 years or at least 3 years, when said scattering formulation is stored at a temperature in the range of 18–25° C. without deliberate shaking or mixing of the scattering formulation.

73. The scattering formulation of any one of embodiments 66-71 wherein the scattering formulation is storage stable and the weight percentage of scattering particles in a sample from the upper third of a stored sample of the scattering formulation changes by less than 1%, or 1-2%, or 2-3%, or 3-4%, or 4-5%, or 5-7%, or 7-10%, or 10-15%, or 15-20%, or 20-25%, or 25-30%, or 30-35% over the storage time.

74. A nanocomposite film comprising a cured or partially cured formulation of any one of embodiments 45-65.

75. The nanocomposite film of embodiment 73 wherein said film has a refractive index of between 1.6-1.62, or 1.62-1.64, 1.64-1.66, or 1.66-1.68, or 1.68-1.70, or 1.70-1.72, or 1.72-1.74, or 1.76-1.78, or 1.78-1.80, or 1.80-1.82, or 1.82-1.84, or 1.84-1.86, or 1.86-1.88, or 1.88-1.90 when measured at 400 nm.

76. The nanocomposite film of embodiments 73 or embodiment 30 wherein said film has a normal transmittance of 99.99%-99%, or 99%-98%, or 98%-97%, or 97%-96%, or 96%-95%, or 95%-90%, or 90%-85%, or 85%-80%, 80%-75%, or 75%-70%, or 70%-65%, or 65%-60%, or 60%-55%, or 55%-50%, or 50%-45%, or 45%-40%, or 40%-35%, or 35%-30%, or 30%-25%, or 25%-20%, or 20%-15%, or 15%-10% for films that are 4.9-5 microns thick, when measured at a wavelength of 450 nm or 650 nm.

77. The nanocomposite film of any one of embodiments 73-75 wherein the at least partially capped nanocrystals are capped with methoxy(triethyleneoxy) propyltrimethoxysilane, and 3-(methacryloyloxy)propyl trimethoxysilane, and wherein the film is resistant to chemical treatment.

78. The nanocomposite film of embodiment 77 wherein the chemical treatment comprises treatment with an acid, a base, an organic compound or water.

79. The nanocomposite film of embodiment 77 wherein chemical treatment resistance is determined by visual inspection after submerging the film in said chemical for at least 5 minutes, water rinse and air drying.

80. The nanocomposite film of any one of embodiments 73-78 wherein the film has an averaged change of optical transmittance from 400 nm to 800 nm is 5%-10%, or 2%-5% or 1%-2%, or 0.1%-1% or 0.001%-0.1% after the film has been maintained at a temperature of 150 C or 200 C or 250 C for 60 minutes in air or vacuum or nitrogen.

81. The nanocomposite film of any one embodiments 73-79 wherein a film of at least 1 µm has a surface roughness of 5-4 nm, or 4-3 nm, or 3-2 nm, or 2-1 nm, or 1-0.5 nm, or 0.5-0.1 nm.

82. The nanocomposite film of any one of embodiments 73-80 wherein the Abbe number is in the range of 20 to 60 or 30 to 41.

83. The nanocomposite film of any one of embodiments 73-81 wherein the at least partially capped nanocrystals have an average size of less than 20 nm.

84. The nanocomposite film of any one of embodiments 73-82 wherein the amount of the at least partially capped nanocrystals in the film is 10%-20%, or 20%-30%, or 30%-40%, or 40%-50%, or 50%-60%, or 60%-70%, or 70%-75%, or 75%-80%, or 80%-85%, or 85%-90%, or 90%-93% by weight of the nanocomposite film.

85. The nanocomposite film of any one of embodiments 73-83 wherein the film is produced by spin coating, slot-die coating, slit-coating, screen-printing, ink-jet printing, dip coating, draw-bar coating, roll-to-roll printing, spray coating, or any combination thereof.

86. A scattering film comprising a cured or partially cured scattering formulation of any one of embodiments 66-72, wherein said cured or partially cured binder formulation forms a nanocomposite binder.

87. The scattering film of embodiment 85 wherein said nanocomposite binder has a refractive index of between 1.6-1.62, or 1.62-1.64, 1.64-1.66, or 1.66-1.68, or 1.68-1.70, or 1.70-1.72, or 1.72-1.74, or 1.76-1.78, or 1.78-1.80, or 1.80-1.82, or 1.82-1.84, or 1.84-1.86, or 1.86-1.88, or 1.88-1.90 when measured at 400 nm.

88. The scattering film of embodiment 85 or embodiment 86 wherein the at least partially capped nanocrystals are capped with methoxy(triethyleneoxy) propyltrimethoxysilane and 3-(methacryloyloxy)propyl trimethoxysilane, and wherein the film is resistant to chemical treatment.

89. The scattering film of embodiment 87 wherein the chemical treatment comprises treatment with an acid, a base, an organic compound or water.

90. The scattering film of embodiment 88 wherein chemical treatment resistance is determined by visual inspection after submerging the film in said chemical for at least 5 minutes, water rinse and air drying.

91. The scattering film of any one embodiments 85-89 wherein a film of at least 1 µm has a surface roughness of 5-4 nm, or 4-3 nm, or 3-2 nm, or 2-1 nm, or 1-0.5 nm, or 0.5-0.1 nm.

The following are non-limiting exemplifications of embodiments of the disclosure.

Example 1

The capping of zirconia nanocrystals with two different capping agents, methoxy(triethyleneoxy) propyltrimethoxysilane and 3-methacryloyloxypropyltrimethoxylsilane, is performed by suspending the as-synthesized nanocrystals in the solvent of choice, for example, PGMEA for methoxy (triethyleneoxy) propyltrimethoxysilane modification, at a loading of 10% by weight or greater, calculated based on the wet cake weight of the nanocrystals. While the suspension is being stirred, the first capping agent, methoxy(triethyleneoxy) propyltrimethoxysilane, is added slowly to the suspension. The amount of capping agent used is 1-8% by weight to the wet cake. The suspension is refluxed at the boiling point of the solvent for 30-50 minutes under nitrogen flow. After the set reaction time, the reaction is stopped and the suspension is cooled slowly to 70-100° C. Upon reaching said temperature, the second capping agent, 3-methacryloyloxypropyltrimethoxylsilane, is added slowly to the suspension. The amount of the capping agent used is 30-60% by weight to the wet cake. The suspension is again refluxed at the boiling point of the solvent for 30-50 minutes under nitrogen flow. After the second reflux step, the suspension is slowly cooled to 50-70° C. Upon reaching said temperature, distilled water is added to the suspension slowly. The amount of water used is 1-5 wt % to the wet cake. The suspension is refluxed at 70-100° C. for 30-50 minutes under nitrogen flow. Upon the completion of the allotted heating time, the clear solution is cooled slowly to room temperature. The capped nanocrystals are precipitated out of the capping solvent using heptane. The precipitated nanocrystals are collected using centrifugation. The nanocrystals collected by centrifugation are further cleaned by dispersing it in THF and again re-precipitated out using heptane. The process is repeated twice. The wet cake obtained after the final step is dried under vacuum for 10-12 hours. The capped nanocrystals can then be re-dispersed into dispersion solvent such as PGMEA.

b)

FIG. 1A) shows an exemplary optical transmittance of 50 wt % capped nanocrystals dispersed in PGMEA, measure in a 1 cm path length cuvette. A 1 cm path length cuvette filled with pure PGMEA is used as the reference. It is measured using a Perkin Elmer Lambda 850 spectrophotometer.

b)

FIG. 1B) shows an exemplary dynamic light scattering (DLS) result of 5 wt % capped nanocrystals dispersed in PGMEA, showing an average particle size of 9 nm, it is measured by a Marvin Nano-S particle sizer.

Example 2

The capping of zirconia nanocrystals with two different capping agents, methoxy(triethyleneoxy) propyltrimethoxysilane and 3-methacryloyloxypropyltrimethoxylsilane is performed by suspending the as-synthesized nanocrystals in the solvent of choice, for example, PGMEA for methoxy (triethyleneoxy) propyltrimethoxysilane modification, at a loading of 10% or greater, calculated based on the wet cake weight of the nanocrystals. While the suspension is being stirred, the first capping agent is added slowly to the suspension. The amount of capping agent used is 5-8 wt % to the wet cake. The suspension is refluxed at the boiling point of the solvent for 30-50 minutes under nitrogen flow. After the set reaction time, the reaction is stopped heating and the suspension is cooled slowly to 70-100° C. Upon reaching that temperature, the second capping agent is added slowly to the suspension. The amount of the capping agent used is 30-60 wt % to the wet cake. The suspension is again refluxed at the boiling point of the solvent for 30-50 minutes under nitrogen flow. Upon the completion of the allotted heating time, the clear solution is cooled slowly to room temperature. The capped nanocrystals are precipitated out of the capping solvent using heptane. The precipitated nanocrystals are collected using centrifuge. The nanocrystals collected by centrifuge are further cleaned by dispersing it in THF and again re-precipitating using heptane. The process is repeated twice. The wet cake obtained after the final step is dried under vacuum for 10-12 hours. The capped nanocrystals can then be re-dispersed into dispersion solvent such as PGMEA.

Example 3

An exemplary formulation comprises PGMEA as solvent, bisphenol A diglycerolate dimethacrylate monomer, capped zirconia nanocrystals (with 90% by weight to the monomer), 3% of EBecryl P-39 by weight to the monomer, 6% of EBecryl P-115 by weight to the monomer.

The zirconia nanocrystals used in this formulation are capped with two different capping agents, methoxy(triethyleneoxy) propyltrimethoxysilane and 3-methacryloyloxypropyltrimethoxylsilane. The capping process is performed by suspending the as-synthesized nanocrystals in PGMEA, at a loading of 35% by weight calculated based on the wet cake weight of the nanocrystals. While the suspension is being stirred, the first capping agent, methoxy(triethyleneoxy) propyltrimethoxysilane, is added slowly to the suspension. The amount of capping agent used is 1% by weight to the wet cake. The suspension is refluxed at the boiling point of the solvent for 40 minutes under nitrogen flow. After the set reaction time, the reaction is stopped and the suspension is cooled slowly to 100° C. Upon reaching said temperature, the second capping agent, 3-methacryloyloxypropyltrimethoxylsilane, is added slowly to the suspension. The amount of the capping agent used is 60% by weight to the wet cake. The suspension is again refluxed at the boiling point of the solvent for 40 minutes under nitrogen flow. After the second reflux step, the suspension is slowly cooled to 70° C. Upon reaching said temperature, distilled water is added to the suspension slowly. The amount of water used is 5 wt % to the wet cake. The suspension is refluxed at 100° C. for 30 minutes under nitrogen flow. Upon the completion of the allotted heating time, the clear solution is cooled slowly to room temperature. The capped nanocrystals are precipitated out of the capping solvent using heptane. The precipitated nanocrystals are collected using centrifugation. The nanocrystals collected by centrifugation are further cleaned by dispersing it in THF and again re-precipitated out using heptane. The process is repeated twice. The wet cake obtained after the final step is dried under vacuum for 10-12 hours. The capped nanocrystals can then be re-dispersed into dispersion solvent such as PGMEA.

The viscosity of the formulation can be adjusted from about 5 cPs to more than 400 cPs by adjusting the PGMEA solvent amount. FIG. 2 shows the viscosity of the formulation as a function of the solid content (non-solvent portion) weight percentage to the total weight of the formulation, the markers in the plot represent actual data points. The viscosity range allows the formulation to produce films by standard coating processes such as spin coating, slot-die coating, screen-printing, dip-coating, spray printing, etc.

Table 1 shows an exemplary experimental "spin curve" of film thickness and standard deviation produced by the different spin speed and different solid content in the formulation. The standard deviation represents the film thickness uniformity across a 2 inch wafer. The spin-coater used here is a Laurell WS-650 Mz. The substrate used is glass. The films are produced with 100° C. pre-bake on a hot plate in air after the films are spin coated, the films are then cured for 120 seconds using a Dymax EC-5000 system with a mercury "H" bulb with ~73 mW/cm². Finally the films are subjected to a 10 minutes post bake on a hot plate in air. The film thickness is measured using a Tencor P-2 surface profilometer.

Similarly, FIG. 3 shows an exemplary experimental depiction of the relationship of film thickness and standard deviation to shuttle speed on an nTact nRad slot-die coater with 12 µL/s dispense rate using the formulation described in this example. The substrates are 4 inch square glass plates. The standard deviation represents the film thickness uniformity across the 4 inch substrate. The film curing process is the same as described in the previous paragraph.

The TGA result of the capped nanocrystals of the current example dispersed in PGEMA by themselves with 50% by weight is shown in FIG. 4A. The measured organic content is 15.21%. The TGA result of the formulation of the current example with 50% of capped nanocrystals by weight is shown in FIG. 4B, the measured inorganic solid content is 40.35%.

The optical transmittance of the formulation of the current example with 50% of capped nanocrystals by weight is shown in FIG. 5.

The refractive index of the film produced with the formulation in this example is obtained by a Woollam M2000 ellipsometer. FIG. 6A shows the refractive index as a function of wavelength of spin coated films, the solid line is the refractive index of as made film and the dotted line is obtained after the film is further subjected to a 200 C 60 minutes bake in an oven in air. The Abbe number for the original film is 39.56 and for the thermally treated film, 38.25. FIG. 6B shows the refractive index as a function of wavelength of spin coated films with a slightly different composition where capped zirconia nanocrystals represent 93% by weight to the monomer. Again the solid line is the refractive index of as made film and the dotted line is obtained after the film is further subjected to a 200° C. 60 minutes bake in an oven in air. The Abbe number for the original film is 40.21 and for the thermally treated film, 39.07.

The films produced with the formulation in this example demonstrate high optical transmittance. The spectrum 101 in FIG. 7 shows the optical transmittance of an as-made film measured by Perkin Elmer Lambda 850 spectrophotometer. The thickness of the film is about 1 micrometer. The ripples in the spectrum are the results of interference of incoming light and reflected light, it usually is an indication of high film quality, i.e. high smoothness, high uniformity, and high transparency.

The films produced with the formulation in this example demonstrate high thermal resistance. FIG. 7 shows the optical transmittance of the as-made film (101), after 60 minutes at 150° C. in an oven in air (102), after 60 minutes at 200° C. in an oven in air (102), after 60 minutes at 250° C. in an oven in air (102). The average transmittance change, which is measured by averaging the difference of the transmittance at each wavelength from 400 nm to 800 nm, compared with the as-made film, are only about 0.6%, 0.9%, and 2% respectively. Note the shifts of the peak positions of the ripples usually do not indicate the change of film quality, it is due to the slightly change of conditions, such as thickness or reflectivity, at the specific spot in each measurement.

In another thermal resistance study, the solid line in FIG. 8 shows the optical transmittance of an as-made film, the dotted line in FIG. 8 shows the optical transmittance after the film is subjected to 30 minutes, 120° C. additional post bake on a hot plate in air, followed by a 70 minutes 200° C. thermal treatment in an oven in air. The averaged transmittance change from 400 nm to 800 nm is only about 1.3%.

The films produced with the formulation in this example demonstrate chemical resistance to 1:1 HCl (prepared by mixing 38 wt % hydrochloric acid water solution with water in 1:1 volume ratio), 1:3 HCl (prepared by mixing 38% hydrochloric acid water solution with water in 1:3 volume ratio), 5 wt % KOH water solution, DI water, acetone, isopropanol, N-methyl-2-pyrrolidone. After the previously described Procedure 1 for 5 minutes, the film shows no visible discoloration, swelling, cracking, delamination, peeling off, or loss of integrity for all chemicals except KOH solution. After the previously described Procedure 1 for 5 minutes in 5 wt % KOH solution, the film shows slight discoloration, but no visible swelling, cracking, delamination, peeling off, or loss of integrity. After the previously described Procedure 1 for 15 minutes in with 1:1 HCl, acetone, and isopropanol, the film shows no visible discoloration, swelling, cracking, delamination, peeling off, or loss of integrity. After the previously described Procedure 1 for 15 minutes in 5 wt % KOH solution, the film shows slight discoloration, but no visible swelling, cracking, delamination, peeling off, or loss of integrity.

The films produced with the formulation in this example demonstrate high surface smoothness, as shown by the AFM image in FIG. 9A, the as-made spin coated film with about 1 micrometer thickness has surface RMS roughness of 0.749, and Ra roughness of 0.595. The surface roughness is measured on a 5 micrometer by 5 micrometer square. After a thermal treatment of 250° C. for 5 minutes in an oven in air, the surface roughness did not change significantly, as shown in FIG. 9B, again indicating the good thermal resistance of the film.

Example 4

An exemplary formulation comprises PGMEA as solvent, bisphenol A diglycerolate dimethacrylate monomer, capped zirconia nanocrystals (with 90% by weight to the monomer), 3% of EBecryl P-39 by weight to the monomer, 6% of EBecryl P-115 by weight to the monomer.

The zirconia nanocrystals used in this formulation are capped with two different capping agents, methoxy(triethyleneoxy) propyltrimethoxysilane and 3-methacryloyloxypropyltrimethoxylsilane. The capping process is performed by suspending the as-synthesized nanocrystals in PGMEA, at a loading of 35% by weight calculated based on the wet cake weight of the nanocrystals. While the suspension is being stirred, the first capping agent, methoxy(triethyleneoxy) propyltrimethoxysilane, is added slowly to the suspension. The amount of capping agent used is 5% by weight to the wet cake. The suspension is refluxed at the boiling point of the solvent for 40 minutes under nitrogen flow. After the set reaction time, the reaction is stopped and the suspension is cooled slowly to 100° C. Upon reaching said temperature, the second capping agent, 3-methacryloyloxypropyltrimethoxylsilane, is added slowly to the suspension. The amount of the capping agent used is 60% by weight to the wet cake. The suspension is again refluxed at the boiling point of the solvent for 40 minutes under nitrogen flow. After the second reflux step, the suspension is slowly cooled to 70° C. Upon reaching said temperature, distilled water is added to the suspension slowly. The amount of water used is 5 wt % to the wet cake. The suspension is refluxed at 100° C. for 30 minutes under nitrogen flow. Upon the completion of the allotted heating time, the clear solution is cooled slowly to room temperature. The capped nanocrystals are precipitated out of the capping solvent using heptane. The precipitated nanocrystals are collected using centrifugation. The nanocrystals collected by centrifugation are further cleaned by dispersing it in THF and again re-precipitated out using heptane. The process is repeated twice. The wet cake obtained after the final step is dried under vacuum for 10-12 hours. The capped nanocrystals can then be re-dispersed into dispersion solvent such as PGMEA.

The films are produced with 100° C. pre-bake on a hot plate in air after the films are spin coated, the films are then cured for 120 seconds using a Dymax EC-5000 system with a mercury "H" bulb with ~73 mW/cm$^2$. Finally the films are subjected to a 10 minutes post bake on a hot plate in air.

The TGA result of the capped nanocrystals of the current example dispersed in PGEMA by themselves with 50% by weight is shown in FIG. 10. The measured organic content is 15.97%.

The refractive index of the film produced with the formulation in this example is obtained by a Woollam M2000 ellipsometer. FIG. 11A shows the refractive index as a function of wavelength of spin coated films, the solid line is the refractive index of as made film and the dotted line is obtained after the film is further subjected to a 200 C 60 minutes bake in an oven in air. The Abbe number for the original film is 39.88 and for the thermally treated film, 38.73. The films produced with the formulation in this example demonstrate high optical transmittance. FIG. 11B shows the refractive index as a function of wavelength of spin coated films with a slightly different composition where capped zirconia nanocrystals represent 93% by weight to the monomer. Again the solid line is the refractive index of as made film and the dotted line is obtained after the film is further subjected to a 200° C. 60 minutes bake in an oven in air. The Abbe number for the original film is 39.57 and for the thermally treated film, 39.90.

The films produced with the formulation in this example demonstrate high optical transmittance. The solid lines in FIG. 12A and FIG. 12B show the optical transmittance of an as-made film with 90% capped nanocrystals and 93% capped nanocrystals respectively, measured by Perkin Elmer Lambda 850 spectrophotometer. The thickness of the film is about 1 micrometer.

The films produced with the formulation in this example demonstrate high thermal resistance. The dotted lines in FIG. 12A and FIG. 12B show the optical transmittance of the as-made films, with 90% capped nanocrystals and 93% capped nanocrystals respectively, after 60 minutes at 200° C. in an oven in air. The average transmittance changes from 400 nm to 800 nm, compared with the as-made films, are only about 5% and 1.4% respectively.

The films produced with the formulation in this example demonstrate chemical resistance to 1:1 HCl, 1:3 HCl, 5 wt % KOH water solution, DI water, acetone, isopropanol, and methyl pyrrolidone. After the previously described Procedure 1 for 5 minutes, the film shows no visible discoloration, swelling, cracking, delamination, peeling off, or loss of integrity for all listed chemicals except KOH solution. After the previously described Procedure 1 for 5 minutes in 5 wt % KOH solution, the film shows slight discoloration, but no visible swelling, cracking, delamination, peeling off, or loss of integrity. After the previously described Procedure 1 for 15 minutes in 1:1 HCl, acetone, and isopropanol, the film shows no visible discoloration, swelling, cracking, delamination, peeling off, or loss of integrity. After the previously described Procedure 1 for 15 minutes in 5 wt % KOH solution, the film shows slight discoloration, but no visible swelling, cracking, delamination, peeling off, or loss of integrity.

The chemical resistance of the film does not chance when the weight percentage of the P39 is varied from 2% to 5%. The chemical resistance of the film does not chance when the weight percentage of the P115 is varied from 4% to 15%.

When the P39 and P115 in the current example are replaced with 5%, 6%, or 8% Irgacure 184 by weight to the monomer, the chemical resistance remained same except for 5 wt % KOH solution. Film is completely removed after 5 minutes with Procedure 1 in 5% KOH.

The films produced with the formulation in this example demonstrate high surface smoothness, as shown by the AFM image in FIG. 13A, the as-made spin coated film with 1 micrometer thickness has surface RMS roughness of 0.518, and Ra roughness of 0.409. The surface roughness is measured on a 5 micrometer by 5 micrometer square. After a thermal treatment of 250° C. for 5 minutes on a hotplate in air, the surface roughness did not change significantly, as shown in FIG. 13B, again indicating the good thermal resistance of the film.

Example 5

An exemplary formulation comprises PGMEA as solvent, bisphenol A diglycerolate dimethacrylate monomer, capped zirconia nanocrystals (with 90% by weight to the monomer), 3% of EBecryl P-39 by weight to the monomer, 6% of EBecryl P-115 by weight to the monomer.

The zirconia nanocrystals used in this formulation are capped with 3-methacryloyloxypropyltrimethoxylsilane. The capping process is performed by suspending the as-synthesized nanocrystals in PGMEA, at a loading of 35%, calculated based on the wet cake weight of the nanocrystals. While the suspension is being stirred, the first capping agent is added slowly to the suspension. The amount of capping agent used is 8 wt % to the wet cake. The suspension is refluxed at the boiling point of the solvent for 40 minutes under nitrogen flow. After the set reaction time, the reaction is stopped heating and the suspension is cooled slowly to 100° C. Upon reaching that temperature, the second capping agent is added slowly to the suspension. The amount of the capping agent used is 60 wt % to the wet cake. The suspension is again refluxed at the boiling point of the solvent for 40 minutes under nitrogen flow. Upon the completion of the allotted heating time, the clear solution is cooled slowly to room temperature. The capped nanocrystals are precipitated out of the capping solvent using heptane. The precipitated nanocrystals are collected using centrifuge. The nanocrystals collected by centrifugation are further cleaned by dispersing it in THF and again re-precipitating using heptane. The process is repeated twice. The wet cake obtained after the final step is dried under vacuum for 10-12 hours. The capped nanocrystals can then be re-dispersed into dispersion solvent such as PGMEA.

The films are produced with 100° C. pre-bake on a hot plate in air after the films are spin coated, the films are then cured for 120 seconds using a Dymax EC-5000 system with a mercury "H" bulb with ~73 mW/cm$^2$. Finally the films are subjected to a 10 minutes post bake on a hot plate in air.

The TGA result of the capped nanocrystals of the current example dispersed in PGEMA by themselves with 50% by weight is shown in FIG. 14A. The measured organic content is 14.98%. The TGA result of the formulation of the current example with 50% of capped nanocrystals by weight is shown in FIG. 14B, the measured inorganic solid content is 39.76%.

The optical transmittance of the formulation of the current example with 50% of capped nanocrystals by weight is shown in FIG. 15.

The refractive index of the film produced with the formulation in this example is obtained by a Woollam M2000 ellipsometer. FIG. 16 shows the refractive index as a function of wavelength of spin coated films, the solid line is the refractive index of as-made film and the dotted line is obtained after the film is further subjected to a 200 C 60 minutes bake in an oven in air. The Abbe number for the original film is 39.65 and for the thermally treated film, 38.35.

The films produced with the formulation in this example demonstrate high optical transmittance. The solid line in FIG. 17 shows the optical transmittance of an as-made film measured by Perkin Elmer Lambda 850 spectrophotometer. The thickness of the film is about 1 micrometer.

The films produced with the formulation in this example demonstrate high thermal resistance. The dotted line in FIG. 17 shows the optical transmittance of the film after 60 minutes at 250° C. in an oven in air. The average transmittance change from 400 nm to 800 nm, compared with the as-made film, is only about 1.8%.

The films produced with the formulation in this example demonstrate chemical resistance to DI water, acetone, isopropanol, methyl pyrrolidone. After subjecting to the previously described Procedure 1 for 5 minutes, the film shows no visible discoloration, swelling, cracking, delamination, peeling off, or loss of integrity for all listed chemicals. After the previously described Procedure 1 for 5 minutes 1:1 HCl and 1:3 HCl, the film shows slight discoloration, but no visible swelling, cracking, delamination, peeling off, or loss of integrity. After the previously described Procedure 1 for 5 minutes in 5 wt % KOH solution, the film is completely removed.

The films produced with the formulation in this example demonstrate a pencil hardness up to 8H. using a BYK Gardner PH-5800 pencil harness tester following ASTM test method D3363 (ASTM D3363-05 (2011)e2, Standard Test Method for Film Hardness by Pencil Test (24 C, 50% relative humidity).

Example 6

As shown in FIG. 18, an internal light extraction structure is inserted between an OLED stack and the substrate. The internal light extraction layer comprises a light scattering layer, such as a layer of scatterer particles or surface textures. Such a light scatterer layer randomizes the incoming light direction, preventing the light emitted by the OLED being trapped by total internal reflection at the OLED/substrate interface. The scattering layer may have high surface roughness resulting in poor device performance and low yield. A high refractive index smoothing layer is applied between the scattering layer and the OLED stack to provide a smooth surface for the OLED stack, or the scatterers could be embedded in the high refractive index layer. The high refractive index layer may be produced with formulations in EXAMPLE 3, 4, or 5.

The high index smoothing layer has a refractive index higher than the substrate, typically about 1.5, and equal or lower than the refractive index of the OLED active layer, typically about 1.8. The high index smoothing layer has high surface smoothness, less 1 nm measured by AFM on a 5 μm by 5 μm square. The high index smoothing layer has high optical transmittance, higher than 90% in the visible spectrum. The high index smoothing can withstand at least 200 C in air for 60 minutes with no visible change in appearance, delamination, or cracking. Combined with the scattering layer, the internal light extraction layer improves the light extraction efficiency of the OLED lighting device compared with device with no light extraction layer.

TABLE 1

| Spin Speed (RPM) | 70 wt % Solid | | 65 wt % Solid | | 60 wt % Solid | | 55 wt % Solid | | 50 wt % Solid | |
|---|---|---|---|---|---|---|---|---|---|---|
| | Thickness (μm) | Std. Dev. | Thickness (μm) | Std. Dev. | Thickness (μm) | Std. Dev. | Thickness (μm) | Std. Dev. | Thickness (μm) | Std. Dev. |
| 1000 | 7.27 | 1.79 | 5.02 | 0.18 | 3.22 | 0.49 | 2.42 | 0.21 | 2.17 | 0.07 |
| 2000 | 5.65 | 0.60 | 2.83 | 0.80 | 2.57 | 0.17 | 1.74 | 0.28 | 1.55 | 0.14 |
| 3000 | 4.30 | 1.25 | 2.30 | 0.63 | 1.91 | 0.59 | 1.48 | 0.14 | 1.18 | 0.04 |
| 4000 | 3.45 | 1.26 | 2.71 | 0.20 | 1.84 | 0.06 | 1.32 | 0.03 | 1.08 | 0.09 |
| 5000 | 3.60 | 0.77 | 2.56 | 0.08 | 1.75 | 0.08 | 0.92 | 0.50 | 0.73 | 0.30 |
| 6000 | 3.89 | 0.50 | 2.32 | 0.05 | 1.48 | 0.32 | 1.08 | 0.07 | 0.77 | 0.15 |

We claim:

1. A formulation comprising a dispersion comprised of:
   (i) at least partially capped metal oxide nanocrystals;
   (ii) an acrylic polymer comprising bisphenol-A glycerolate dimethacrylate;
   (iii) 20% to 90% by weight of the total formulation of a solvent,
   (iv) a curing agent or an antioxidant, and
   (v) at least one of a crosslinking agent, a thickener, an adhesion promoter, a wetting agent, a leveling agent, a dispersing agent, a plasticizer, or a flexibilizer, wherein the formulation has an optical transmittance at 450 nm in 50% PGMEA by weight of the total formulation as solvent, when measured in a cuvette with 1 cm path length of 99%-95%, or 95%-90%, 90%-85%, or 85%-80%, or 80%-75%, or 75%-65%, or 65%-60%, or 60%-55%, or 55%-50%, or 50%-45%, or 45%-40%, or 40%-35%, or 35%-30%, or 30%-25%, or 25%-20%, or 20%-15%, or 15%-10%, and wherein the dispersion does not contain benzyl methacrylate (BMA) or trimethylolpropane triacrylate (TMPTA).

2. The formulation of claim 1, wherein said metal oxide nanocrystals are zirconium oxide, titanium oxide, hafnium oxide, zinc oxide or a mixture of at least two of said oxides, said at least partially capped metal oxide nanocrystals being optionally produced in the presence of water.

3. The formulation of claim 2, wherein said at least partially capped metal oxide nanocrystals are at least partially capped with at least one capping agent selected from the group consisting of 2-[2-(2-methoxyethoxy) ethoxy] acetic acid, methoxy(triethyleneoxy) propyltrimethoxysilane, 3-(methacryloyloxy)propyl trimethoxysilane, n-octyl trane, dodecyltrimethoxysilane, m,p-ethylphenethyl trimethoxysilane, n-propyltrimethoxysilane, n-propyltriethoxysilane, n-octyltr methoxysilane, n-octyltriethoxysilane, phenyltrimethoxysilane, 2-[methoxy(polyethyleneoxy) propyl]-trimethoxysilane, 3-aminopropyltrimethoxysilane, 3-mercapto propyltrimethoxysilane, 3-isocyanatopropyltriethoxysilane, 3-isocyanato propyltrimethoxysilane, and glycidoxypropyltrimethoxysilane, heptanol, hexanol, octanol, benzyl alcohol, phenol, ethanol, propanol, butanol, oleylalcohol, dodecylalcohol, octadecanol and triethylene glycol monomethyl ether, octanoic acid, acetic acid, propionic acid, acetic acid, oleic acid, and benzoic acid.

4. The formulation of claim 1 wherein the at least partially capped metal oxide nanocrystals are present in the formulation in an amount of less than 10% by weight of the acrylic and at least partially capped nanocrystals, or 10%-20% by weight of the of the acrylic and at least partially capped nanocrystals, or 20%-30% by weight of the of the acrylic and at least partially capped nanocrystals, or 30%-40% by weight of the of the acrylic and at least partially capped nanocrystals, or 40%-50% by weight of the of the acrylic and at least partially capped nanocrystals, or 50%-60% by weight of the of the acrylic and at least partially capped nanocrystals, or 60%-70% by weight of the of the acrylic and at least partially capped nanocrystals, or 70%-80% by weight of the of the acrylic and at least partially capped nanocrystals, or 80%-90% by weight of the of the acrylic and at least partially capped nanocrystals, or 90%-95% by weight of the of the acrylic and at least partially capped nanocrystals.

5. The formulation of claim 1, wherein the viscosity of the dispersion is less than 5 cPs, or 5 cPs-50 cPs, or 50 cPs-200 cPs, or 200 cPs-400 cPs, or 400 cPs-650 cPs, or 650 cPs-1000 cPs, when measured at 25° C. with a Brookfield RVDV II+ cone and plate viscometer.

6. The formulation of claim 1, wherein the acrylic polymer is selected from the group consisting of biphenyl-2-ol, ethoxylated esters with acrylic acid (OPPEOA), bisphenol A ethoxylate diacrylates, bisphenol A propoxylate diacrylate, bisphenol F ethoxylate (2 EO/phenol) diacrylate, bisphenol A glycerolate diacrylates, bisphenol A ethoxylate dimethacrylate, trimethylolpropane ethoxylate, (1 EO/OH) methyl ether diacrylate, 1,6-hexanediol diacrylate, tri(ethylenegycol) diacrylate, ethylene glycol diacrylate, poly(ethylene glycol) diacrylate, glycerol 1,3-diglycerolate diacrylate, di(ethylene glycol) diacrylate, tetra(ethylene glycol) diacrylate, poly(propylene glycol) diacrylate, tri(propylene glycol) diacrylate, 1,6-hexanediol ethoxylate diacrylate, ethylene glycol phenyl ether acrylate, and combinations thereof.

7. The formulation of claim 1, wherein the solvent is selected from the group consisting of alcohols, glycols, methyl acetates, ethyl acetates, esters, ketones, glycol ethers, glycol esters, such as propylene glycol monomethyl ether acetate (PGMEA), propylene glycol monomethyl ether (PGME), ethylene glycol monobutyl ether acetate, diethylene glycol monobutyl ether acetate, diethylene glycol butyl ether, diethylene glycol monoethyl ether acetate, dipropylene glycol methyl ether acetate, butoxy ethanol, butoxy propanol, ethoxy ethyl acetate, butoxy ethyl acetate, 2-(isopentyloxy)ethanol, 2-(hexyloxy)ethanol, diethylene glycol, diethylene glycol monomethyl ether, diethylene glycol monoethyl ether, triethylene glycol, triethylene glycol monomethyl ether, dipropylene glycol, dipropylene glycol monomethyl ether, and dipropylene glycol monoethyl ether, ethyl acetate, THF, acetone, and combinations thereof.

8. The formulation of claim 1, wherein the solvent is present in an amount of 20%-30% by weight of the total formulation, or 30%-40% by weight of the total formulation, or 40%-50% by weight of the total formulation, or 50%-60% by weight of the total formulation, or 60%-70% by weight of the total formulation, or 70%-80% by weight of the total formulation, or 80%-90% by weight of the total formulation.

9. The formulation of claim 1, wherein the formulation is UV curable.

10. The formulation of claim 1, wherein the formulation is thermally curable.

11. The formulation of claim 1, wherein the curing agent is at least one selected from the group consisting of tertiary amines, polymeric benzopherone derivatives, benzophenone, mixtures of benzophenone and methylbenzophenone, diphenyl(2,4,6-trimethylbenzoyl)-phosphine oxide, 1-hydroxy cyclohexyl phenyl ketone, dicumyl peroxide, t-butyl perbenzoate, benzoyl peroxide, t-butyl peracetate, 1,1-di(t-butylperoxy)3,3,5-trimethyl cyclohexane, 2,5-dimethyl-2,5-di(t-butylperoxy)hexyne, n-butyl-4,4-bis(t-butylperoxy valerate), 2,2'-azobisisobutyronitrile (AIBN), 1,1'-azobix (cyclohexane-1-carbonitrile, 2,2'-azobix(2-methylbutyronitrile and 2,2'-azobix[2-(2-imidazolin-2-yl) propane.

12. The formulation of claim 1, wherein the curing agent is present in an amount of less than 0.5% by weight of the polymer, or 0.5%-1% by weight of the polymer, or 1%-2% by weight of the polymer, or 2%-3% by weight of the polymer, or 3%-4% by weight of the polymer, or 4%-5% by weight of the polymer, or 5%-6% by weight of the polymer, or 6%-7% by weight of the polymer, or 7%-8% by weight of the polymer, or 8%-15% by weight of the polymer.

13. The formulation of claim 1, wherein the adhesion promoter is at least one selected from the group consisting of 3-amino propyltriethoxysilane, 3-[(methacryloyloxy)propyl]trimethoxysilane, ureidopropyltrimethoxysilane, trimethoxy[3-(methylamino)propyl]silane, acrylate/methacrylate oligomer, acidic triacrylate, trifunctional acid esters and modified methacrylate.

14. The formulation of claim 1, wherein the adhesion promoter is present in an amount of less than 0.5% by weight of the polymer, or 0.5-1% by weight of the polymer, or 1-5% by weight of the polymer, or 5-10% by weight of the polymer, or 10-15% by weight of the polymer, or 15-30% by weight of the polymer.

15. The formulation of claim 1, wherein the wetting agent is at least one selected from the group consisting of polyether modified dimethylpolysiloxanes and fluorosurfactants.

16. The formulation of claim 1, wherein the wetting agent is present in an amount of less than 0.05% by weight of the total formulation, or 0.05-0.1% by weight of the total formulation, or 0.1-0.5% by weight of the total formulation, or 0.5-1% by weight of the total formulation, or 1-2% by weight of the total formulation, or 2-5% by weight of the total formulation.

17. The formulation of claim 1, wherein the anti-oxidant is at least one selected from the group consisting of pentaerythritol tetrakis(3-(3,5-di-tert-butyl-4-hydroxyphenyl) propionate, octadecyl-[3-(3,5-di-tert-butyl-4-hydroxyphenyl)propionate, triethylene glycol-bis-3-(3-tert-butyl-4-hydroxy-5-methylphenyl) propionate, tris(2,4-di-tert-butylphenyl) phosphite, tris(2,4-di-tert-butylphenyl) phosphite and polymers of dimethyl succinate and 4-hydroxy-2,2,6,6-tetramethyl-1-piperidine ethanol.

18. The formulation of claim 1, wherein the anti-oxidant is present in an amount less than 0.5% by weight of the total formulation, or 0.5%-1% by weight of the total formulation, or 1%-2% by weight of the total formulation, or 2%-3% by weight of the total formulation, or 3%-4% by weight of the total formulation, or 4%-5% by weight of the total formulation, or 5%-6% by weight of the total formulation, or 6%-7% by weight of the total formulation, or 7%-8% by weight of the total formulation.

19. A scattering formulation comprising a binder formulation and further comprising scattering particles, wherein said binder formulation comprises the formulation of claim 1.

20. The scattering formulation of claim 19, wherein the average size of said scattering particles is in the range of 50 nm-2 µm, or 50-100 nm, or 100-200 nm, or 200-300 nm, or 300-400 nm, or 400-500 nm, or 500-600 nm, or 600-700 nm, or 700-800 nm, or 800-900 nm or 900 nm to 1 µm, or 1-1.5 µm, or 1.5-2 µm.

21. The scattering formulation of claim 19, wherein said scattering particles are present in an amount of 0.1-40% by weight of the total weight of the formulation.

22. The scattering formulation of claim 19, wherein the scattering particles are selected from a polymer, titanium oxide, silicon dioxide, niobium pentoxide, zirconium oxide, zinc oxide, aluminum oxide, cerium oxide or mixtures of any two of a polymer, titanium oxide, silicon dioxide, niobium pentoxide, zirconium oxide, zinc oxide, aluminum oxide and cerium oxide.

23. A nanocomposite film comprising a cured or partially cured formulation of claim 1.

24. The nanocomposite film of claim 23, wherein said film has a refractive index of between 1.6-1.62, or 1.62-1.64, 1.64-1.66, or 1.66-1.68, or 1.68-1.70, or 1.70-1.72, or 1.72-1.74, or 1.76-1.78, or 1.78-1.80, or 1.80-1.82, or 1.82-1.84, or 1.84-1.86, or 1.86-1.88, or 1.88-1.90 when measured at 400 nm.

25. The nanocomposite film of claim 23, wherein said film has a normal transmittance of 99.99%-99%, or 99%-98%, or 98%-97%, or 97%-96%, or 96%-95%, or 95%-90%, or 90%-85%, or 85%-80%, 80%-75%, or 75%-70%, or 70%-65%, or 65%-60%, or 60%-55%, or 55%-50%, or 50%-45%, or 45%-40%, or 40%-35%, or 35%-30%, or 30%-25%, or 25%-20%, or 20%-15%, or 15%-10% for films that are 4.9-5 microns thick, when measured at a wavelength of 450 nm or 650 nm.

26. The nanocomposite film of claim 23, wherein a film of at least 1 µm has a surface roughness of 5-4 nm, or 4-3 nm, or 3-2 nm, or 2-1 nm, or 1-0.5 nm, or 0.5-0.1 nm.

27. The nanocomposite film of claim 23, wherein the amount of the at least partially capped nanocrystals in the fi m is 10%-20%, or 20%-30%, or 30%-40%, or 40%-50%, or 50%-60%, or 60%-70%, or 70%-75%, or 75%-80%, or 80%-85%, or 85%-90%, or 90%-93% by weight of the nanocomposite film.

28. A scattering film comprising a cured or partially cured scattering formulation of claim 19, wherein said cured or partially cured binder formulation forms a nanocomposite binder.

29. The scattering film of claim 28, wherein said nanocomposite binder has a refractive index of between 1.6-1.62, or 1.62-1.64, 1.64-1.66, or 1.66-1.68, or 1.68-1.70, or 1.70-1.72, or 1.72-1.74, or 1.76-1.78, or 1.78-1.80, or 1.80-1.82, or 1.82-1.84, or 1.84-1.86, or 1.86-1.88, or 1.88-1.90 when measured at 400 nm.

30. The scattering film of claim 28, wherein a film of at least 1 µm has a surface roughness of 5-4 nm, or 4-3 nm, or 3-2 nm, or 2-1 nm, or 1-0.5 nm, or 0.5-0.1 nm.

31. An OLED device comprising the nanocomposite film of claim 23.

32. An OLED device comprising the scattering film of claim 28.

* * * * *